(12) United States Patent
Sasaki et al.

(10) Patent No.: US 8,536,712 B2
(45) Date of Patent: Sep. 17, 2013

(54) MEMORY DEVICE AND METHOD OF MANUFACTURING THE SAME

(75) Inventors: Yoshitaka Sasaki, Milpitas, CA (US); Hiroyuki Ito, Milpitas, CA (US); Atsushi Iijima, Shatin (HK)

(73) Assignees: SAE Magnetics Ltd., Hong Kong (CN); Headway Technologies, Inc., Milpitas, CA (US)

( * ) Notice: Subject to any disclaimer, the term of this patent is extended or adjusted under 35 U.S.C. 154(b) by 96 days.

(21) Appl. No.: 13/014,093

(22) Filed: Jan. 26, 2011

(65) Prior Publication Data

US 2012/0187574 A1 Jul. 26, 2012

(51) Int. Cl.
*H01L 23/48* (2006.01)
*H01L 21/50* (2006.01)

(52) U.S. Cl.
USPC ............ 257/777; 257/686; 257/E21.499; 257/E23.01; 257/E25.006; 257/E25.013; 438/107; 438/109

(58) Field of Classification Search
USPC .......... 257/686, 777, E23.01, E25.006, 257/E25.013, E21.499; 438/107, 109
See application file for complete search history.

(56) References Cited

U.S. PATENT DOCUMENTS

| | | | | | |
|---|---|---|---|---|---|
| 5,517,057 | A | * | 5/1996 | Beilstein, Jr. et al. | 257/686 |
| 5,563,086 | A | * | 10/1996 | Bertin et al. | 438/15 |
| 5,648,684 | A | * | 7/1997 | Bertin et al. | 257/685 |
| 5,818,107 | A | * | 10/1998 | Pierson et al. | 257/723 |
| 5,953,588 | A |  | 9/1999 | Camien et al. |  |
| 6,611,052 | B2 | * | 8/2003 | Poo et al. | 257/686 |
| 7,127,807 | B2 |  | 10/2006 | Yamaguchi et al. |  |
| 7,557,439 | B1 |  | 7/2009 | Sasaki et al. |  |
| 7,745,259 | B2 |  | 6/2010 | Sasaki et al. |  |

OTHER PUBLICATIONS

Gann, K., "Neo-Stacking Technology," *HDI Magazine*, Dec. 1999, pp. 1-4.

\* cited by examiner

*Primary Examiner* — Peniel M Gumedzoe
(74) *Attorney, Agent, or Firm* — Oliff & Berridge, PLC

(57) ABSTRACT

A memory device has a laminated chip package and a controller plate. In the laminated chip package, a plurality of memory chips are laminated. An interposed chip is laminated between the laminated chip package and the controller plate. A plurality of opposing wiring electrodes are formed at an opposing surface of the controller plate. A plurality of outside wiring electrodes are formed on the rear side of the opposing surface. Connection electrodes connecting the opposing wiring electrodes and the outside wiring electrodes are formed on the side surface of the controller plate. The interposed chip has a plurality of interposed wiring electrodes. The plurality of interposed wiring electrodes are formed with a common arrangement pattern common with an arrangement pattern of the plurality of opposing wiring electrodes. The controller plate is laid on the interposed chip.

22 Claims, 42 Drawing Sheets

Fig.22
(A)
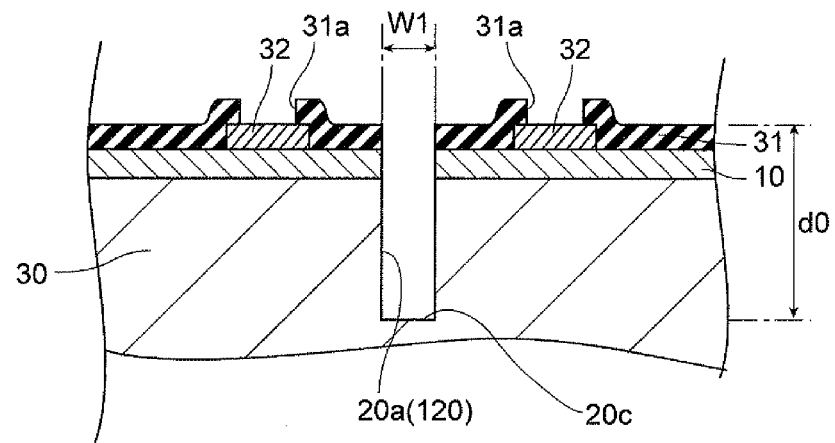
(B)
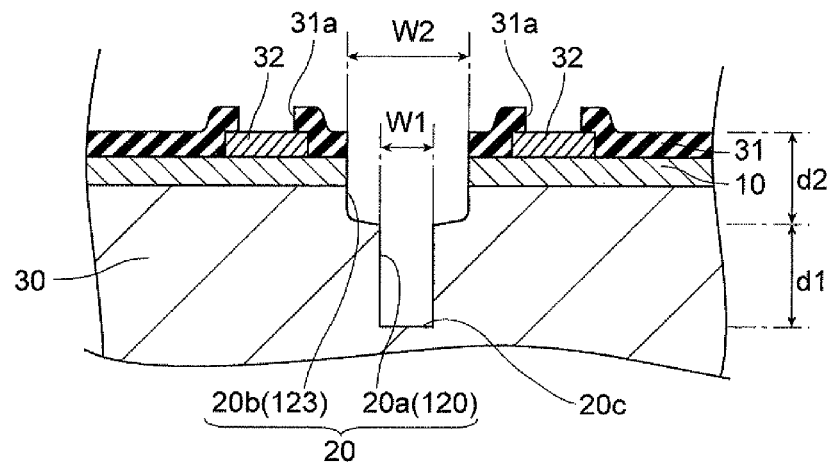

Fig.23
(A)
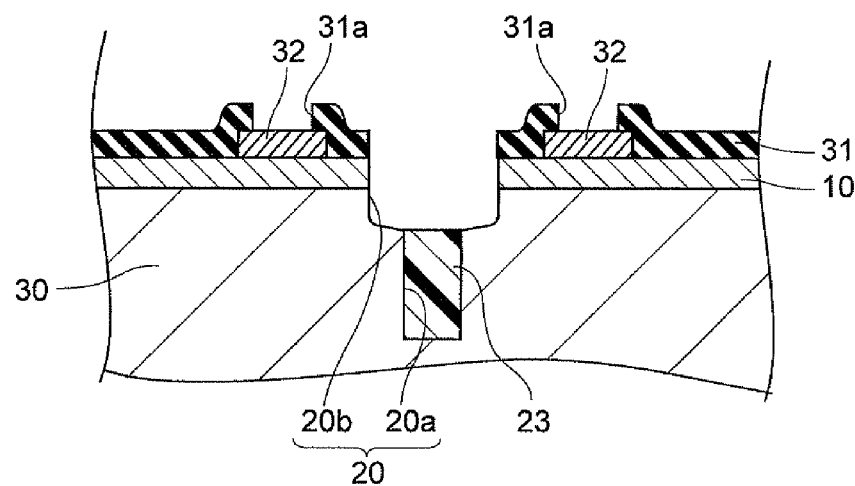
(B)
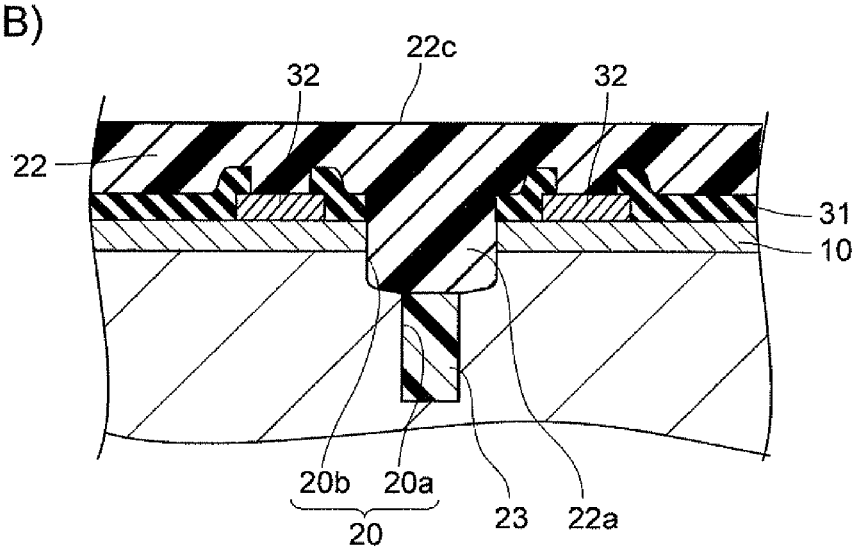

MEMORY DEVICE AND METHOD OF MANUFACTURING THE SAME

BACKGROUND

1. Field of the Invention

The present invention relates to a memory device using a laminated chip package and a method of manufacturing the same.

2. Related Background Art

In recent years, electronic devices such as cellular phones and notebook personal computers need to be reduced in weight and improved in performance. With such needs, higher integration of electronic components used for the electronic devices has been required. Further, the higher integration of electronic components has been required also for increase in capacity of a semiconductor memory device.

Recently, System in Package (hereinafter referred to as a "SIP") has attracted attention as a highly integrated electronic component. The SIP is a device created by stacking a plurality of LSIs and mounting them in one package, and a SIP using the three-dimensional mounting technique of laminating a plurality of semiconductor chips has received attention recently. Known as such a SIP is a package having a plurality of laminated semiconductor chips, that is, a laminated chip package. The laminated chip package has an advantage that speed up of operation of circuits and reduction in stray capacitance of wiring become possible because the length of the wiring can be reduced as well as an advantage of capability of high integration.

Known as the three-dimensional mounting techniques for manufacturing the laminated chip package include a wire bonding system and a through electrode system. The wire bonding system is a system of laminating a plurality of semiconductor chips on a substrate and connecting a plurality of electrodes formed on each of the semiconductor chips and external connecting terminals formed on the substrate by wire bonding. The through electrode system is a system of forming a plurality of through electrodes in each of the laminated semiconductor chips and realizing wiring between the respective semiconductor chips by the through electrodes.

The wire bonding system has a problem of a difficulty in reducing the spaces between the electrodes in a manner that the wires are not in contact with each other, a problem of a difficulty in speeding up the operation of circuits because of a high resistance value of wires, and a problem of a difficulty in reducing the thickness.

Though the above-described problems in the wire bonding system are solved in the through electrode system, the through electrode system has a problem of increased cost of the laminated chip package because many processes are required for forming the through electrodes in each of the semiconductor chips.

Conventionally known methods of manufacturing the laminated chip package are those disclosed, for example, in U.S. Pat. Nos. 5,953,588 (referred also to as patent document 1) and 7,127,807 B2 (referred also to as patent document 2), for example. In the patent document 1, the following manufacturing method is described. In this manufacturing method, first, a plurality of semiconductor chips cut out of a wafer are embedded in an embedding resin. Then, a plurality of leads to be connected to the semiconductor chips are formed to create a structure called Neo-Wafer. Subsequently, the Neo-Wafer is cut to create a plurality of structures called Neo-chips each including the semiconductor chip, the resin surrounding the semiconductor chip, and the plurality of leads. In this event, end faces of the plurality of leads connected to the semiconductor chips are exposed on side surfaces of the Neo-chips. Then, a plurality of kinds of Neo-chips are laminated to create a laminated body. In this laminated body, the end faces of the plurality of leads connected to the semiconductor chips at the respective layers are exposed on the same side surface of the laminated body.

Keith D. Gann, "Neo-Stacking Technology", HDI Magazine, December, 1999 (referred also to as non-patent document 1) describes that a laminated body is formed by the same method as the manufacturing method described in Patent document 1 and wiring is formed on two side surfaces of the laminated body.

On the other hand, Patent document 2 discloses a multi-layer module which is configured by laminating a plurality of active layers made by forming one or more electronic elements and a plurality of conductive traces on a flexible polymer substrate.

SUMMARY OF THE INVENTION

Conventionally, a memory device such as flash memory, DRAM, SRAM including a semiconductor storage element has been known as an electronic component using a laminated chip package. For example, in U.S. Pat. No. 7,557,439 B1 (referred also to as Patent Document 3), a memory device 400 that is an example of the conventional memory device is disclosed. FIG. 41 is a perspective view illustrating the conventional memory device 400. The memory device 400 has a laminated chip package 401 and a controller chip 402. The laminated chip package 401 is bonded to the upper surface of the controller chip 402, whereby the laminated chip package 401 and the controller chip 402 are integrated.

Further, not-illustrated electrode pads are formed on the uppermost surface of the laminated chip package 401, and the electrode pads are connected to not-illustrated electrode pads of the controller chip 402. In FIG. 41, the laminated chip package 401 is illustrated turned upside down.

In the laminated chip package 401, a plurality of semiconductor chips 399 are laminated. The semiconductor chip 399 has many memory cells. A control IC controlling read/write data from/to the many memory cells is formed in the controller chip 402.

On the other hand, in this kind of memory device, the storage capacity of a single memory device can be increased by using a laminated chip package 403 having an increased lamination number of semiconductor chips 399 as illustrated in FIG. 42. The laminated chip package 403 is disclosed, for example, in U.S. Pat. No. 7,745,259 B2 (referred also to as Patent Document 4).

Incidentally, in the case of the memory device 400, comparing the planar shapes of the laminated chip package 401 and the controller chip 402, the controller chip 402 is larger than the laminated chip package 401. Further, electrode pads 404 for connecting to the external part are arranged on a front surface (a surface on the side where the laminated chip package 401 is mounted) 402a of the controller chip 402 outside more than the laminated chip package 401. In other words, in the memory device 400, by making the planar shape of the controller chip 402 larger than the laminated chip package 401, a margin where the laminated chip package 401 is not mounted is provided on the surface 402a, and the arrangement space for the electrode pads 404 is ensured in the margin.

In the case of the conventional memory device, the arrangement space for the electrode pads cannot be ensured depending on the relation in size between the controller chip and the laminated chip package. In other words, in the case of the memory device 400, since the arrangement space for the electrode pads 404 is ensured in the margin of the surface 402a, it is impossible to ensure the arrangement space for the electrode pads 404 when the planar shape of the controller chip 402 is equal to or smaller than that of the laminated chip package 401. Accordingly, when merely the size of the controller chip 402 or the laminated chip package 401 is changed, the arrangement space for the electrode pads 404 cannot be ensured any longer so that the electrode pads 404 cannot be formed.

The electrode pads 404 are necessary to connect the memory device 400 to the external part. Therefore, once the arrangement space for the electrode pads 404 cannot be ensured any longer, the memory device 400 cannot be connected to the external part.

Accordingly, the conventional memory device has a problem of poor versatility in ensuring the connection with the external part.

The present invention is made to solve the above problem, and it is an object to provide a memory device having an enough versatility to ensure the connection with extent part irrespective of the size of the controller chip and the laminated chip package, and manufacturing methods of the same.

To solve the above problem, the present invention is a memory device including a laminated chip package laminated a plurality of memory chips each having a plurality of memory cells and a controller plate having a control circuit controlling read/write from/to the plurality of memory cells, the laminated chip package and the controller plate being laminated, each of the memory chips including: a device region in which the plurality of memory cells are formed; a resin insulating layer made of an insulating resin formed outside the device region; and a plurality of wiring electrodes for memory connected to the plurality of memory cells and extending from the device region to the top of the resin insulating layer; an interposed chip equal in outside dimension to the memory chip and having no semiconductor element is laminated between the laminated chip package and the controller plate, the controller plate includes a plurality of opposing wiring electrodes formed on an opposing surface opposing the interposed chip; a plurality of outside wiring electrodes formed on an outer surface arranged on the rear side of the opposing surface; and a plurality of connection electrodes for plate formed on a side surface crossing the opposing surface and the outer surface and each connecting each of the opposing wiring electrodes to each of the outside wiring electrodes, wherein the interposed chip has a plurality of interposed wiring electrodes formed in a common arrangement pattern in common with the arrangement pattern of the plurality of opposing wiring electrodes, and the controller plate is mounted on the interposed chip and each of the opposing wiring electrodes is connected to each of the interposed wiring electrodes.

In this memory device, on the controller plate, the opposing wiring electrodes, the outside wiring electrodes, and the connection electrodes for plate are connected. Further, since the interposed chip has the plurality of interposed wiring electrodes formed in the common arrangement pattern, the controller plate is mounted on the interposed chip and each of the opposing wiring electrodes is connected to each of the interposed wiring electrodes. By the outside wiring electrodes, the connection with the external part is ensured.

Further, the present invention provides a memory device including a laminated chip package laminated a plurality of memory chips each having a plurality of memory cells and a controller plate having a control circuit controlling read/write from/to the plurality of memory cells, the laminated chip package and the controller plate being laminated, each of the memory chips including: a device region in which the plurality of memory cells are formed; a resin insulating layer made of an insulating resin formed outside the device region; and a plurality of wiring electrodes for memory connected to the plurality of memory cells and extending from the device region to the top of the resin insulating layer; the controller plate includes: a plurality of opposing wiring electrodes formed on an opposing surface opposing the laminated chip package; a plurality of outside wiring electrodes formed on an outer surface arranged on the rear side of the opposing surface; and a plurality of connection electrodes for plate formed on a side surface crossing the opposing surface and the outer surface and each connecting each of the opposing wiring electrodes to each of the outside wiring electrodes, for at least an interposed memory chip laminated at a position closest to the controller plate among the plurality of memory chips, the plurality of wiring electrodes for memory are formed in a common arrangement pattern in common with the arrangement pattern of the plurality of opposing wiring electrodes, and the controller plate is mounted on the interposed memory chip and each of the opposing wiring electrodes is connected to each of the wiring electrodes for memory of the interposed memory chip.

In the case of this memory device, on the controller plate, the opposing wiring electrodes, the outside wiring electrodes, and the connection electrodes for plate are connected. Further, since the interposed memory chip has the plurality of wiring electrodes for memory formed in the common arrangement pattern, the controller plate is mounted on the interposed memory chip and each of the opposing wiring electrodes is connected to each of the wiring electrodes for memory. By the outside wiring electrodes, the connection with the external part is ensured.

Further, in the above-described memory device, it is preferable that the plurality of opposing wiring electrodes and the plurality of interposed wiring electrodes are formed such that the number and the arrangement interval of the plurality of opposing wiring electrodes are equal to the number and the arrangement interval of the plurality of interposed wiring electrodes.

In the above-described memory device, the plurality of opposing wiring electrodes and the plurality of wiring electrodes for memory of the interposed memory chip are formed such that the number and the arrangement interval of the plurality of opposing wiring electrodes are equal to the number and the arrangement interval of the plurality of wiring electrodes for memory of the interposed memory chip.

Further, it is preferable that for the interposed chip, all of the plurality of interposed wiring electrodes respectively have interposed electrodes pads arranged inside the outer periphery of the controller plate, and the controller plate has an outside dimension smaller than the outside dimension of the interposed chip, and the plurality of opposing wiring electrodes respectively have opposing electrode pads arranged at positions respectively corresponding to the interposed electrodes pads.

Further, in the case of the above-described memory device, it is preferable that for the controller plate, the plurality of outside wiring electrodes respectively have outside electrode pads arranged at positions respectively corresponding to the interposed electrode pads.

Further, in the case of the above-described memory device, it is preferable that the controller plate is configured such that the plurality of opposing wiring electrodes and the plurality of outside wiring electrodes are formed respectively on two surfaces along each other of one chip-like member having the control circuit and the two surfaces are set as the opposing surface and the outer surface respectively.

Further, in the case of the above-described memory device, it is possible that the controller plate is configured such that for each of two chip-like members each having the control circuit, only one of two surfaces along each other is provided with a plurality of wiring electrodes corresponding to the opposing wiring electrodes or the outside wiring electrodes to form an electrode forming surface, and non-electrode surfaces where the plurality of wiring electrodes are not formed are joined together, and the electrode forming surface in each of the two chip-like members is set as the opposing surface or the outer surface.

Further, in the case of the above-described memory device, it is possible that the controller plate is configured such that for each of a first chip-like member having the control circuit and a second chip-like member having no semiconductor element, on only one of two surfaces along each other is provided with a plurality of wiring electrodes corresponding to the opposing wiring electrodes or the outside wiring electrodes to form an electrode forming surface, and non-electrode surfaces where the plurality of wiring electrodes are not formed are joined together, and the electrode forming surface in each of the first chip-like member and the second chip-like member is set as the opposing surface or the outer surface.

Further, in the case of the above-described memory device, it is possible that side surfaces of the plurality of memory chips and a side surface of the interposed chip form a common wiring side surface in which the surfaces are joined together without forming a step, and the wiring electrodes for memory are connected to the interposed wiring electrodes within the common wiring side surface.

In the case of the above-described memory device, it is preferable that the interposed chip including a semiconductor region equal in size to the device region, and a resin insulating layer made of an insulating resin formed outside the semiconductor region, and the plurality of interposed wiring electrodes extend from the semiconductor region to the top of the resin insulating layer.

Further, it is preferable that the resin insulating layer has a double-layer structure in which an upper insulating layer is laid on a lower insulating layer, and the lower insulating layer is formed using a low-viscosity resin lower in viscosity than an upper resin forming the upper insulating layer.

Further, the present invention provides a method of manufacturing a memory device, the memory device including a laminated chip package laminated a plurality of memory chips each having a plurality of memory cells and a controller plate having a control circuit controlling read/write from/to the plurality of memory cells, the laminated chip package and the controller plate being laminated, the method including the following steps (1) to (3):

(1) a controller plate manufacturing step of manufacturing the controller plate by performing, for a chip-like member having the control circuit, a wiring electrodes for plate forming step of forming a plurality of wiring electrodes on each of two surfaces along each other and a connection electrodes for plate forming step of forming a plurality of connection electrodes each connecting each of the plurality of wiring electrodes on a side surface crossing the two surfaces of the chip-like member;

(2) a laminated chip package manufacturing step of manufacturing the laminated chip package such that an outermost chip arranged on the outermost side has a plurality of wiring electrodes formed in a common arrangement pattern in common with the arrangement pattern of the plurality of wiring electrodes formed on the controller plate;

(3) a wiring electrode connecting step of mounting the controller plate on the laminated chip package and connecting the plurality of wiring electrodes on the controller plate with the plurality of wiring electrodes on the outermost chip.

In case of the above-described method of manufacturing, it is preferable that the controller plate manufacturing step performs the wiring electrodes for plate forming step on two surfaces along each other of one chip-like member having the control circuit.

In case of the above-described method of manufacturing, it is preferable that the controller plate manufacturing step joins two chip-like members each having the control circuit together, and then performs the wiring electrodes for plate forming step on two surfaces along each other in the chip-like members joined in one body.

Further, in case of the above-described method of manufacturing, it is possible that the controller plate manufacturing step joins a first chip-like member having the control circuit and a second chip-like member having no semiconductor element together, and then performs the wiring electrodes for plate forming step on two surfaces along each other of the first chip-like member and second chip-like member joined in one body.

Further, the present invention provides a method of manufacturing a memory device, the memory device including a laminated chip package laminated a plurality of memory chips each having a plurality of memory cells and a controller plate having a control circuit controlling read/write from/to the plurality of memory cells, the laminated chip package and the controller plate being laminated, the method including the following steps (4) to (6):

(4) a controller plate manufacturing step of manufacturing the controller plate by performing a wiring electrodes for plate forming step of forming a plurality of wiring electrodes on only one of two surfaces along each other for a first chip-like member having the control circuit and forming a plurality of wiring electrodes on only one of two surfaces along each other for a second chip-like member having no semiconductor element, a joining step of joining non-electrode surfaces where the plurality of wiring electrodes are not formed of the first chip-like member and the second chip-like member together, and a connection electrodes for plate forming step of forming a plurality of connection electrodes each connecting each of the plurality of wiring electrodes on side surfaces of the first chip-like member and the second chip-like member joined together;

(5) a laminated chip package manufacturing step of manufacturing the laminated chip package such that an outermost chip arranged on the outermost side has a plurality of wiring electrodes formed in a common arrangement pattern in common with the arrangement pattern of the plurality of wiring electrodes formed on the controller plate (6) a wiring electrode connecting step of mounting the controller plate on the laminated chip package and connecting the plurality of wiring electrodes on the controller plate with the plurality of wiring electrodes on the outermost chip.

In case of the above-described method of manufacturing, it is preferable that the laminated chip package manufacturing step includes a laminated semiconductor substrate manufacturing step of manufacturing a laminated semiconductor substrate laminated a plurality of semiconductor substrates, and the laminated semiconductor substrate manufacturing step includes a laminating step of laminating a plurality of first substrates each having the plurality of memory cells and a plurality of first wiring electrodes connected to the plurality of memory cells, and a second substrate having a plurality of second wiring electrodes formed in a common arrangement pattern in common with the arrangement pattern of the plurality of wiring electrodes formed on the controller plate.

Further, in case of the above-described method of manufacturing, it is preferable that in the laminating step, a polishing step of polishing the rear surface side of the second substrate to reduce the thickness of the second substrate is performed before the plurality of first substrates and the second substrate are laminated, and the plurality of first substrates are laminated on the rear surface side of the second substrate after performing the polishing step.

The present invention will be more fully understood from the detailed description given hereinbelow and the accompanying drawings which are given by way of illustration only, and thus are not to be considered as limiting the present invention.

BRIEF DESCRIPTION OF THE DRAWINGS

FIG. 22 is a sectional view of the semiconductor wafer mainly illustrating a groove part, in which (A) shows a state in which a first groove part forming step has been executed, and (B) shows a state in which a second groove part forming step has been executed;

FIG. 23 is a sectional view of the semiconductor wafer subsequent to that in FIG. 22, in which (A) shows a state in which a lower insulating layer has been formed and (B) shows a state in which an upper insulating layer and a surface insulating layer have been formed;

DETAILED DESCRIPTION OF THE EMBODIMENTS

In the following, embodiments of the present invention will be described with reference to the drawings. Note that the same components will be referred to with the same numerals or letters, while omitting their overlapping descriptions.

First Embodiment

Structures of Memory Device 140

Figure 1:
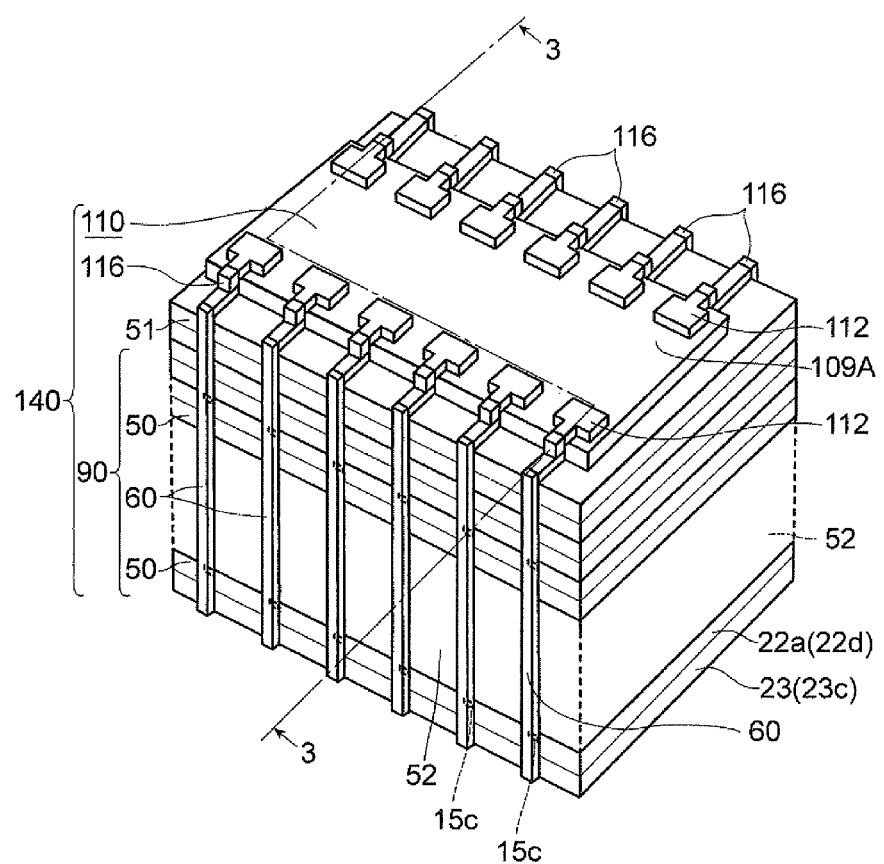
FIG. 1 is a perspective view illustrating an entire memory device according to a first embodiment of the present invention.

To begin with, the structure of a memory device 140 will be described with reference to FIG. 1 to FIG. 9. FIG. 1 is a perspective view illustrating the entire memory device 140 according to a first embodiment of the present invention. FIG.

Figure 3:
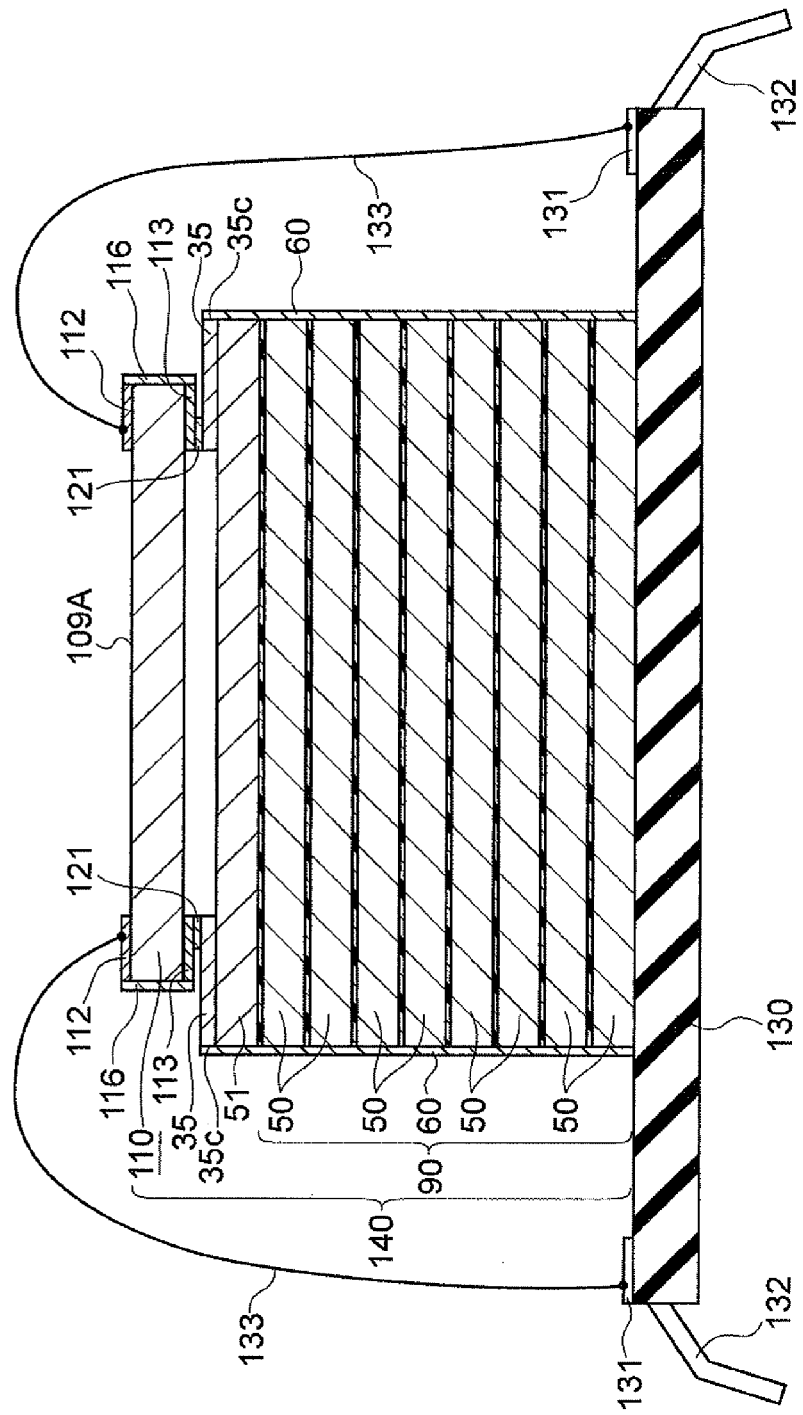
FIG. 3 is a sectional view taken along the line 3-3 in FIG. 1 and a sectional view illustrating a resin substrate.
Figure 4:
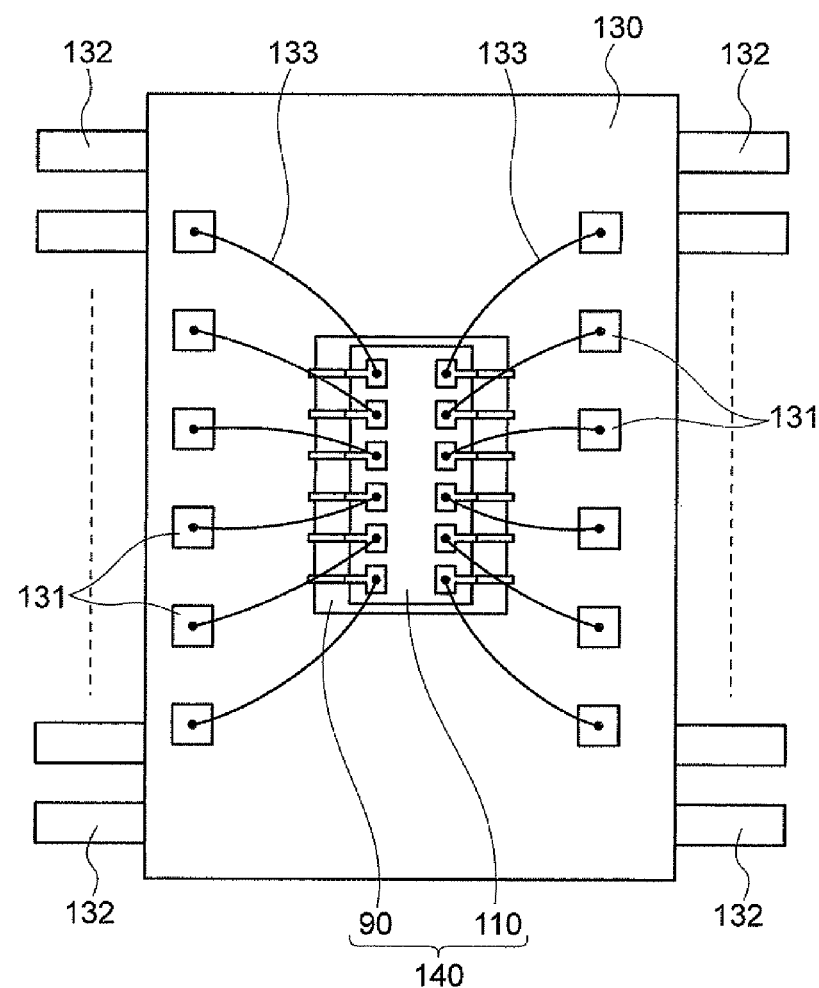
FIG. 4 is a plan view of a resin substrate and the memory device.
Figure 5:
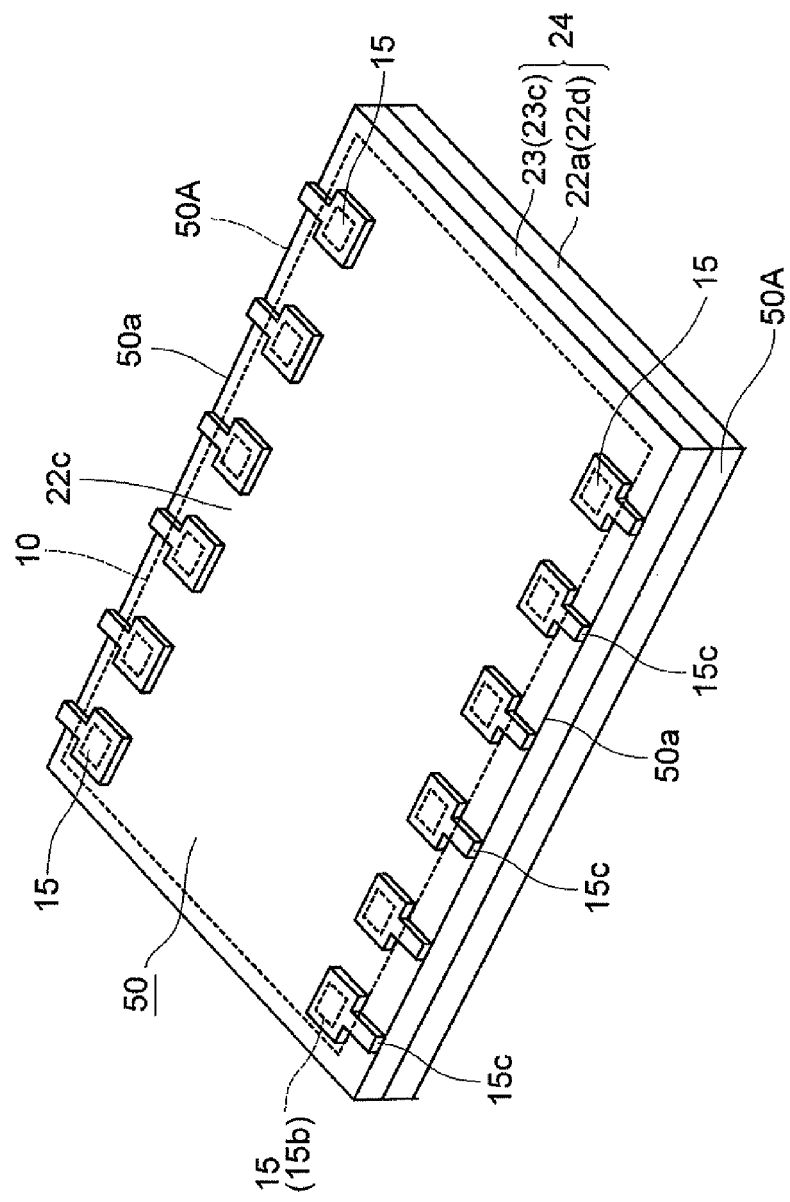
FIG. 5 is a perspective view illustrating a memory chip constituting the memory device in FIG. 1.
Figure 6:
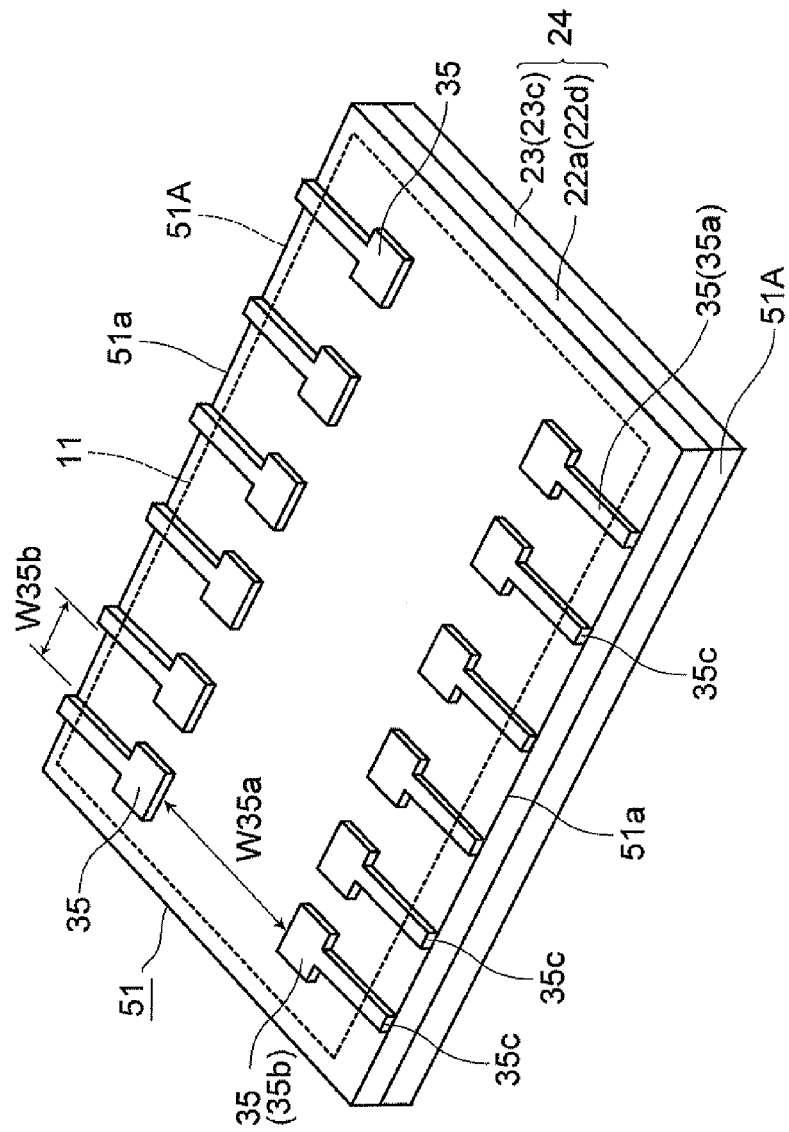
FIG. 6 is a perspective view illustrating the interposer constituting the memory device in FIG. 1.
Figure 7:
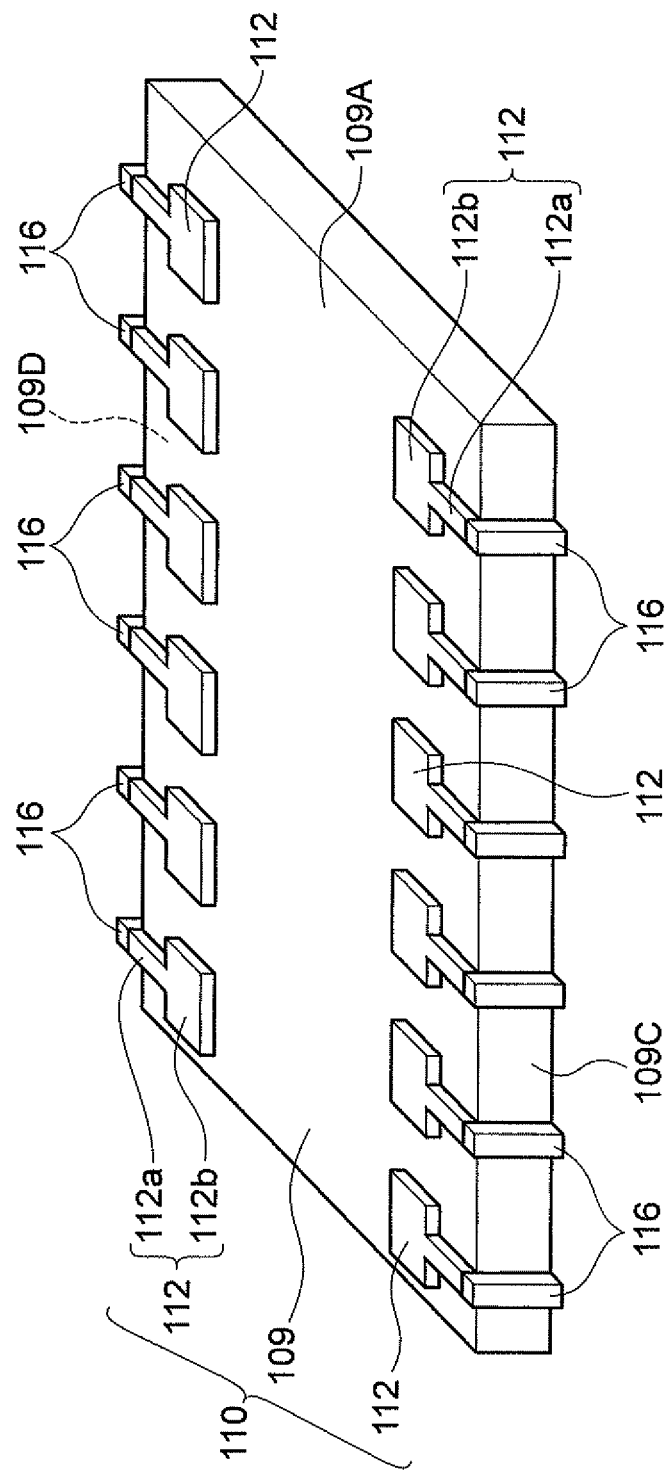
FIG. 7 is a perspective view of a controller plate, seen from front side, constituting the memory device in FIG. 1.
Figure 8:
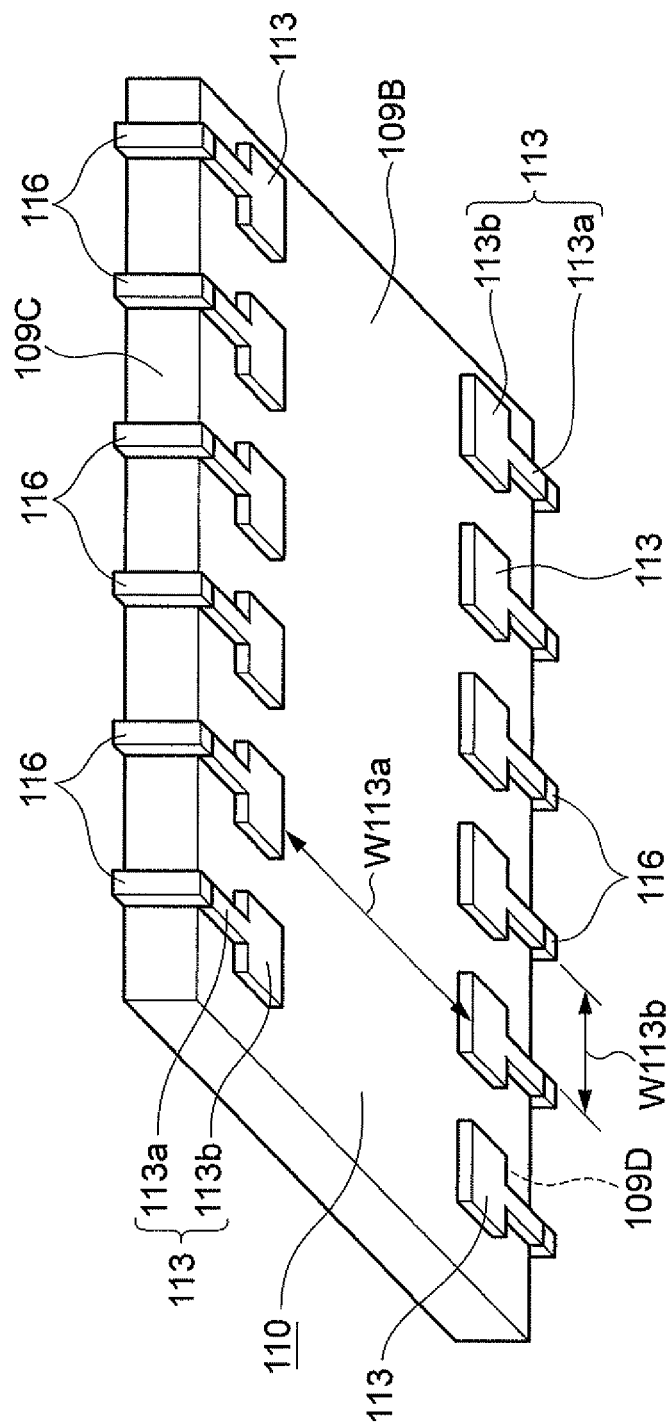
FIG. 8 is a perspective view of a controller plate, seen from rear side, constituting the memory device in FIG. 1.
Figure 9:
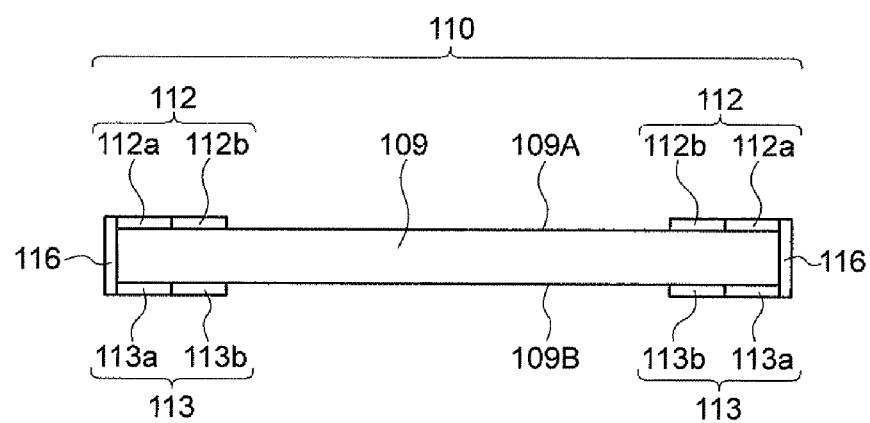
FIG. 9 is a side elevation view of a controller plate.

2 is a perspective view illustrating a laminated chip package 90 and an interposer 51 constituting the memory device 140. FIG. 3 is a sectional view taken along the line 3-3 in FIG. 1 and a sectional view illustrating a resin substrate 130. FIG. 4 is a plan view of the resin substrate 130 and the memory device 140. FIG. 5 is a perspective view illustrating a memory chip 50 constituting the memory device 140. FIG. 6 is a perspective view illustrating the interposer 51. FIG. 7 is a perspective view of a controller plate 110, seen from front side. FIG. 8 is a perspective view of a controller plate 110, seen from rear side. FIG. 9 is a side elevation view of a controller plate 110.

Figure 2:
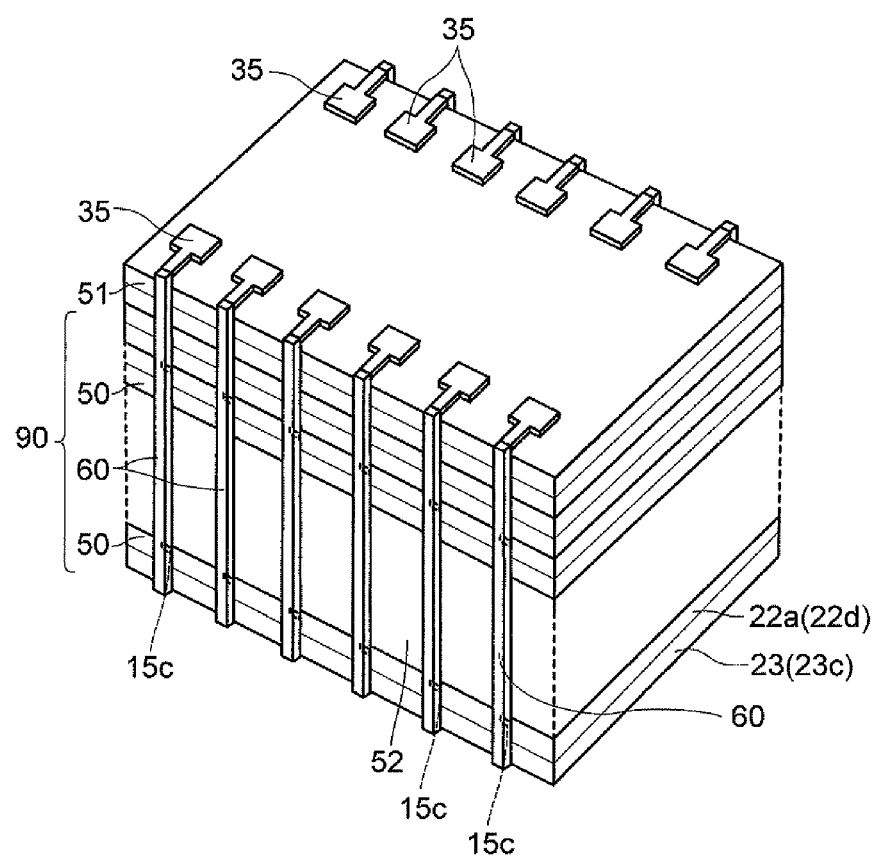
FIG. 2 is a perspective view illustrating a laminated chip package and an interposer constituting the memory device according in FIG. 1.

The memory device 140 has the laminated chip package 90, the interposer 51 and the controller plate 110. The memory device 140 is constituted by laying the interposer 51 between the laminated chip package 90 and the controller plate 110. Besides, the laminated chip package 90 is constituted by laying eight memory chips 50. As illustrated in FIG. 2, in the laminated chip package 90, the interposer 51 is laid on a controller side (uppermost surface, in FIG. 2), which is closest to the controller plate 110, of eight memory chips 50. In the memory device 140, nine semiconductor chips are laid in all except the controller plate 110.

As illustrated in FIG. 3 and FIG. 4, the memory device 140 can be mounted on the resin substrate 130. On the surface of this resin substrate 130, electrode pads 131 are formed. The memory device 140 is able to be fixed on the surface of the resin substrate 130 using an insulating adhesive, and outside wiring electrodes 112 thereof can be connected to the electrode pads 131 using bonding wires 133. The resin substrate 130 has a plurality of lead terminals 132 and is electrically connected to the external part via the lead terminals 132. As will be described later, the memory device 140 is installed in an SSD (Solid State Drive), and in this case, the memory device 140 can be installed in the SSD as a chip-like component in which the laminated chip package 90, the controller plate 110 and the resin substrate 130 are integrated.

The memory chip 50 is formed as a whole in a thin rectangular plate shape as illustrated in FIG. 5, and its four side surfaces are covered by a resin insulating layer 24 made of an insulating resin. This resin insulating layer 24 has a double-layer structure in which an upper insulating layer 22a is laminated on a lower insulating layer 23. Further, the upper insulating layer 22a has a larger depth than that of the lower insulating layer 23 at four side surfaces of the memory chip 50.

The memory chip 50 has device regions 10 formed inside the resin insulating layer 24. Many later-described memory cells 41 are formed in the device regions 10.

Further, in the memory chip 50, the flat surface on one side is the surface 22c of a surface insulating layer 22, and the plural three-dimensional wiring electrodes 15 rising above the surface 22c are formed. The wiring electrodes 15 correspond to a wiring electrode for memory according to an embodiment of the present invention. Besides, end faces 15c of the wiring electrodes 15 appear as projecting end faces at wiring side surfaces 50A, 50A. The end faces 15c are connected to later-described connection electrodes 60.

Six wiring electrodes 15 are arranged along each of two long sides 50a of the memory chip 50 at regular intervals. Twelve wiring electrodes 15 in total are formed. Each of the wiring electrodes 15 has an extended terminal part 15a and an electrode pad 15b which will be described later. In addition, to widen the device region 10 as much as possible, the length of the extended terminal part 15a (the depth from the long side 50a) is made short so that the electrode pad 15b is close to the long side 50a. The extended terminal part 15a extends from the device region 10 to the top of resin insulating layer 24.

Next, the interposer 51 will be described. The interposer 51 corresponds to an interposed chip according to an embodiment of the present invention. The interposer 51 is formed in a rectangular plate shape having the same size as the memory chip 50. The interposer 51 is the same as memory chip 50 in that four side surfaces are covered with the resin insulating layer 24 and a flat surface of one side is the surface 22c of the surface insulating layer 22. But, the interposer 51 is different in that the semiconductor regions 11 are formed in place of the device regions 10 and a plurality of wiring electrodes 35 are formed in place of a plurality of wiring electrodes 15.

The semiconductor regions 11 have the same size as the device regions 10. However, in the semiconductor regions 11, semiconductor elements such as a memory cell 41, integrated circuit are not formed. Therefore, the interposer 51 does not have semiconductor elements.

Wiring electrodes 35 correspond to interposed wiring electrodes according to the embodiment of the present invention. Six wiring electrodes 35 are arranged along each long side 51a at regular intervals as in the memory chip 50. Further, the wiring electrode 35 has an extended terminal part 35a and an electrode pad 35b which will be described later. However, the length of the extended terminal part 35a is longer than the length of the extended terminal part 15a so that the electrode pad 35b is far from the long side 51a.

Assuming that the interval between the electrode pads in a direction crossing the long side is a cross interval and the interval between the electrode pads in a direction along the long side is a long side interval, the cross interval between the electrode pads 35b is set to W35a and the long side interval is set to W35b on the interposer 51 as illustrated in FIG. 6. The cross interval W35a is different from the cross interval between the electrode pads 15b on the memory chip 50, but coincides with a cross interval W113a between later-described opposing wiring electrodes 113 on the controller plate 110. Besides, the long side interval W35b coincides with a long side interval W113b. Thus, the wiring electrodes 35 are formed in a common arrangement pattern in common with the arrangement pattern of the opposing wiring electrodes 113. Note that the arrangement pattern will be described later in detail.

Further, twelve electrode pads 35b in total are formed in the interposer 51, and all of the twelve electrode pads 35b are arranged inside of the outer periphery of the controller plate 110. The electrode pad 35b corresponds to an interposed electrode pad according to the embodiment of the present invention.

Further, in the interposer 51, the end faces 35c of the extended terminal parts 35a appear as projecting end faces in the wiring side surface 51A, 51A. The end faces 35c are connected to the connection electrodes 60.

The wiring side surfaces 51A are joined to the above-described wiring side surfaces 50A of the eight memory chips 50 without forming a step. This wiring side surfaces 51A and the wiring side surfaces 50A of the eight memory chips 50 form two common wiring side surfaces 52. The common wiring side surfaces 52 are flat surfaces.

Next, the controller plate 110 will be described. The controller plate 110 is formed in a rectangular plate shape smaller in outside dimension than the memory chip 50 as illustrated in FIG. 1, FIG. 3, and FIG. 7 to FIG. 9. In the controller plate 110, a plurality of opposing wiring electrodes 113 and a plurality of outside wiring electrodes 112 which will be described later are formed on each of the two surfaces along each other of one chip-like member. Further, the two surfaces are set as later-described opposing surface 109B and outer surface 109A respectively.

The controller plate 110 has a controller chip 109. The controller chip 109 has a not-shown control IC. The control IC is a control circuit according to the embodiment of the present invention which is an integrated circuit controlling read/write of data from/to many memory cells 41 formed in each memory chip 50. As described above, the memory device 140 is incorporated in an SSD (Solid State Drive). The control IC is disposed between a not-illustrated connection terminal of the SSD and the memory chips 50 and controls read/write of data in each of the memory chips 50.

The controller chip 109 has the opposing surface 109B on the side opposing the interposer 51, the outer surface 109A disposed on the rear side of the opposing surface 109B, and two side surfaces 109C, 109D as illustrated in FIG. 7 and FIG. 8. The opposing surface 109B and the outer surface 109A are in a front/rear relation and arranged parallel to and along each other. The side surfaces 109C, 109D cross the opposing surface 109B and the outer surface 109A and face each other. In the memory device 140, the controller plate 110 is mounted on the interposer 51 such that the outer surface 109A faces outside.

In the controller plate 110, as illustrated in FIG. 8, a plurality of opposing wiring electrodes 113 are formed on the opposing surface 109B of the controller chip 109. The opposing wiring electrodes 113 are connected to a not-illustrated control IC provided on the controller chip 109. Six opposing wiring electrodes 113 are provided at regular intervals along each of the side surfaces 109C, 109D, and therefore twelve opposing wiring electrodes 113 are formed in total. The arrangement pattern of the opposing wiring electrodes 113 is in common with the arrangement pattern of the above-described wiring electrodes 35.

Each of the opposing wiring electrodes 113 has an extended terminal extended part 113a and an electrode pad 113b. The extended terminal part 113a has an end face facing the side surface 109C, 109D and extends the end face toward the inside of the opposing surface 109B, and the tip thereof is connected with the electrode pad 113b. The electrode pad 113b is formed in a rectangular shape wider than the extended terminal part 113a. The electrode pads 113b are arranged at a cross interval W113a and a long side interval W113b. Further, each of the electrode pads 113b is arranged at a position corresponding to each of the electrodes pads 35b. Therefore, the electrode pad 113b corresponds to an opposing electrode pad according to the embodiment of the present invention.

Further, in the controller plate 110, a plurality of outside wiring electrodes 112 are formed on the outer surface 109A as illustrated in FIG. 7. Six outside wiring electrodes 112 are arranged at regular intervals along each of the side surfaces 109C, 109D, and therefore twelve outside wiring electrodes 112 are formed in total. The arrangement pattern of the outside wiring electrodes 112 is also in common with the arrangement pattern of the above-described wiring electrodes 35.

Each of the outside wiring electrodes 112 has an extended terminal part 112a and an electrode pad 112b. The extended terminal part 112a has an end face facing the side surface 109C, 109D and extends the end face toward the inside of the outer surface 109A, and the tip thereof is connected with the electrode pad 112b. The electrode pad 112b is formed in a rectangular shape wider than the extended terminal part 112a. Further, each of the electrode pads 112b is arranged at a position corresponding to each of the electrodes pads 35b. Therefore, the electrode pad 112b corresponds to an outside electrode pad according to the embodiment of the present invention.

Further, the controller plate 110 has a plurality of connection electrodes 116. Six connection electrodes 116 are arranged at regular intervals on each of the side surfaces 109C, 109D, and therefore twelve connection electrodes 116 are formed in total. The connection electrode 116 is connected to the extended terminal part 112a and the extended terminal part 113a. The connection electrode 116 connects each of the outside wiring electrodes 112 to each of the opposing wiring electrodes 113. The connection electrode 116 corresponds to a connection electrode for plate according to the embodiment of the present invention.

As described above, the twelve electrode pads 113b have an original arrangement pattern on the controller plate 110, and this arrangement pattern coincides with the arrangement pattern of the wiring electrodes 35. In other words, the cross interval W113a of the controller plate 110 coincides with the cross interval W35a, and the long side interval W113b coincides with the long side interval W35b. Since the controller plate 110 and the above-described interposer 51 are equal in the number of electrode pads and the arrangement interval, the arrangement pattern of the electrode pads 113b in the controller plate 110 coincide with the arrangement pattern of the electrode pads 35b in the interposer 51. In the memory device 140, each of electrode pads 113b faces with each of electrode pads 35b in up and down, each of electrode pads 113b is connected to each of electrode pads 35b one by one by solders 121.

Meanwhile, as illustrated in FIG. 1, FIG. 2, the memory device 140 has a plurality of connection electrodes 60. The connection electrodes 60 are formed on the common wiring side surfaces 52, 52. Each of the connection electrodes 60 is connected to a plurality of end faces arranged on a straight line along the laminated direction (the direction in which the interposer 51 and the eight memory chips 50 are laminated) of the end faces 15c of the eight memory chips 50 and the end faces 35c of the interposer 51. Therefore, the interposer 51 is connected to the eight memory chips 50 by each of the connection electrodes 60.

The memory device 140 can realize devices with various storage capacities such as 64 GB (gigabyte), 128 GB, and 256 GB by varying the memory parts in the later-described semiconductor wafer 1. Note that eight memory chips 50 are laminated in the memory device 140. However, the number of the memory chips 50 which are laminated within the memory device 140 is not limited to eight.

In the memory device 140 having the above-described constitution, the laminated chip package 90 and interposer 51 are manufactured by using the later-described semiconductor wafer 1 and a semiconductor wafer 5. A structure of the semiconductor wafer 1 and a structure of the semiconductor wafer 5 are as the following.

Structures of Semiconductor Wafer

Figure 10:
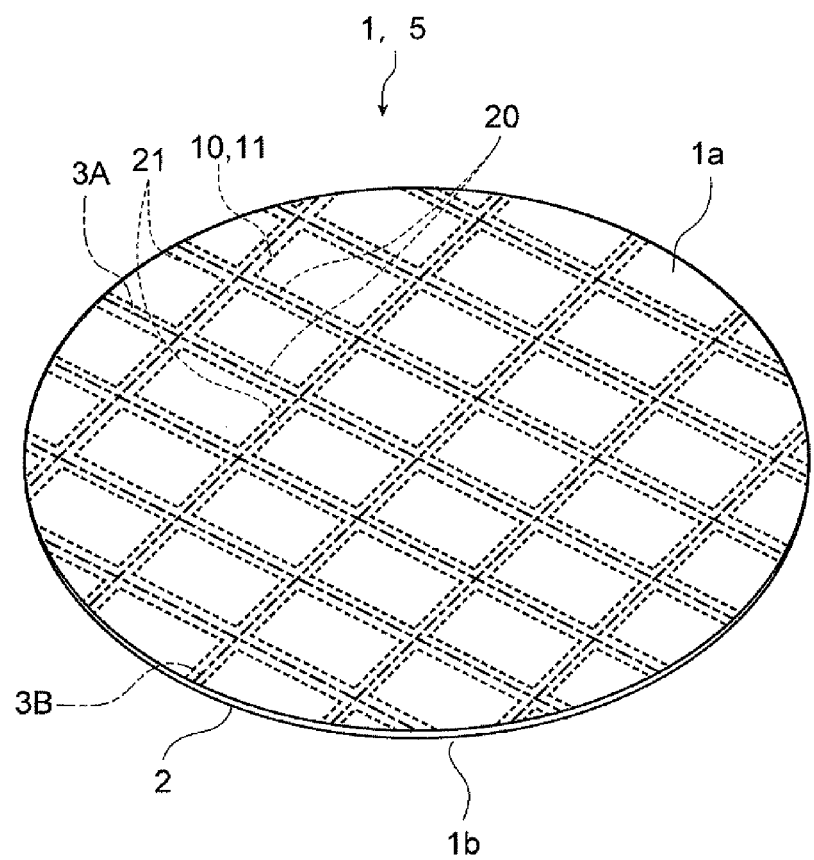
FIG. 10 is a perspective view illustrating an entire two semiconductor wafers constituting a laminated semiconductor wafer.
Figure 11:
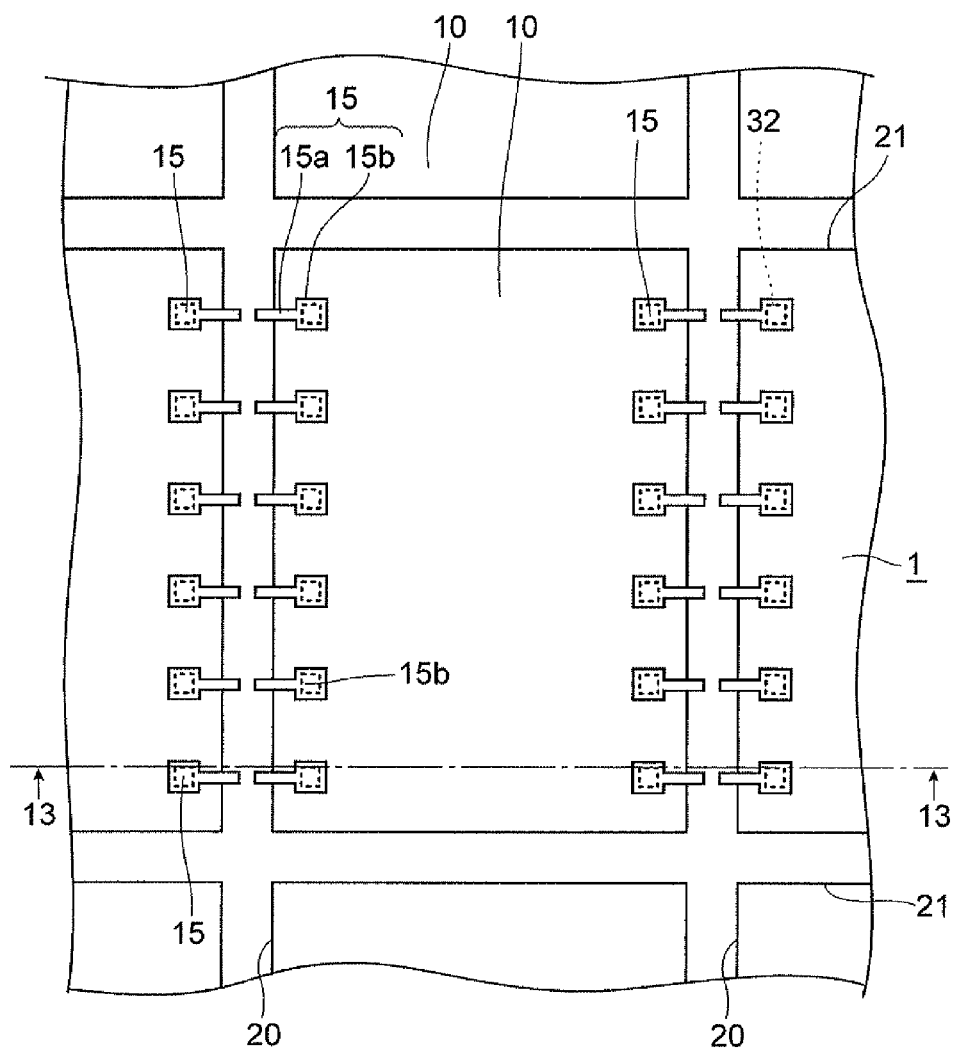
FIG. 11 is a plan view illustrating a device region and a region surrounding it formed in the one side semiconductor wafer in FIG. 10.
Figure 12:
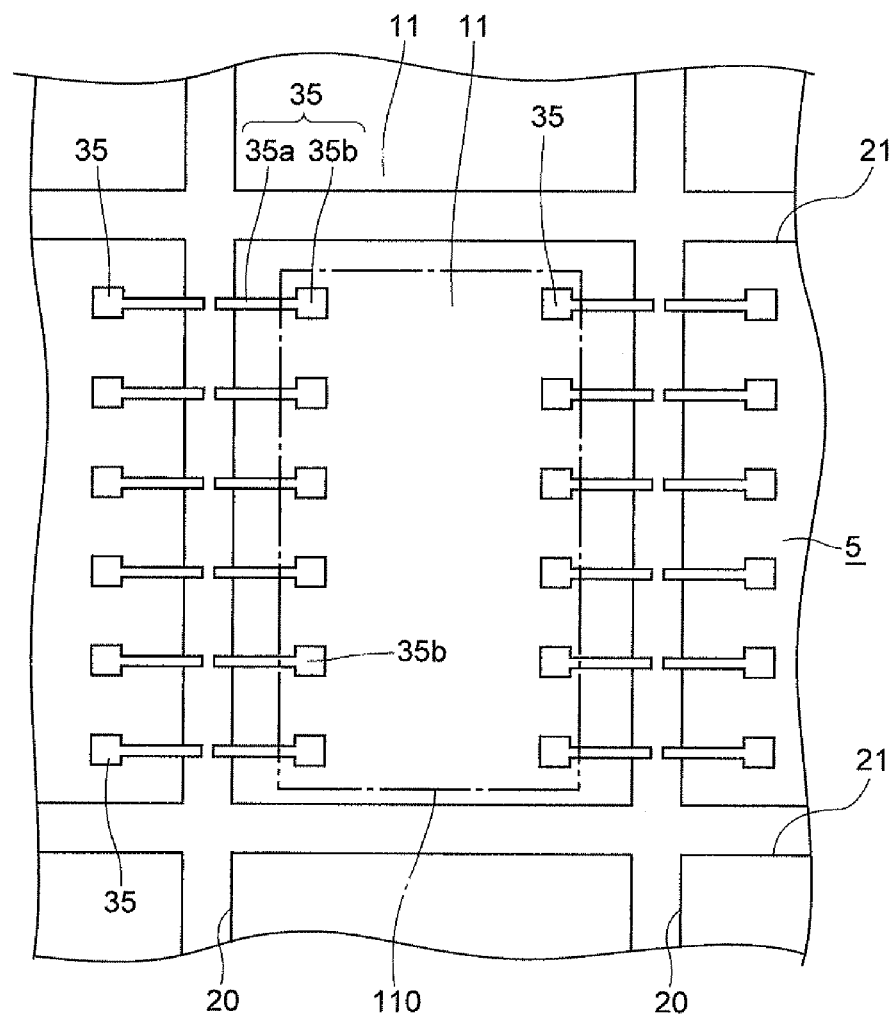
FIG. 12 is a plan view illustrating a device region and a region surrounding it formed in the other side semiconductor wafer in FIG. 10.
Figure 13:
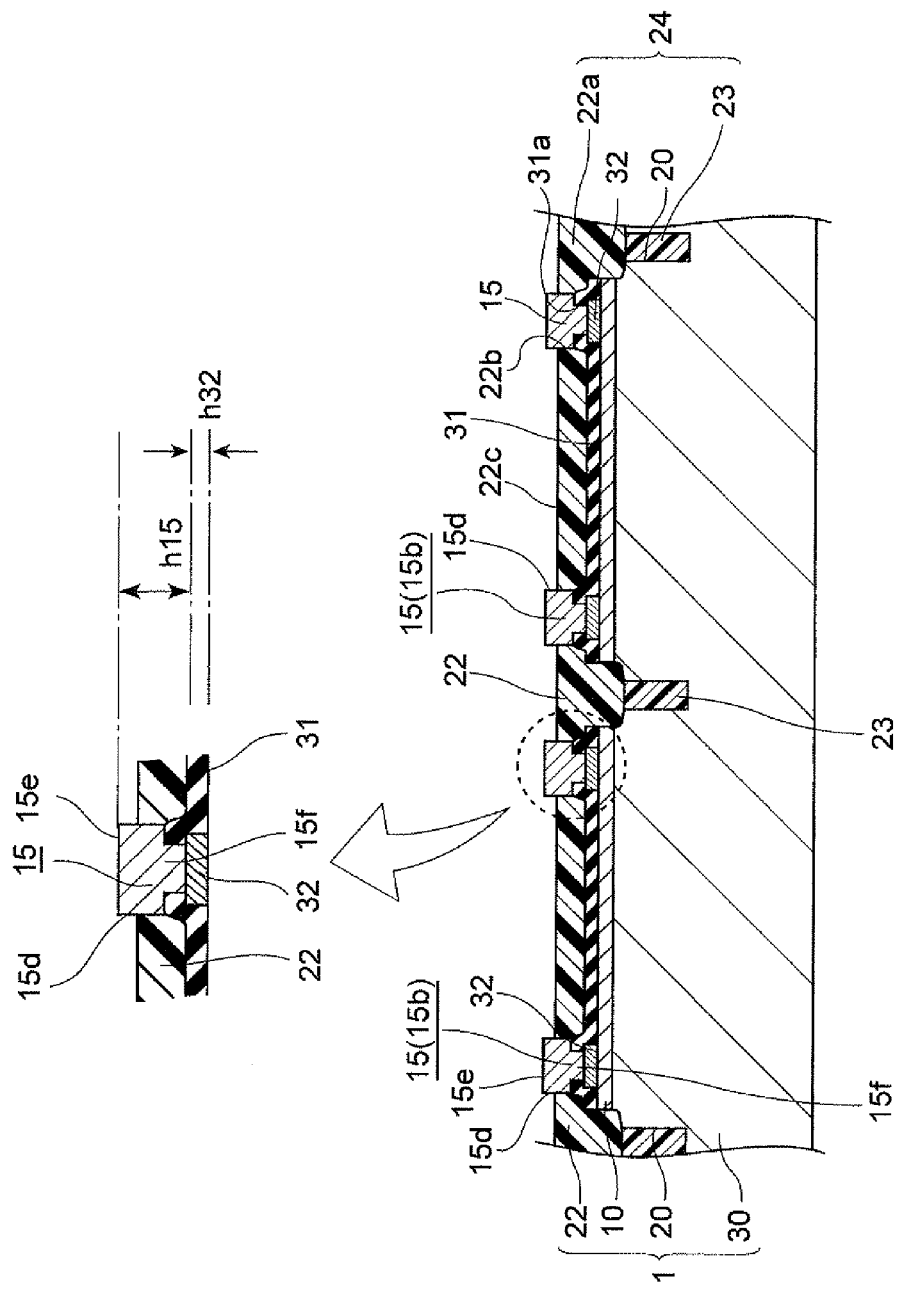
FIG. 13 is a sectional view taken along the line 13-13 in FIG. 11.
Figure 15:
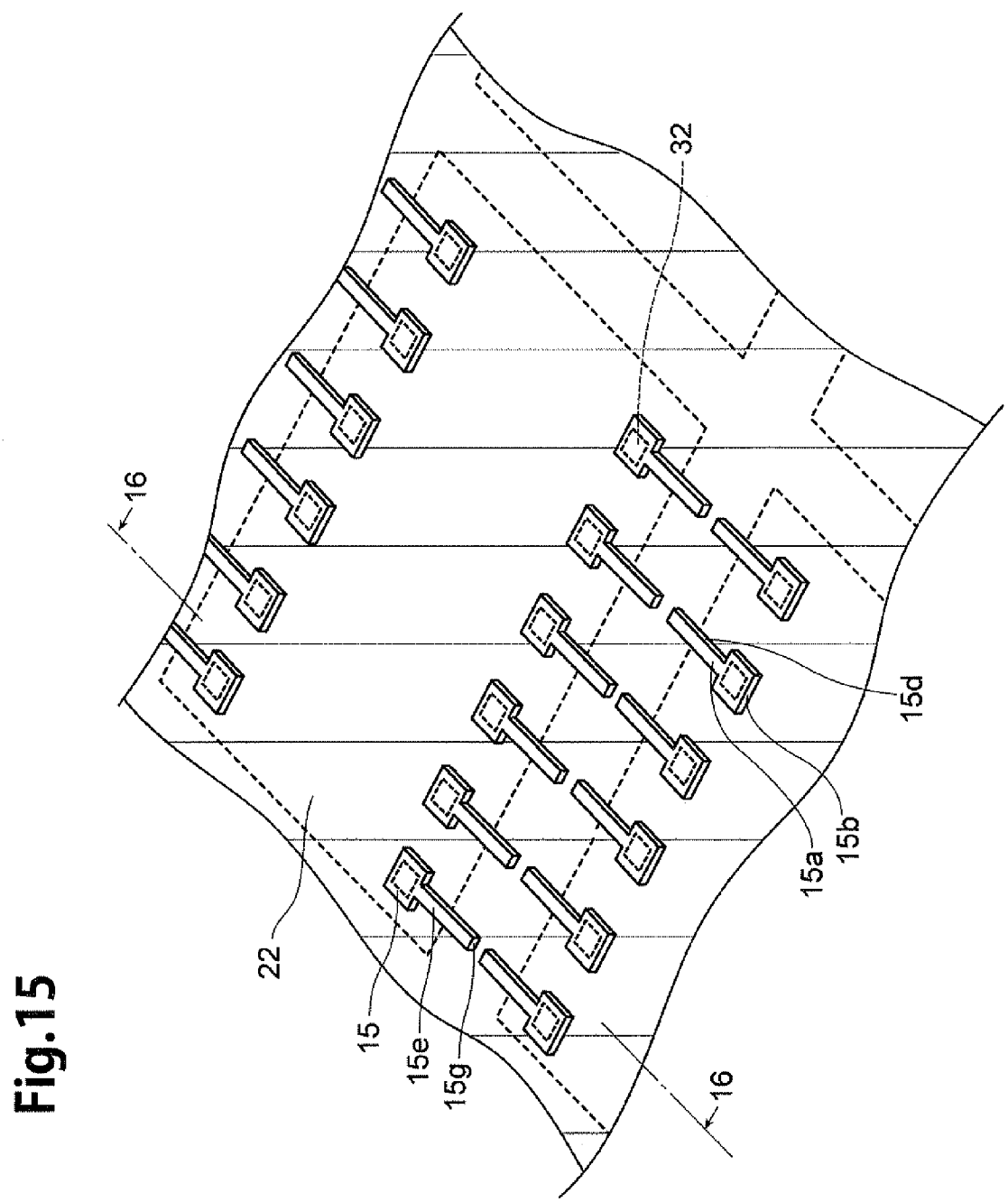
FIG. 15 is a perspective view illustrating a principal part of the semiconductor wafer in FIG. 11 with a part thereof omitted.
Figure 16:
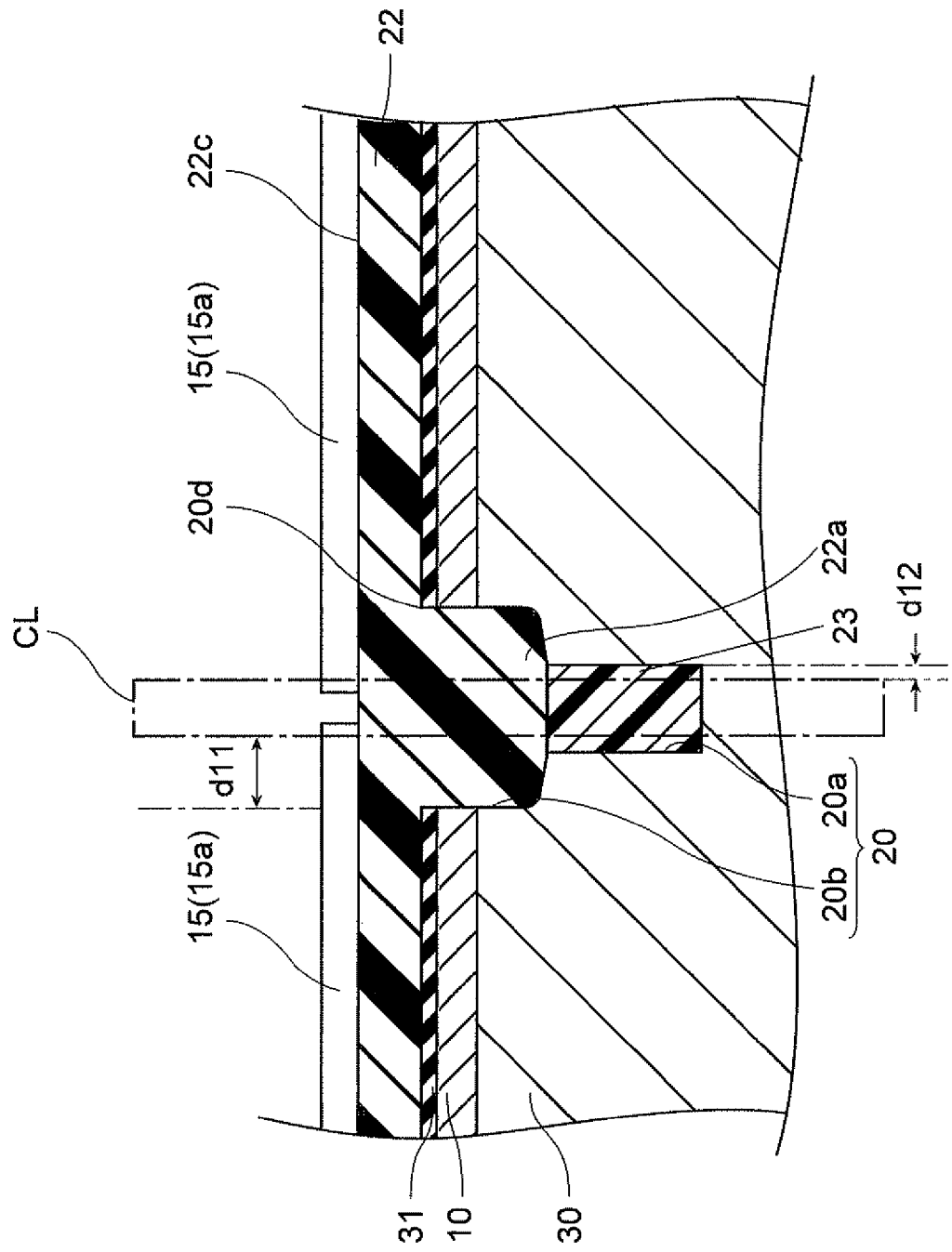
FIG. 16 is a sectional view taken along the line 16-16 in FIG. 15.

To begin with, the structure of a semiconductor wafer 1 and the structure of a semiconductor wafer 5 will be described with reference to FIG. 10 to FIG. 13, FIG. 15 to FIG. 16. Here, FIG. 10 is a perspective view illustrating the entire the semiconductor wafer 1 and the semiconductor wafer 5 according to the embodiment of the present invention. FIG. 11 is a plan view illustrating a device region 10 and a region surrounding it formed in the semiconductor wafer 1. FIG. 12 is a plan view illustrating the device region 11 and a region surrounding it formed in the semiconductor wafer 5. FIG. 13 is a sectional view taken along the line 13-13 in FIG. 11. FIG. 15 is a perspective view illustrating a principal part of the semiconductor wafer 1 with a part thereof omitted. FIG. 16 is a sectional view taken along the line 16-16 in FIG. 15. Note that in FIG. 10, device regions 10, semiconductor regions 11, groove parts 20, 21 and so on are enlarged for convenience of illustration.

The semiconductor wafer 1, the semiconductor wafer 5 are composed using a silicon wafer 2. The semiconductor wafer 1 has, as illustrated in FIG. 10, scribe lines 3A and 3B formed on a device surface 1a of the silicon wafer 2 (the rear surface side of the device surface 1a is a rear surface 1b). A plurality of each of the scribe lines 3A and 3B are formed on the device surface 1a and formed on straight lines at predetermined intervals along certain directions, respectively. The scribe lines 3A are orthogonal to the scribe lines 3B. The semiconductor wafer has also scribe lines 3A and 3B the same as the silicon wafer 1.

The above-described memory chips 50 are formed by the semiconductor wafer 1, the above-described interposer 51 is formed by the semiconductor wafer 5.

The semiconductor wafer 1 further has groove parts 20 and 21 formed in the device surface 1a. The groove parts 20, 21 are formed along the scribe lines 3A and 3B. Since the groove parts 20, 21 are formed along the scribe lines 3A and 3B, the groove parts 20, 21 have a constitution as a scribe-groove part of the present invention. The groove parts 20, 21 of the semiconductor wafer 1 have a first scribe-groove part according to the embodiment of the present invention. Besides, the groove parts 20, 21 of the semiconductor wafer 5 have a second scribe-groove part according to the embodiment of the present invention. Note that a surface of the semiconductor wafer 5 corresponding to the device surface 1a is also referred to as a groove forming surface.

In the semiconductor wafer 1, the device region 10 is formed within a rectangular region surrounded by the adjacent groove parts 20, 20 and groove parts 21, 21. The semiconductor wafer 5 is different in that the semiconductor regions 11 are formed in place of the device regions 10, as compared with the semiconductor wafer 1.

The groove part 20 has a groove lower part 20a and a wide width part 20b and is formed in a direction almost orthogonal to the device surface 1a as illustrated in FIG. 16 in detail.

The groove lower part 20a is a part including a bottom part 20c of the groove part 20 and having a certain height from the bottom part 20c (see FIG. 22, FIG. 23 about the bottom part 20c). The groove lower part 20a is a lower part of the groove part 20 which a resin relatively hardly enters, and has a width w1 (about 60 μm to about 80 μm) and a depth d1 (about 10 μm to about 40 μm) as illustrated in FIG. 22(A), (B). Inside of the groove lower part 20a, a lower insulating layer 23 is formed as illustrated in FIG. 13, FIG. 16 and so on.

The wide width part 20b is a part arranged on the upper side of the groove lower part 20a in the groove part 20, which is a part including an inlet port 20d of the groove part 20 and having a certain depth from the inlet port 20d. The wide width part 20b is formed wider than the groove lower part 20a and is formed over the entire length direction of the inlet port 20d of the groove part 20. In other words, as illustrate in FIG. 22(A), (B), a width w2 of the wide width part 20b is larger than the width w1 of the groove lower part 20a (w2>w1). The width w2 of the wide width part 20b is about 80 μm to about 120 μm, and a depth d2 of the wide width part 20b is about 10 μm to about 40 μm. Further, an upper insulating layer 22a is formed inside the wide width part 20b.

The groove part 21 has a groove lower part 21a and a wide width part 21b and is formed in a direction almost orthogonal to the device surface 1a. The groove lower part 21a is a part having a certain height from a bottom part similarly to the groove lower part 20a, and has the same width and depth as those of the groove lower part 20a. Inside the groove lower part 21a, the lower insulating layer 23 is formed as in the groove lower part 20a. The wide width part 21b is a part arranged on the upper side of the groove lower part 21a. The wide width part 21b is formed wider than the groove lower part 21a and has the width and the depth similar to those of the wide width part 20b. The upper insulating layer 22a is formed inside the wide width part 21b as in the wide width part 20b.

As described above, the groove parts 20 and 21 have a wide-port structure in which the wide width part 20b and the wide width part 21b wider than the groove lower parts 20a and 21a are formed at the respective inlet ports. In addition, a resin insulating layer 24 having a double-layer structure in which the upper insulating layer 22a is laminated on the lower insulating layer 23 is formed inside the groove parts 20 and 21.

The semiconductor wafer 1 has a surface insulating layer 22 as illustrated in detail in FIG. 13. The semiconductor wafer 5 has the surface insulating layer 22 as the same with the semiconductor wafer 1.

The surface insluting layer 22 is formed to cover the device region 10, the semiconductor region 11 and thus the surface insluting layer 22 covers almost the whole device surface 1a of the semiconductor wafer 1, the whole groove forming surface of the semiconductor wafer 5 to constitute a surface layer of the semiconductor wafer 1, the semiconductor wafer 5. The surface insulating layer 22 has a larger thickness than that of a later-described protecting insulating layer 31 and has a surface 22c formed flat. The surface insulating layer 22 is disposed at the outermost position of the semiconductor wafer 1, the semiconductor wafer 5 except for parts where wiring electrodes 15, wiring electrodes 35 are formed.

Further, the surface insulating layer 22 is structured integrally with an upper insulating layer 22a formed inside the groove parts 20 and 21, and is thus formed in one body without joints between the upper insulating layer 22a and other parts. The surface insulating layer 22 is formed with a plurality of contact holes 22b, and one wiring electrode 15 or one wiring electrode 35 is formed in each of the contact holes 22b.

The surface insulating layer 22 can be formed using a resin such as an epoxy resin or a polyimide resin, or an insulating material made of silicon silicate glass (SOG) or the like. In this embodiment, a case using a resin for the surface insulating layer 22 is discussed. It is especially preferable to form the surface insulating layer 22 using a resin having a low thermal expansion coefficient. This ensures that when the semiconductor wafer 1, the semiconductor wafer 5 are cut along the groove parts 20 and 21 by a dicing saw, the cutting can be easily performed.

The lower insulating layer 23 is formed also using a resin similarly to the surface insulating layer 22. The lower insulating layer 23, however, is formed using a low-viscosity resin having a lower viscosity than that of the resin forming the surface insulating layer 22.

The semiconductor wafer 1, the semiconductor wafer 5 have a silicon substrate 30 composed of the silicon wafer 2, and upper parts thereof are the device regions 10, the semiconductor region 11. A plurality of connecting pads 32 are formed on the surface of the device region 10, and a part other than the connecting pads 32 is covered with the protecting insulating layer 31. The semiconductor region 11 is covered with the protecting insulating layer 31. Connecting pads 32 are not formed in the semiconductor region 11.

The protecting insulating layer 31 is disposed under the surface insulating layer 22 and formed to cover the device region 10, the semiconductor region 11. The protecting insulating layer 31 is made of silicon dioxide ($SiO_2$) or the like, and has connecting holes 31a formed at positions where the connecting pads 32 are to be formed. The connecting holes 31a are formed to expose the connecting pads 32 so as to connect the later-described wiring electrodes 15 to the connecting pads 32. The connecting pads 32 are connected to a memory cell 41 in the device region 10 (see FIG. 14 for details).

The device region 10, the semiconductor region 11 are a rectangular region surrounded by the adjacent groove parts 20, 20 and the groove parts 21, 21 as illustrated in detail in FIG. 11, FIG. 12. A plurality of the device regions 10, the semiconductor regions 11 are formed on the device surface 1a, groove forming surface and each of them is a unit region divided from adjacent regions by the groove parts 20 and 21.

Each of the device regions 10 has the memory part formed on the device surface 1a by performing wafer process, and a plurality of wiring electrodes 15 are formed. Since a plurality of the memory cells 41 are formed in the memory part, the semiconductor wafer 1 has a constitution as a memory substrate. Note that the wafer process means a manufacturing process of forming a semiconductor element and an integrated circuit on the wafer such as the silicon wafer 2 or the like.

A semiconductor element such as a memory cell or the like is not formed on the groove forming surface side of the semiconductor regions 11. The semiconductor wafer 5 is a semiconductor substrate for forming the interposer 51. The semiconductor wafer 5 has a constitution as an interposed substrate. A plurality of the wiring electrodes 35 are formed in the semiconductor regions 11.

Next, the wiring electrode 15, the wiring electrode 35 will be described. The wiring electrode 15 is made of a conductive material such as Cu or the like. The wiring electrode 15 has an extended terminal part 15a and a rectangular electrode pad 15b having wider width than the extended terminal part 15a, and the extended terminal part 15a and the rectangular electrode pad 15b have, as a whole, a protruding structure rising above the surface 22c of the surface insulating layer 22 into a three-dimensional shape. A width of the electrode pad 15b along the surface 22c is formed wider than a width of the extended terminal part 15a along the surface 22c.

The wiring electrode 15 is illustrated in detail in FIG. 15 and so on in addition to FIG. 13. An end face 15g of the extended terminal part 15a of the wiring electrode 15 is a projecting end face projecting outward from the surface 22c of the surface insulating layer 22. Further, the wiring electrode 15 has a cross side surface 15d, a top end face 15e, and an embedded part 15f.

The cross side surface 15d is a side surface part projecting outward from the surface 22c of the surface insulating layer 22 and crossing with the surface 22c to rise up from (almost intersecting to) the surface 22c. The top end face 15e is connected to the cross side surface 15d and projects outward from the surface 22c, and further has a rectangular part disposed in a direction along the surface 22c and a band-shaped part extending from the rectangular part in a direction along the surface 22c toward the groove part 20. The embedded part 15f is a part embedded inward from the surface 22c to connect to the connecting pad 32.

The electrode pad 15b is composed of the cross side surface 15d, the top end face 15e, and the embedded part 15f, and the extended terminal part 15a is composed of the cross side surface 15d and the top end face 15e.

The electrode pad 15b is connected to the connecting pad 32 via the contact hole 22b and the connecting hole 31a which are arranged to be stacked one on the other, and has a depth reaching the connecting pad 32. More specifically, the electrode pad 15b has a height (an expanded height) h15 expanded from the top end face 15e outer than the surface 22c to the connecting pad 32 via the contact hole 22b and the connecting hole 31a. The expanded height h15 is larger than a height h32 of the connecting pad 32 (h15>h32). For example, h15 is about 2 to 6 µm, and h32 is about 0.5 to 1 µm.

The wiring electrodes 15 are formed along adjacent groove parts 20, 20 of the device region 10. The six wiring electrodes 15 are positioned at identical interval along groove parts 20, 20. Besides, in the adjacent device region 10, the wiring electrodes 15 are arranged so as to face each other.

Further, in the wiring electrodes 15, one parts of the extended terminal parts 15a extend from the device region 10 into the groove part 20. More specifically, the extended terminal parts 15a are formed such that their respective parts on their tip sides apart from the electrode pads 15b bulge out from an edge part (the above-described inlet port 20d) of the groove part 20 and stay inside the groove part 20 in the width direction. Further, the extended terminal parts 15a are formed such that their respective parts extending out from the device region 10 are in a protruding shape rising above the surface 22c of the surface insulating layer 22.

Further, as illustrated in FIG. 15, FIG. 16, the extended terminal parts 15a bulge out from both sides in the width direction of the groove part 20 such that the end faces 15g are opposed to each other with slight separation therebetween near the middle in the width direction of the groove part 20.

Meanwhile, the wiring electrode 35 is also made of a conductive material such as Cu or the like. As illustrated in FIG. 12, the wiring electrode 35 has an extended terminal part 35a and a rectangular electrode pad 35b, and the extended terminal part 35a and the electrode pad 35b have, as a whole, a protruding structure like the wiring electrode 15. An end face of the extended terminal part 35a of the wiring electrode 35 is a projecting end face projecting outward from the surface 22c.

However, since a length of the extended terminal part 35a is longer than a length of the extended terminal part 15a, the electrode pad 35b are arranged inside the semiconductor region 11 away from the groove part 20. The electrode pads 35b are arranged at a position which is near a center of the semiconductor region 11. In the semiconductor wafer 5, the electrode pads 35b are arranged at a position which is near a center of the semiconductor region 11, the twelve electrode pads 35b are formed with a common arrangement pattern common with an electrode pads 113b of the controller plate 110.

The semiconductor wafer 1, the semiconductor wafer 5 have the extended terminal parts 15a and the extended terminal parts 35a. Therefore, in the cut surfaces when the semiconductor wafer 1, the semiconductor wafer 5 are cut along the groove parts 20, the end faces 15c and 35c appear projecting outward from the surface 22c.

In addition, the number of the wiring electrodes 15 formed on the semiconductor wafer 1 is equal to the number of the wiring electrodes 35 formed on the semiconductor wafer 5. For example, as illustrated in FIG. 11 and FIG. 12, twelve wiring electrodes 15 are formed in each device region 10, whereas twelve wiring electrodes 35 are formed in each semiconductor region 11. Further, the planer shapes (the shapes drawn on a plane) of the wiring electrodes 15 formed in the device region 10 are the same, and the planer shapes (the shapes drawn on a plane) of the wiring electrodes 35 formed in the device region 11 are the same. Furthermore, the long side interval between the electrode pads 15b coincides with the long side interval between the electrode pads 35b.

However, the lengths of the extended terminal part 15a and the extended terminal part 35a are different, and the cross interval between the electrode pads 15b and the cross interval between the electrode pads 35b are different. Accordingly, the arrangement pattern of the electrode pads 15b on the semiconductor wafer 1 is different from the arrangement pattern of the electrode pads 35b on the semiconductor wafer 5. The arrangement pattern here is a pattern decided depending on the number and the arrangement interval of the electrode pads constituting the wiring electrodes and means the arrangement form of the electrode pads indicating how the electrode pads are arranged in the device region 10 or the semiconductor region 11.

Figure 14:
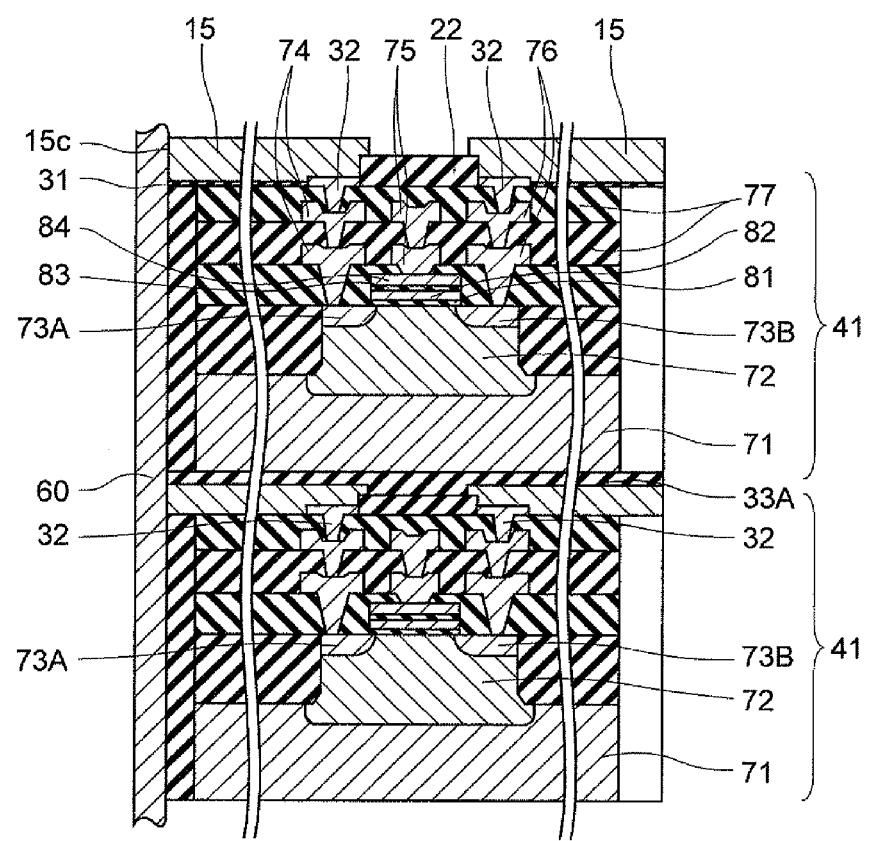
FIG. 14 is a sectional view mainly illustrating memory cells formed in two semiconductor wafers.

Meanwhile, in the memory part of the device region 10, a number of memory cells 41 as the semiconductor devices are formed. The memory cell 41 has a structure as illustrated in FIG. 14. FIG. 14 is a sectional view mainly illustrating memory cells 41 of two semiconductor wafers 1.

To the memory cell 41, the wiring electrodes 15 are connected via the connecting pads 32. The memory cell 41 is formed on the surface of an N-type substrate 71 constituting the semiconductor wafer 1. In FIG. 14, two memory cells 41 are laminated one on the other via an adhesive layer 33A. The adhesive layer 33A is formed by an adhesive used when the semiconductor wafers 1 are bonded together.

Each of the memory cells 41 constitutes a flash memory and is formed on a P-type well 72 which is formed on the surface of the N-type substrate 71. The memory cell 41 has a source 73A and a drain 73B, insulating layers 77, an insulating film 81, a floating gate 82, an insulating film 83 and a control gate 84. The memory cell 41 further has a source electrode 74, a drain electrode 76 and a gate electrode 75.

Both of the source 73A and the drain 73B are N-type regions and connected with the source electrode 74 and the drain electrode 76, respectively. The insulating layers 77 are formed with contact holes for connecting the connecting pads 32 to the source electrode 74 and the drain electrode 76, respectively. The source electrode 74, the gate electrode 75, and the drain electrode 76 are connected to the source 73A, the control gate 84 and the drain 73B via the corresponding contact holes, respectively.

Method of Manufacturing Semiconductor Wafer

Figure 17:
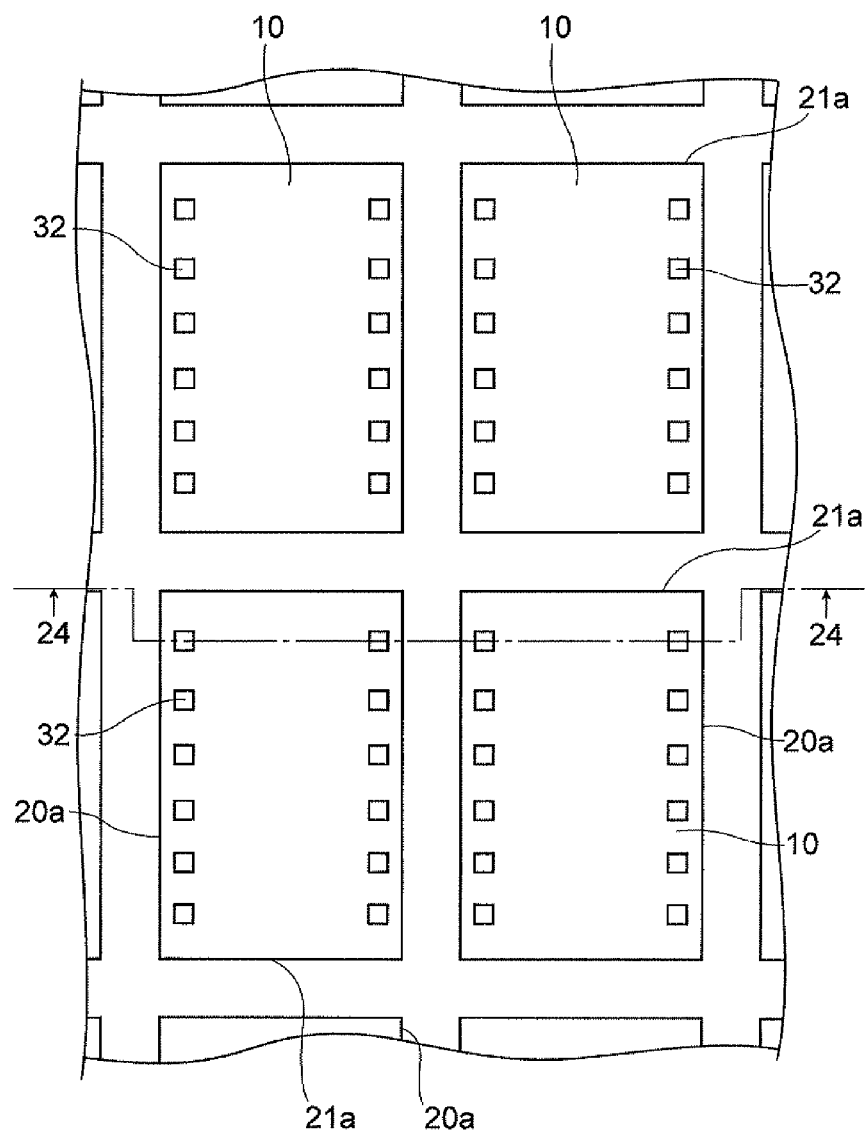
FIG. 17 is a plan view illustrating the partially manufactured semiconductor.
Figure 18:
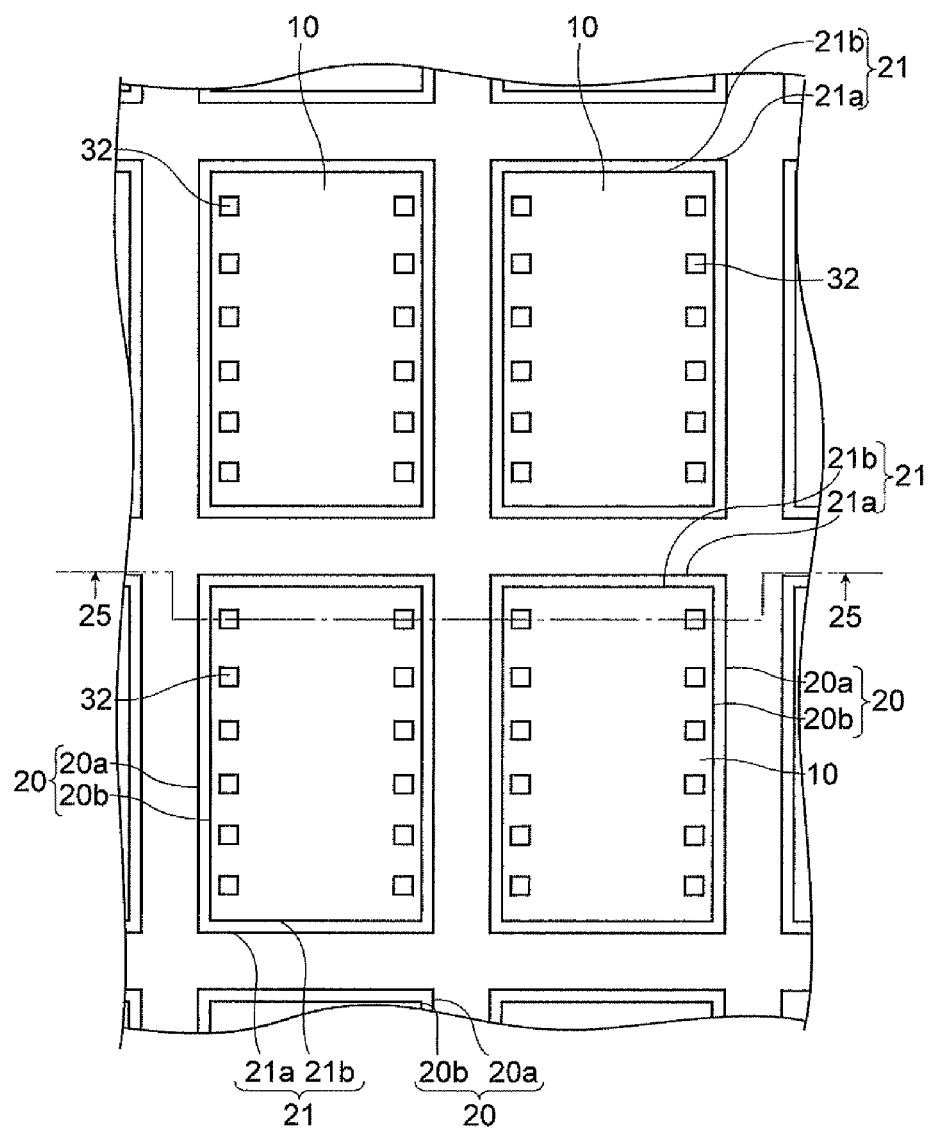
FIG. 18 is a plan view illustrating the semiconductor wafer subsequent to that in FIG. 17.
Figure 19:
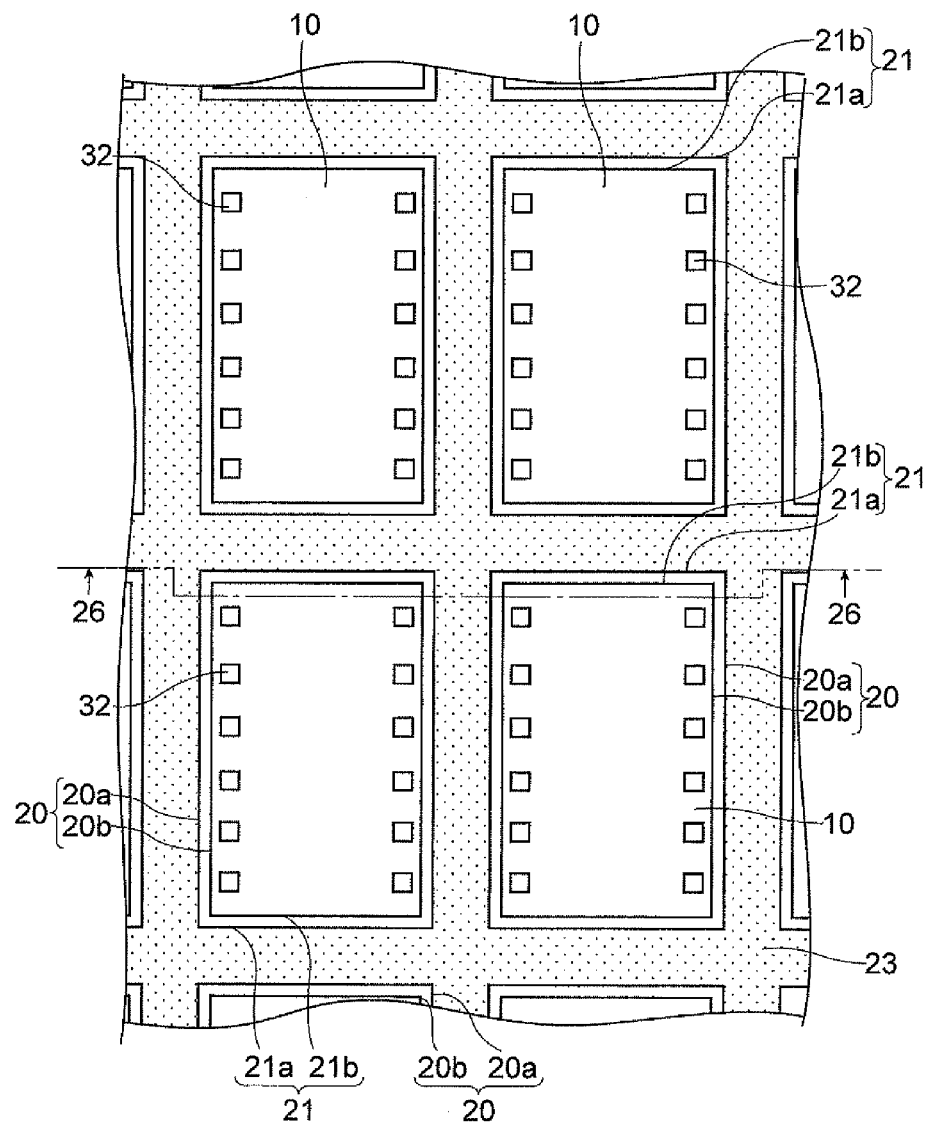
FIG. 19 is a plan view illustrating the semiconductor wafer subsequent to that in FIG. 18.
Figure 20:
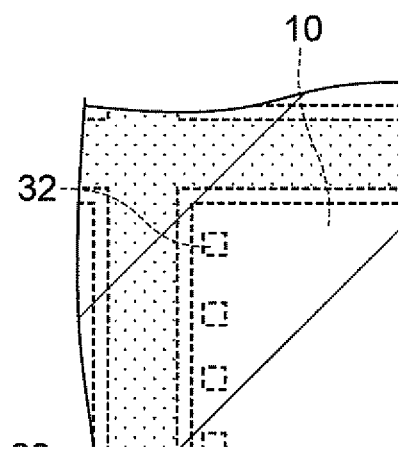
FIG. 20 is a plan view illustrating the semiconductor wafer subsequent to that in FIG. 19.
Figure 21:
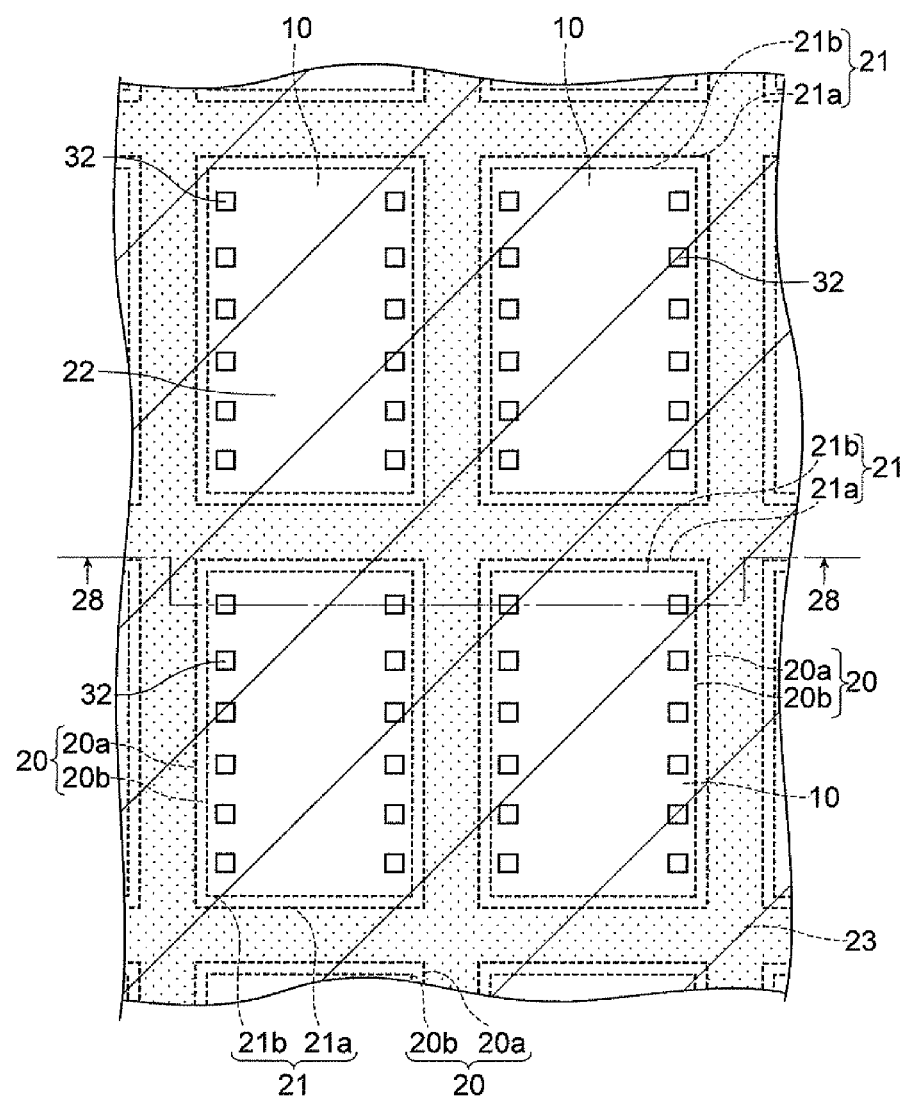
FIG. 21 is a plan view illustrating the semiconductor wafer subsequent to that in FIG. 20.

Subsequently, the method of manufacturing the semiconductor wafer 1, the semiconductor wafer 5 having the above-described structure will be described with reference to FIG. 17 to FIG. 28. Here, FIG. 17 is a plan view illustrating the partially manufactured semiconductor wafer, FIG. 18 is a plan view illustrating the semiconductor wafer subsequent to that in FIG. 17. FIG. 19 to FIG. 21 is a plan view illustrating the semiconductor wafer subsequent to that in the order. FIG. 22 is a sectional view of the semiconductor wafer mainly illustrating the groove part, in which (A) shows a state in which a first groove part forming step has been executed, and (B) shows a state in which a second groove part forming step has been executed. FIG. 23 is a sectional view of the semiconductor wafer subsequent to that in FIG. 22, in which (A) shows a state in which the lower insulating layer has been formed and (B) shows a state in which the upper insulating layer and the surface insulating layer have been formed. FIG. 24 to FIG. 28 is a sectional view taken along the line 24-24, the line 25-25, the line 26-26, the line 27-27, the line 28-28 in FIG. 17 to FIG. 21, respectively. Note that hatching is given to the surface insulating layer 22 in FIG. 20 and FIG. 21 for convenience of illustration. Besides, since forming steps of semiconductor wafer 1 are about the same as forming steps of semiconductor wafer 5, an illustration of the semiconductor wafer 5 is omitted in FIG. 17 to FIG. 28.

For manufacturing the semiconductor wafer 1, to begin with, eight wafers (first unprocessed wafers) are prepared which has memory parts and a plurality of connecting pads 32 formed in the device regions 10 by performing wafer process. For manufacturing the semiconductor wafer 5, one wafer (second unprocessed wafer) are prepared which semiconductor regions 11 are formed.

Figure 24:
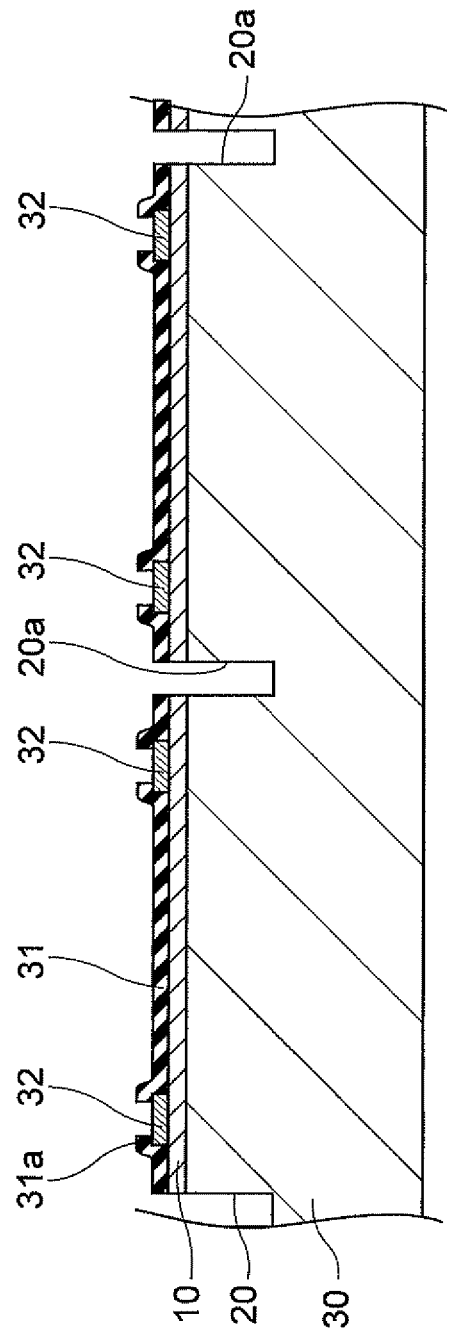
FIG. 24 is a sectional view taken along the line 24-24 in FIG. 17.

Then, as illustrated in FIG. 24, the protecting insulating layer 31 is formed on the device surface 1a for the first unprocessed wafer, and then the connecting holes 31a are formed at the locations in the protecting insulating layer 31 where the connecting pads 32 are to be formed. Besides, regarding the second unprocessed wafer, the protecting insulating layer 31 is formed on the groove forming surface.

Next, regarding the first unprocessed wafers and the second unprocessed wafer, the groove parts 20 and 21 are formed along the scribe lines 3A and 3B by performing a groove part forming step. The groove parts 20 and 21 are formed by the dicing saw. The groove parts 20 and 21 may be formed by etching such as the reactive ion etching or the like.

When the groove part forming step is performed, the following first groove part forming step and second groove part forming step are sequentially executed.

In the first groove part forming step, as illustrated in FIG. 17, FIG. 22(A), and FIG. 24, groove parts (first groove parts 120) having a first width and a first depth are formed in the device surface 1a along the scribe lines 3A and 3B using a not-shown first blade (cutting blade). In the first groove part 120, a part having a certain height from its bottom part will form the groove lower part 20a or the groove lower part 21a afterward. Here, the first width, which is the above-described width w1, is about 60 μm to about 80 μm, and the first depth, which is the depth d0 illustrated in FIG. 22(A), is about 40 μm to about 80 μm.

Figure 25:
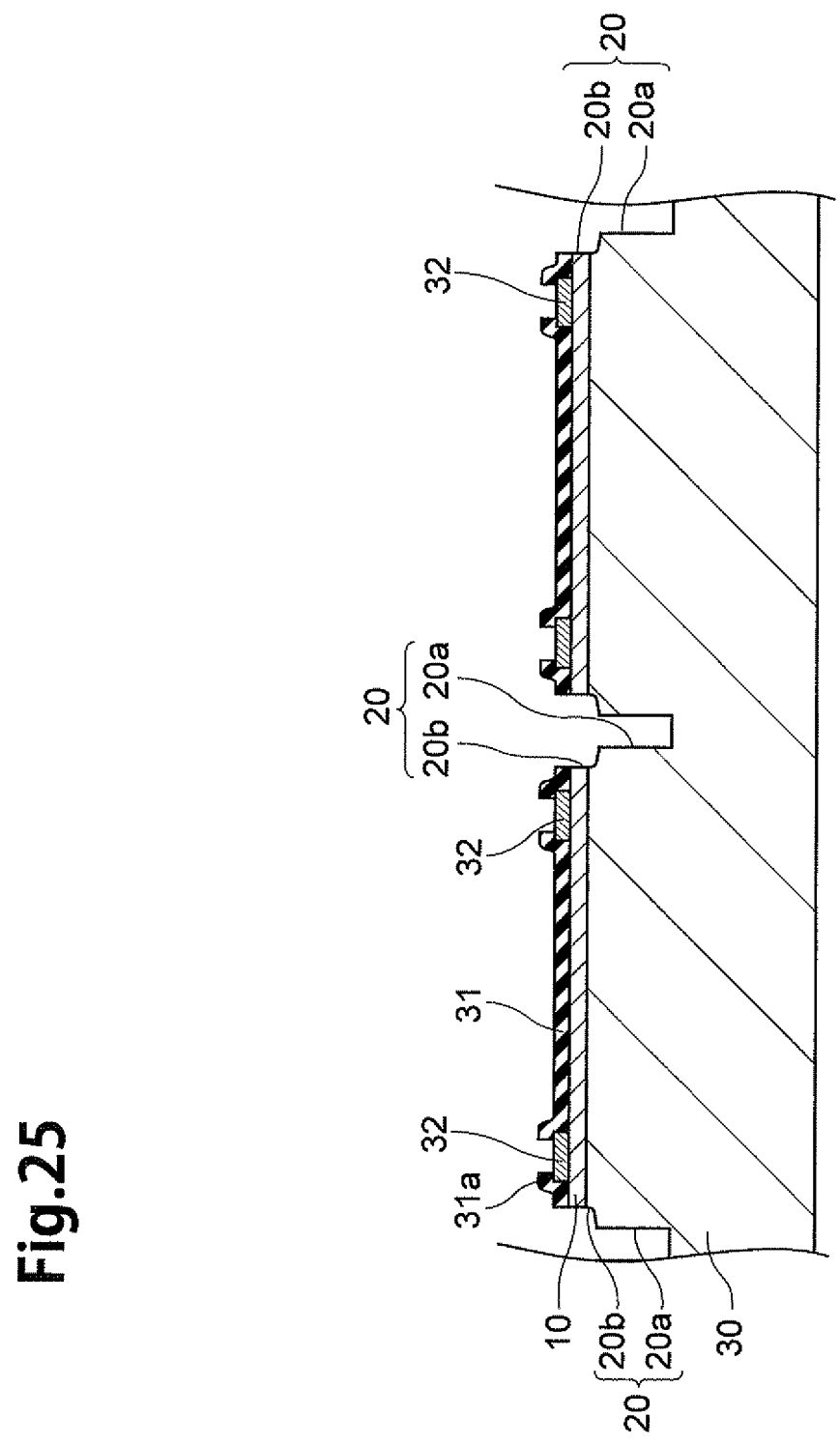
FIG. 25 is a sectional view taken along the line 25-25 in FIG. 18.

Subsequently, the second groove part forming step is executed. In the second groove part forming step, as illustrated in FIG. 18, FIG. 22(B), and FIG. 25, second groove parts 123 are formed at the inlet ports of the first groove parts 120 along the entire length direction of the first groove parts 120 using a not-shown second blade. The second groove part 123 has a second width and a second depth. The second width, which is the above-described width w2, is about 80 μm to about 120 μm, and the second depth, which is the above-described depth d2, is about 10 μm to about 40 μm. The second width is larger than the first width, and the second depth d2 is shallower than the first depth d0 (d0>d2). By forming the second groove parts 123, parts having a certain height from the bottom parts of the first groove parts 120 form the groove lower parts 20a and the groove lower parts 21a, and parts on the upper side of the groove lower parts 20a and the groove lower parts 21a form the wide width parts 20b and the wide width parts 21b, respectively.

Then, an insulating layer forming step is executed. In the insulating layer forming step, prior to application of a resin for forming the surface insulating layer 22 (referred also to as a resin for surface layer), a low-viscosity resin having a viscosity lower than that of the resin for surface layer is applied to the device surface 1a, the groove forming surface, regarding the eight first unprocessed wafers and the second unprocessed wafer. Then, the low-viscosity resin is uniformly spread over the device surface 1a, the groove forming surface using a not-shown spin coater. The low-viscosity resin has a high flowability because it is purling due to its low viscosity. Therefore, the low-viscosity resin surely enters the inside of the groove lower parts 20a and the groove lower parts 21a which a resin relatively hardly enters. In addition, due to the formation of the wide width parts 20b and 21b on the upper side of the groove lower parts 20a and the groove lower parts 21a respectively, the low-viscosity resin more easily enter the inside of the groove lower parts 20a and the groove lower parts 21a.

Figure 26:
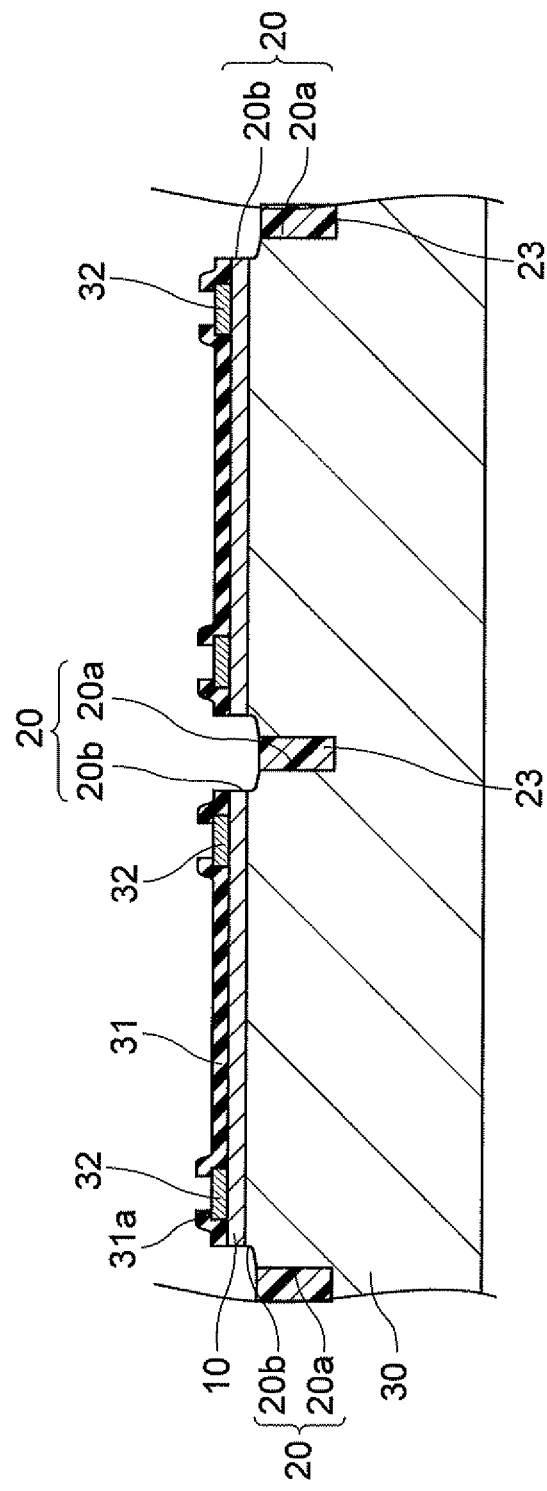
FIG. 26 is a sectional view taken along the line 26-26 in FIG. 19.

Thus, as illustrated in FIG. 19, FIG. 23(A), and FIG. 26, the low-viscosity resin remaining inside the groove lower parts 20a and the groove lower parts 21a forms the lower insulating layer 23. Note that the low-viscosity resin not only enters the inside of the groove parts 20 and 21 but also sometimes remains outside the groove parts 20 and 21 (for example, on the upper side of the protecting insulating layer 31) though illustration of the low-viscosity resin remaining outside the groove parts 20 and 21 is omitted.

Figure 27:
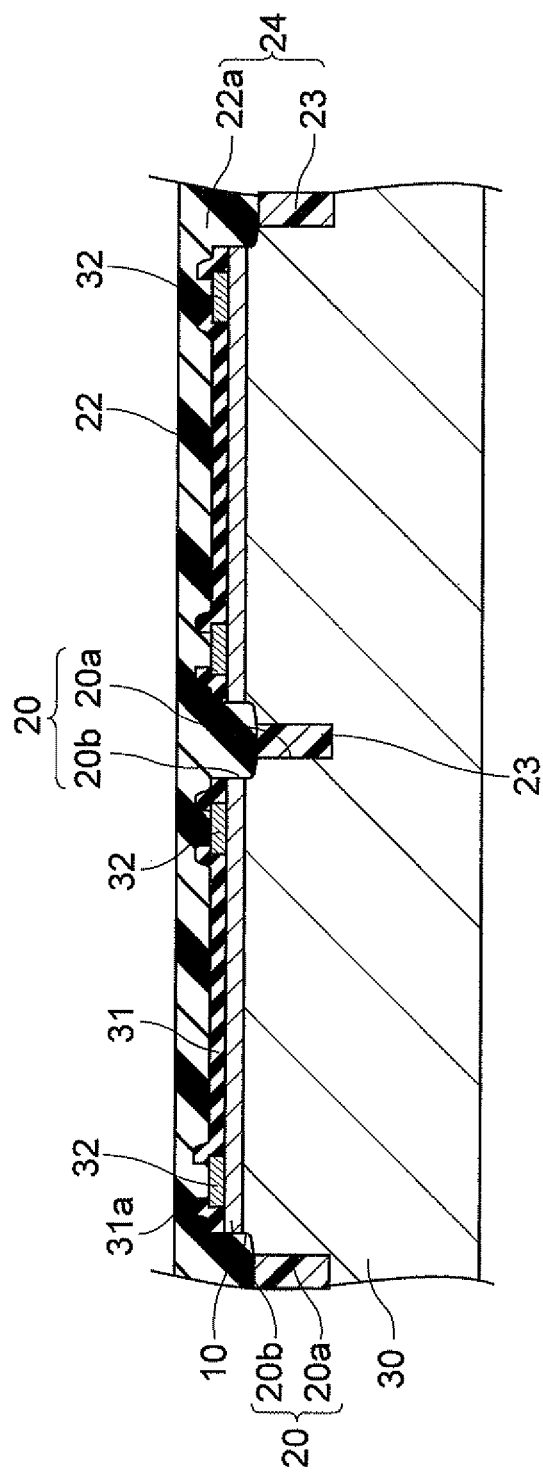
FIG. 27 is a sectional view taken along the line 27-27 in FIG. 20.

Next, regarding the eight first unprocessed wafers and the one second unprocessed wafer, a resin for surface layer is applied to the entire device surface 1a, groove forming surface as illustrated in FIG. 20, FIG. 23(B), and FIG. 27. Then, the applied resin for surface layer is uniformly spread over the device surface 1a, the groove forming surface using the not-shown spin coater. The resin for surface layer is, for example, epoxy resin, polyimide resin or the like and is higher in viscosity and lower in flowability than the low-viscosity resin. Therefore, the resin for surface layer hardly enters the inside of a groove part having a narrower width and a deeper depth. However, the wide width parts 20b and 21b are formed at the inlet ports of the groove parts 20 and 21. Thus, the resin for surface layer easily enters the inside of the groove parts 20 and 21.

By the application of the low-viscosity resin prior to the application of the resin for surface layer, the lower insulating layer 23 has been formed in the groove lower parts 20a and the groove lower parts 21a. Therefore, when the resin for surface layer enters the inside of the groove parts 20 and 21, by the resin for surface layer, an insulating layer different from the lower insulating layer 23 is formed inside the groove parts 20 and 21. This insulating layer forms the upper insulating layer 22a. Thus, the resin insulating layer 24 having the double-layer structure is formed inside the groove parts 20 and 21. The resin insulating layer 24 of the semiconductor wafer 1 corresponds to a first in-groove insulating layer. The resin insulating layer 24 of the semiconductor wafer 5 corresponds to a second in-groove insulating layer.

Subsequently, regarding the eight first unprocessed wafers and the one second unprocessed wafer, each surface is polished to be planarized. Thus, the surface insulating layer 22 is formed. The parts of the applied resin for surface layer entered into the groove parts 20 and 21 form the upper insulating layer 22a, so that the surface insulating layer 22 is formed integrally with the upper insulating layer 22a.

Figure 28:
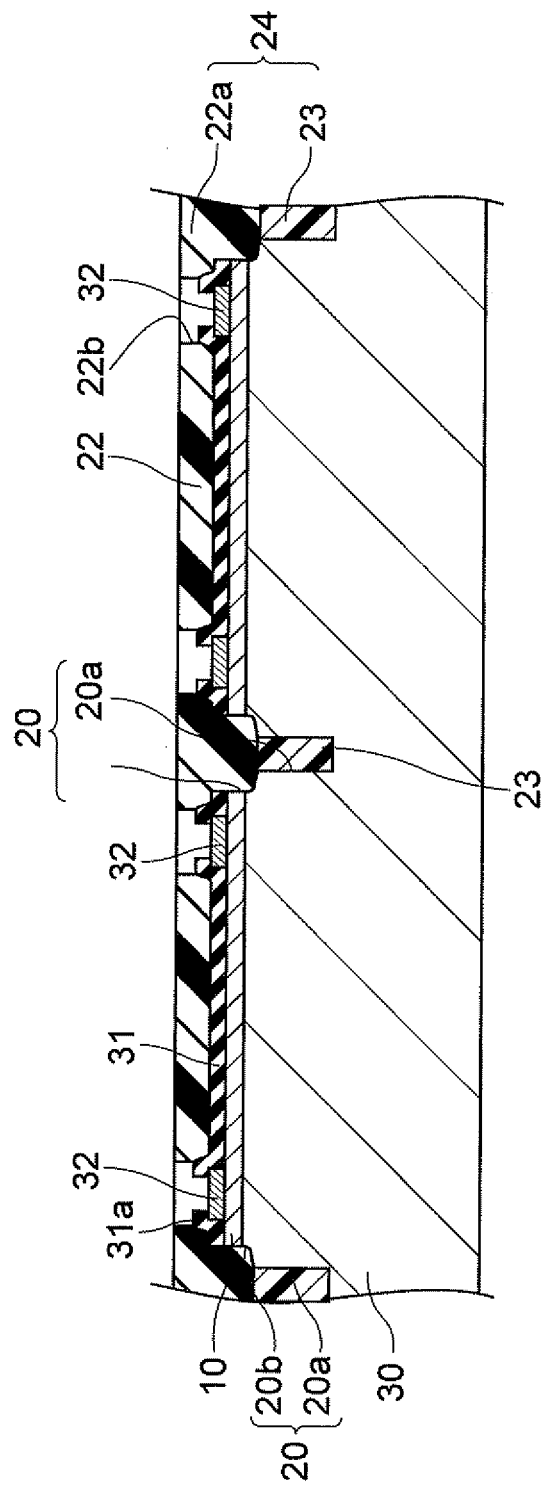
FIG. 28 is a sectional view taken along the line 28-28 in FIG. 21.

Subsequently, as illustrated in FIG. 21, FIG. 28, regarding the eight first unprocessed wafers, the contact holes 22b are formed in the surface insulating layer 22 to expose the connecting pads 32. Thereafter, a wiring electrode forming step is performed to form the wiring electrodes 15 regarding the eight first unprocessed wafers. Regarding the second unprocessed wafer, the wiring electrodes 35 are formed. The wiring electrodes 15 are formed in a shape having the above-described protruding structure and including the extended terminal parts 15a. The wiring electrodes 35 are formed in a shape having the above-described protruding structure and including the extended terminal parts 35a. Besides, the electrode pads 35b are formed with the above-described common arrangement pattern regarding the second unprocessed wafer. The wiring electrodes 15, 35 can be foamed, for example, in the procedure as follows.

First, a not-shown seed layer for plating is formed on the surface insulating layer 22. Next, a frame (not shown) including groove portions is formed on the seed layer. The frame is formed, for example, by patterning a photoresist by the photolithography. Further, plating layers which will be parts of the wiring electrodes 15 and 35 are formed within the groove parts of the formed frame and on the seed layer. Subsequently, the frame is removed, and a part of the seed layer other than the part which exists under the plating layer is removed by etching. By the above processing, the wiring electrodes 15 and 35 can be formed of the plating layer and the seed layer under the plating layer.

Because, the wiring electrodes 15 and 35 are formed after the formation of the surface insulating layer 22, the extended terminal parts 15a and 35a are formed in a manner that they are wholly disposed on the surface 22c of the surface insulating layer 22. The electrode pads 15b are formed such that their peripheral parts are disposed upper side of the surface 22c and their center parts are embedded inward from the surface 22c to connect with the connecting pads 32. The electrode pads 35b are disposed upper side of the surface 22c.

Through the above process, the semiconductor wafer 1, the semiconductor wafer 5 having the above-described structure can be manufactured. In the semiconductor wafer 1, the semiconductor wafer 5, the groove parts 20 and 21 have the wide-port structure so that a liquid resin easily enters the inside of the groove parts 20 and 21. Therefore, when forming an insulating layer inside the groove parts 20 and 21 using a liquid resin, the resin surely enters the inside of the groove parts 20 and 21. This eliminates a situation that an unfilled part (air gap) that is not filled with the resin is formed inside the groove parts 20 and 21. In short, the whole inside of the groove parts 20 and 21 is filled with the resin.

In the semiconductor wafer 1, the semiconductor wafer 5, the lower insulating layer 23 and the upper insulating layer 22a are formed of the resin filled without forming such an air gap. More specifically, the semiconductor wafer 1, the semiconductor wafer 5 have the groove parts 20 and 21 having a structure in which the inside of the groove parts 20 and 21 is filled with the insulating layer composed of a plurality of resins such as the low-viscosity resin and the resin for surface layer with no space (this structure is referred to as a "filled structure").

Incidentally, when manufacturing the memory device 140 using the semiconductor wafer 1, the semiconductor wafer 5, it is necessary to laminate a plurality of semiconductor wafers 1 and the semiconductor wafer 5 (described later for detail). For this reason, the load caused by the semiconductor wafers 1 laminated at the upper part acts on the semiconductor wafer 1 laminated at the lower part, and the load also acts on the extended terminal parts 15a, 35a. Parts on the tip end side of the extended terminal parts 15a, 35a are extended from the device region 10, semiconductor region 11 and located on the upper side of the groove part 20. Therefore, when the load from above acts on the extended terminal parts 15a, 35a, the tip end side of the extended terminal parts 15a, 35a extending from the inlet port 20d of the groove part 20 are likely to bow downward.

In the semiconductor wafer 1, the semiconductor wafer 5, however, the groove parts 20 and 21 have the filled structure, so that the lower insulating layer 23 and the upper insulating layer 22a never move inside the groove parts 20 and 21, and therefore the position of the surface 22c of the surface insulating layer 22 never shifts. The surface insulating layer 22, the upper insulating layer 22a, and the lower insulating layer 23 are supporting members supporting the extended terminal parts 15a, 35a, and their positions never shift so that the extended terminal parts 15a, 35a are surely supported by the surface insulating layer 22, the upper insulating layer 22a, and the lower insulating layer 23 (see FIG. 16). Accordingly, the extended terminal parts 15a, 35a are never deformed and can surely keep their original shapes even when the load from above acts thereon. Thus, by using the semiconductor wafer 1, the semiconductor wafer 5, the electrical connection of the memory device 140 can be surely established (described later for detail).

Further, in the groove parts 20 and 21, the wide width parts 20b and 21b are formed over the entire length direction of their inlet ports 20d. Therefore, the resin easily enters the inside of the whole groove parts 20 and 21. Thus, the extended terminal parts 15a, 35a which are not deformed can be formed at any part of the groove parts 20 and 21.

Since the groove lower parts 20a and 21a of the groove parts 20 and 21 are located closer to the bottom parts, a resin relatively hardly enters them as compared to other parts. Hence, in the semiconductor wafer 1, the semiconductor wafer 5, the lower insulating layer 23 is formed inside the groove lower parts 20a and 21a using the low-viscosity resin. The low-viscosity resin has a high flowability and therefore surely enters even a part hard to enter. Accordingly, the low-viscosity resin is very suitable for making the groove parts 20 and 21 in the filled structure. As described above, by using the low-viscosity resin in the semiconductor wafer 1, the semiconductor wafer 5, the filled structure of the groove parts 20 and 21 is more surely formed.

On the other hand, the resin for surface layer is higher in viscosity and lower in flowability than the low-viscosity resin. Therefore, if the groove parts 20 and 21 are composed only of the groove lower parts 20a and 21a and not in the wide-port structure, the resin for surface layer stays near the inlet port of the groove part 20 (21) and hardly enters the inside thereof. Then, an air gap in which no resin exists appears inside the groove parts 20 and 21 to cause the surface insulating layer 22 on the upper side of the groove parts 20 and 21 to bend. Further, since the resin for surface layer has a low flowability, it is difficult to make the groove part 20 (21) in the filled structure even if the groove part 20 (21) is widened about the width. Accordingly, it is difficult to avoid the situation that the air gap appears inside the groove part 20 (21) as well as to avoid the deformation of the extended terminal parts 15a, 35a by using only the resin for surface layer.

Hence, when manufacturing the semiconductor wafer 1, the semiconductor wafer 5, the low-viscosity resin is applied to the device surface 1a, groove forming surface prior to the application of the rein for surface layer. This makes it possible to fill the inside of the groove lower parts 20a and 21a which a resin relatively hardly enters and the resin for surface layer is difficult to enter, with the low-viscosity resin before the inlet ports 20d of the groove parts 20 and 21 are closed with the resin for surface layer. Thus, occurrence of the air gap is completely eliminated, so that the filled structure of the groove parts 20 and 21 can be more surely obtained.

Furthermore, the upper insulating layer 22a and the surface insulating layer 22 can be formed using the same resin in the same one step, and therefore the semiconductor wafer 1, the semiconductor wafer 5 can be easily manufactured.

Method of Manufacturing Laminated Semiconductor Wafer and Memory Device

By using the semiconductor wafers 1 and the semiconductor wafer 5 having the above-described structure, a laminated semiconductor wafer 98 and the memory device 140 are able to be manufactured. The laminated semiconductor wafer 98 corresponds to a laminated semiconductor substrate according to the embodiment of the present invention. In the laminated semiconductor wafer 98, a laminated memory substrate 97 is laminated to the one semiconductor wafer 5. In the laminated memory substrate 97, the eight semiconductor wafers 1 are laminated. By using the laminated semiconductor wafer 98, the memory device 140 is able to be manufactured. The method of manufacturing the laminated semiconductor wafer 98 and the memory device 140 will be described using FIG. 7, FIG. 8 and FIG. 29 to FIG. 32 as follows.

Figure 29:
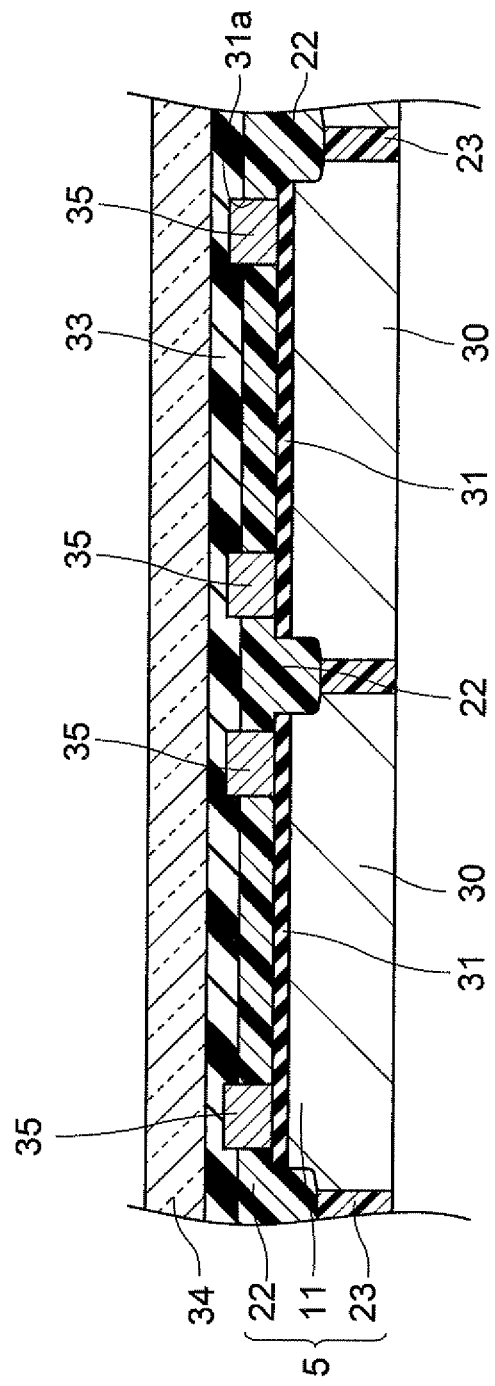
FIG. 29 is a sectional view similar to FIG. 13, illustrating the other semiconductor wafer in the process of manufacturing the laminated semiconductor wafer and a base.
Figure 30:
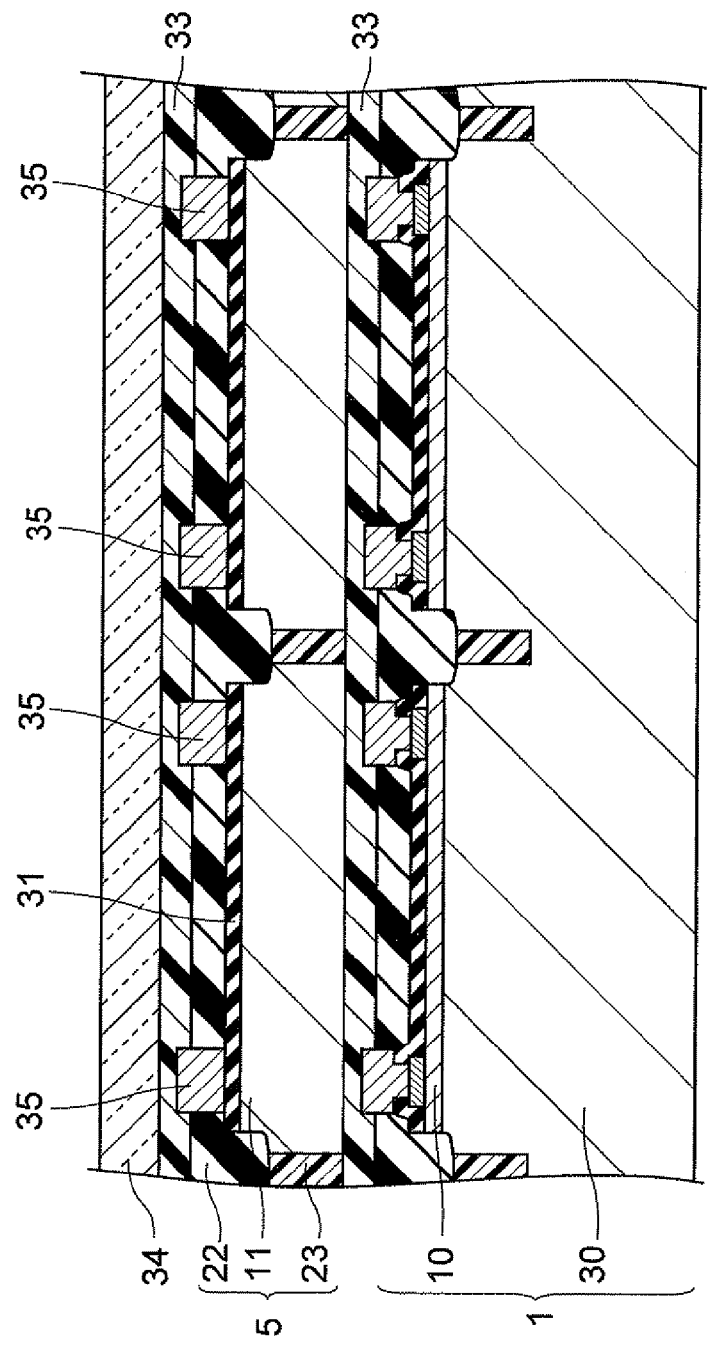
FIG. 30 is a sectional view similar to FIG. 13, illustrating the process subsequent to that in FIG. 29.
Figure 31:
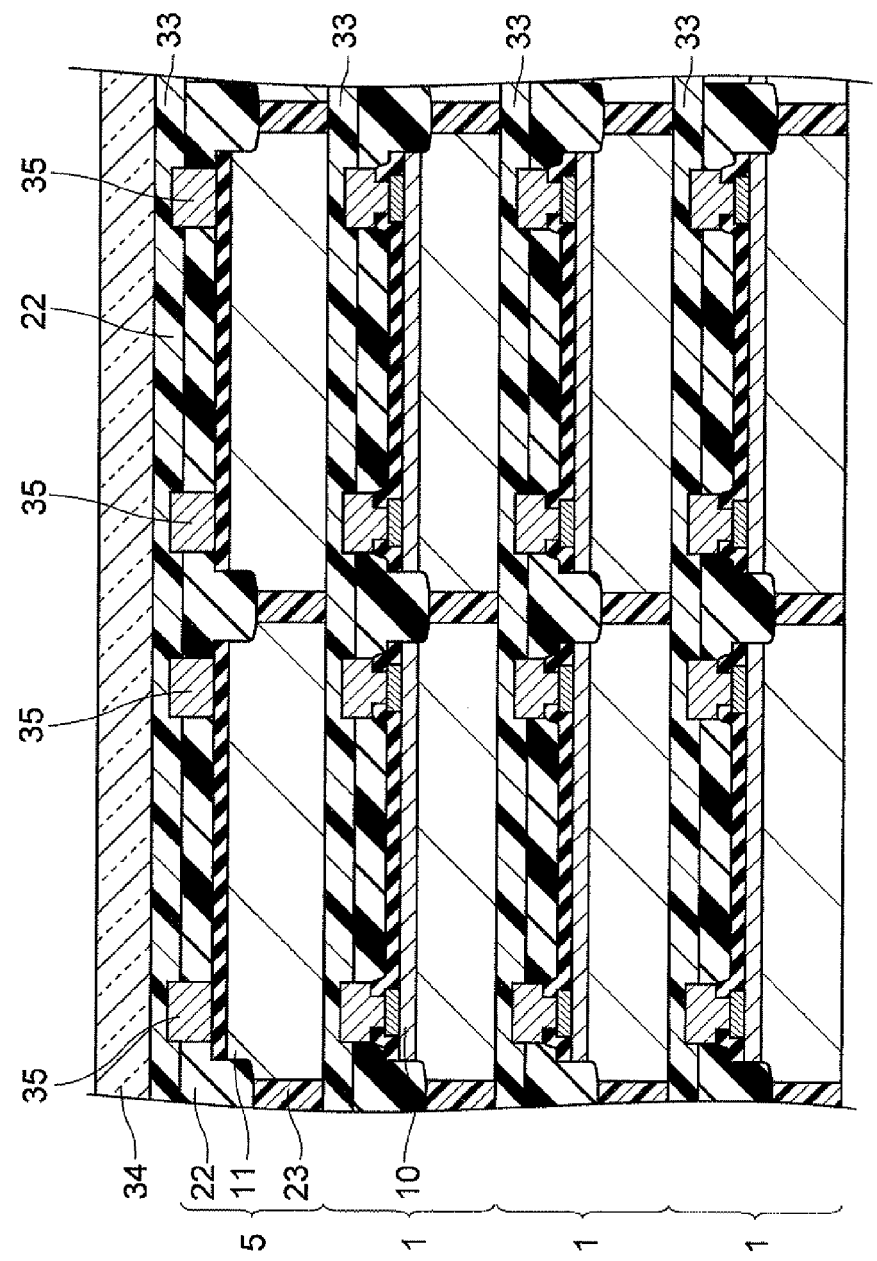
FIG. 31 is a sectional view similar to FIG. 13, illustrating the process subsequent to that in FIG. 30.
Figure 32:
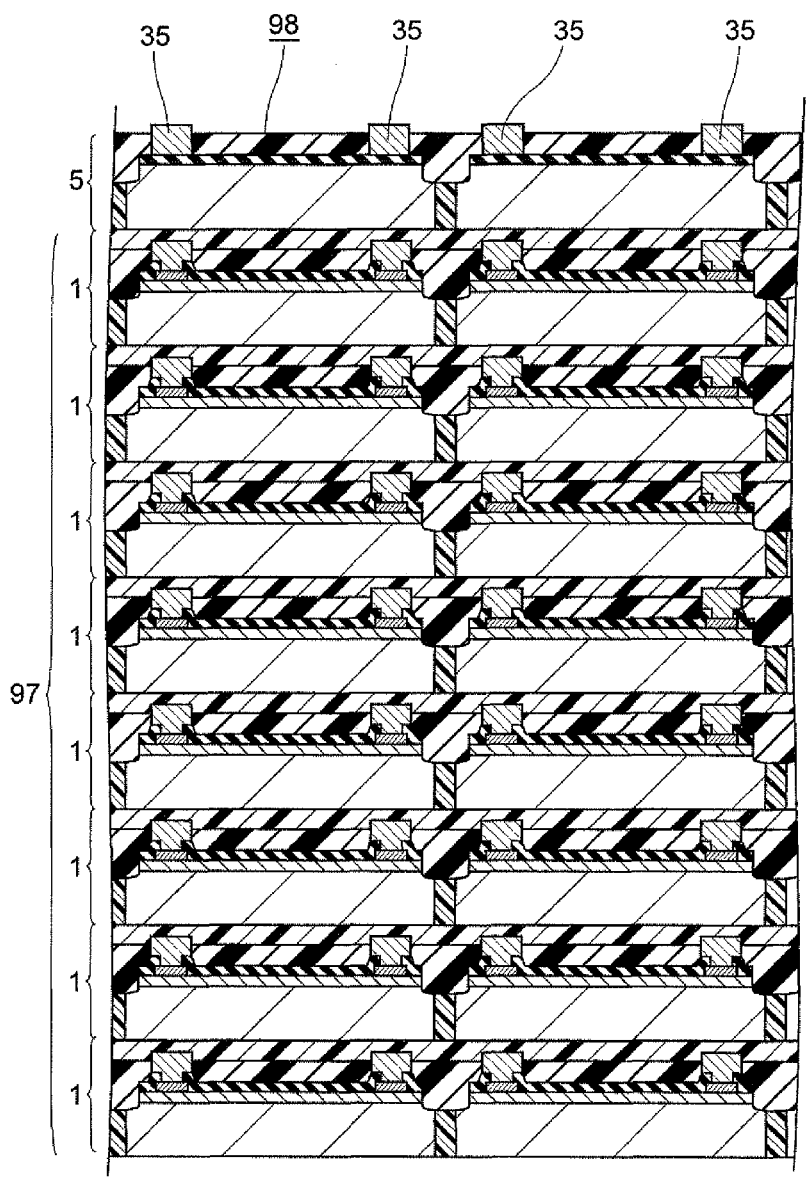
FIG. 32 is a sectional view similar to FIG. 13, illustrating the process subsequent to that in FIG. 31.

Here, FIG. 29 is a sectional view similar to FIG. 13, illustrating the semiconductor wafer 5 in the process of manufacturing the laminated semiconductor wafer 98 and a base 34. FIG. 30 to FIG. 32 is a sectional view similar to FIG. 13, illustrating the process subsequent to that in the order.

The memory device 140 can be manufactured by performing a controller plate manufacturing step and a laminated chip package manufacturing step. In the controller plate manufacturing step, the above-described controller plate 110 is manufactured. In the controller plate manufacturing step, a wiring electrodes for plate forming step and a connection electrodes for plate forming step are performed on the above-described chip-like member having a control IC, namely, the controller chip 109.

In the wiring electrodes for plate forming step, a plurality of outside wiring electrodes 112 and a plurality of opposing wiring electrodes 113 are formed respectively on the outer surface 109A and the opposing surface 109B of the controller chip 109, for example, in the following procedure.

In this case, a not-shown seed layer for plating is formed on the outer surface 109A and the opposing surface 109B. Next, a frame (not shown) including groove portions is formed on the seed layer. Further, plating layers which will be parts of the outside wiring electrodes 112 and the opposing wiring electrodes 113 are formed within the groove parts of the formed frame and on the seed layer. Subsequently, the frame is removed, and a part of the seed layer other than the part which exists under the plating layer is removed by etching. By the above processing, the outside wiring electrodes 112 and the opposing wiring electrodes 113 can be formed of the plating layer and the seed layer under the plating layer.

Subsequently, a plurality of connection electrodes 116 are formed on the side surface 109C, 109D by performing a connection electrodes for plate forming process. The connection electrodes 116 are able to be formed by plating for example. In this case, a not-shown seed layer for plating is formed on a part of the side surface 109C, 109D, which the connection electrodes 116 will be formed. Next, a frame (not shown) including groove portions is formed on the seed layer. Further, plating layers which will be parts of the connection electrodes 116 are formed within the groove parts of the formed frame and on the seed layer. Subsequently, the frame is removed, and a part of the seed layer other than the part which exists under the plating layer is removed by etching. By the above processing, the connection electrodes 116 can be formed of the plating layer and the seed layer under the plating layer.

Meanwhile, in the laminated chip package manufacturing step, the laminated chip package 90 is manufactured. In this case, eight semiconductor wafers 1 and one semiconductor wafer 5 are manufactured as described above, and the laminating step is then performed to manufacture the laminated semiconductor wafer 98. Further, in the laminating step, the semiconductor wafer 5 is laminated on the outermost side of the eight semiconductor wafers 1. Therefore, by performing the laminating step, the semiconductor wafer 5 is laminated at the outermost side among the nine semiconductor wafers.

Further, among the eight semiconductor wafers 1 and one semiconductor wafer 5, only the semiconductor 5 has a plurality of wiring electrodes formed in the common arrangement pattern. Further, the interposer 51 is obtained from the semiconductor wafer 5. Accordingly, by the laminated chip package manufacturing step, the laminated chip package 90 can be manufactured such that the outermost chip has the plurality of wiring electrodes 35 formed in the common arrangement pattern. Note that, as described above, the semiconductor wafer 1 has the plurality of memory cells 41 and the wiring electrodes 15, and therefore corresponds to a first substrate according to the embodiment of the present invention. Further, the semiconductor wafer 5 has the wiring electrodes 35 and therefore corresponds to a second substrate according to the embodiment of the present invention.

In the laminating step, the eight semiconductor wafers 1 are laminated in order on the one semiconductor wafer 5. In this case, first, as illustrated in FIG. 29, an insulating adhesive is applied on the groove forming surface of the semiconductor wafer 5 to fix it to the base 34. In FIG. 29, the adhesive layer 33 made of the adhesive applied at this time is shown. The base 34 is a member for supporting the semiconductor wafer 5, and a glass plate is used for the base 34 in FIG. 29.

Subsequently, the rear surface 1*b* of the semiconductor wafer 5 is polished until the groove parts 20 and 21 appear so that the thickness of the semiconductor wafer 5 is decreased as illustrated in FIG. 29.

Next, the semiconductor wafer 1 is bonded to the rear surface 1*b* side of the semiconductor wafer 5 as illustrated in FIG. 30 using an adhesive. In this event, position adjustment of the semiconductor wafer 5 and the semiconductor wafer 1 is performed such that the positions of the groove parts 20 and 21 of both of them coincide with each other. Then, the rear surface 1*b* of the semiconductor wafer 1 is polished until the groove parts 20 and 21 appear.

Subsequently, as illustrated in FIG. 31, regarding other semiconductor wafer 1, a process of bonding it to the rear surface 1*b* side of the semiconductor wafer 1 which already laminated and polishing it (a bonding and polishing process) is performed.

When such a bonding and polishing process is performed regarding the eight semiconductor wafers 1 in total, the laminated semiconductor wafer 98 can be manufactured, as illustrated in FIG. 32. In the laminated semiconductor wafer 98, a part which the eight semiconductor wafers 1 are laminated is the laminated memory substrate 97.

The laminated semiconductor wafer 98 is manufactured by using the semiconductor wafers 1 and semiconductor wafer 5. The laminated semiconductor wafer 98 has the same configuration as those of the semiconductor wafer 1 and the semiconductor wafer 5, and the semiconductor wafer 5 has a plurality of wiring electrodes 35. Accordingly, by performing the above-described laminating step, the laminated chip package 90 can be manufactured such that the outermost chip has the plurality of wiring electrodes 35 formed in the common arrangement pattern.

In the above description, the laminated semiconductor wafer 98 is manufactured by sequentially laminating the eight semiconductor wafers 1 one by one on the semiconductor wafer 5. However, the laminated semiconductor wafer 98 may be manufactured by manufacturing the semiconductor wafer 5 reduced in thickness by polishing the rear surface 1*b*, and then laminating the laminated memory substrate 97 on the semiconductor wafer 5. In this case, the laminated memory substrate 97 can be manufactured in advance by laminating the eight semiconductor wafers 1 in the above-described manner. As a matter of course, the laminated memory substrate 97 may be manufactured by laminating four semiconductor wafers 1, or may be manufactured by laminating two semiconductor wafers 1.

Namely, the number of semiconductor wafers 1 which will be laminated in the laminated semiconductor wafer 98 can be relatively easily changed. Since many memory cells 41 are formed in the semiconductor wafer 1, the storage capacity of the memory device which will be manufactured is also changed according to the change of the number of the semiconductor wafers 1.

Furthermore, it is also adoptable to use the laminated memory substrate 97 in which the eight semiconductor wafers 1 are laminated as a unit laminated substrate, and laminate a plurality of the unit laminated substrates to form a laminated semiconductor wafer. For example, in the laminated semiconductor wafer in which two unit laminated substrates are laminated, 16 semiconductor wafers 1 are laminated. In three unit laminated substrates, 24 semiconductor wafers 1 are laminated. Accordingly, the number of the semiconductor wafers 1 which are laminated within the laminated semiconductor wafer is a multiple of 8.

Furthermore, it is also adoptable to use the laminated memory substrate in which the four semiconductor wafers 1 are laminated as a unit laminated substrate, and laminate a plurality of the unit laminated substrates to form a laminated semiconductor wafer. In this case, the number of the semiconductor wafers 1 which are laminated within the laminated semiconductor wafer is a multiple of 4.

When the laminated semiconductor wafer 98 is constituted using the above-described unit laminated substrate, the number of units according to the capacity of a memory required in the memory device can be easily found. Further, the capacity of the memory in the memory device can be easily varied only by varying the lamination number of unit laminated substrates. For example, when one unit is formed to provide 64 GB, memories of 128 GB and 256 GB can be realized only by varying the lamination number of units. Note that since all multiples of 8 are multiples of 4, it is preferable to laminate the four semiconductor wafers 1 to form the unit laminated substrate.

Then, when the laminated chip package 90 is manufactured, the following process is performed continuously about the laminated semiconductor wafer 98.

To begin with, the laminated semiconductor wafer 98 is cut along the groove parts 20 and 21. Thus, the semiconductor wafer 5 and the eight semiconductor wafers 1 are divided into every the device region 10, device region 11 laminated in the laminated direction. By this, device blocks in a block-like shape are manufactured.

In this device block, the one interposer 51 and the eight memory chips 50 are laminated. When the laminated semiconductor wafer 98 is manufactured, position adjustment of the semiconductor wafer 5 and the semiconductor wafers 1 is performed such that the positions of the groove parts 20 and 21 of both of them coincide with each other. Therefore, by cutting of the laminated semiconductor wafer 98 along the groove parts 20 and 21, the laminated semiconductor wafer 98 is divided into every block surrounded by the adjacent groove parts 20 and 21. The each block is the device block.

Then, as has been described, the semiconductor wafer 5 and the eight semiconductor wafers 1 are polished until the respective groove parts 20, 21 appear. Inside each of the groove parts 20, 21, the lower insulating layer 23 and the upper insulating layer 22*a* are formed. Therefore, in the device block, four side surfaces are covered by the lower insulating layer 23 and the upper insulating layer 22a, namely, the resin insulating layer 24 in each of the interposer 51 and the eight memory chips 50.

Further, when the laminated semiconductor wafer 98 is cut along the groove parts 20, 21, the semiconductor wafer 5 and the eight semiconductor wafers 1 are cut together, and therefore four flat cut surfaces appear. In addition, since the wiring electrodes 15 and the wiring electrodes 35 are extended to the top of the resin insulating layer 24, the end faces 15c, 35c of the wiring electrodes 15 and the wiring electrodes 35 appear at the cut surfaces. A pair of opposite cut surfaces of the four cut surfaces are the above-described common wiring side surfaces 52, 52. The end faces 15c, 35c are arranged on straight lines along the laminated direction on the common wiring side surfaces 52.

Accordingly, the wiring electrodes 15 on each of the semiconductor wafers 1 can be electrically connected to the wiring electrodes 35 on the semiconductor wafer 5 by forming the band-shape connection electrodes 60 along the laminated direction on the common wiring side surfaces 52 as illustrated in FIG. 2. Thus, the laminated chip package 90 which the interposer 51 is laminated can be manufactured.

When manufacturing the memory device 140, the wiring electrode connecting step is successively performed. In this step, the controller plate 110 is mounted on the interposer 51, and each of the electrode pads 113b is connected to each of the electrode pads 35b. In this case, the electrode pads 113b are formed on the opposing surface 109B of the controller plate 110. Therefore, the opposing surface 109B is directed to the interposer 51 side, each of the electrode pads 113b is aligned with each of the electrode pads 35b, and both electrode pads are connected by a solder 121. Then, the opposing wiring electrodes 113 and the wiring electrodes 35 are connected to complete the memory device 140.

Operation and Effect of Memory Device 140

As described above, the memory device 140 has a structure that the controller plate 110 is mounted on the interposer 51 and each of the electrode pads 113 of the controller plate 110 is connected to each of the electrode pads 35b of the interposer 51.

In the controller plate 110, the opposing wiring electrodes 113 and the outside wiring electrodes 112 are formed respectively on the opposing surface 109B and the outer surface 109A which are integrally provided in a front/rear relation, and the opposing wiring electrodes 113 and the outside wiring electrodes 112 are connected by the connection electrodes 116. Therefore, in the memory device 140, even if the opposing surface 109B faces the interposer 51, the outside wiring electrodes 112 exhibit the function as electrodes for ensuring the connection with the external part so that the connection with the external part can be ensured by the outside wiring electrodes 112. In short, by connecting the bonding wires 133 to the outside wiring electrodes 112 as described above, the memory device 140 can be connected to the resin substrate 130.

Assuming that the controller plate 110 has a structure having only the opposing wiring electrodes 113 but not either the outside wiring electrodes 112 or the connection electrodes 116, it is difficult to ensure the connection with the external part in the controller plate 110. Only with the opposing wiring electrodes 113, merely the connection between the controller plate 110 and the interposer 51 can be ensured. Further, since the opposing surface 109B faces the interposer 51 with a minute gap intervening between them, it is very difficult to connect the bonding wires to the opposing wiring electrodes 113.

On the other hand, in the memory device 140, the opposing wiring electrodes 113 of the controller plate 110 and the wiring electrodes 35 of the interposer 51 are formed in the common arrangement pattern. Even if the size of the controller plate 110 or the laminated chip package 90 is changed, only by forming the opposing wiring electrodes 113 and the wiring electrodes 35 in the common arrangement, the opposing wiring electrode 113 and the wiring electrode 35 are arranged one on the other facing each other and therefore both of them can be connected using the solder. In addition, the opposing wiring electrode 113 and the wiring electrode 35 have the electrode pads 113b and the electrode pads 35b respectively. Accordingly, a part where the opposing wiring electrode 113 and the wiring electrode 35 face each other is larger in size than that when the electrode pad 113b and the electrode pad 35b are not provided, so that the part where the solder contacts is increased and connects them more surely.

Though not illustrated, even if the outside dimension of the controller plate 110 is larger than that of the interposer 51, the opposing wiring electrode 113 and the wiring electrode 35 are arranged one on the other, so that the a part where they are overlapped can be ensured. Accordingly, each of the opposing wiring electrodes 113 can be connected to each of the wiring electrodes 35 using the solder.

Accordingly, the memory device 140 has a structure with enough versatility to surely ensure the connection with the external part irrespective of the size of the controller plate 110 and the laminated chip package 90.

Further, the outside wiring electrodes 112 are also formed in the arrangement pattern in common with those of the opposing wiring electrodes 113 and the wiring electrodes 35. Accordingly, even if the controller plate 110 is reversed, the controller plate 110 can be connected to the interposer 51. More specifically, even if the controller plate 110 is reversed to make the outer surface 109A face the interposer 51, the memory device 140 can be obtained. Therefore, the memory device 140 has a highly versatile structure.

On the other hand, assuming that the outside dimension of the controller plate 110 is larger than that of the interposer 51, the length of the extended terminal part 113a from the side surface 109C, 109D needs to be made longer in order to form the opposing wiring electrodes 113 in the arrangement pattern in common with that of the wiring electrodes 35. Then, the amount of plating and the like required for forming the opposing wiring electrodes 113 increases, resulting in increased manufacturing cost of the memory device 140.

In this regard, since the outside dimension of the controller plate 110 is smaller than that of the interposer 51 in the memory device 140, it is unnecessary to make the length of the extended terminal part 113a from the side surface 109C, 109D longer than necessary. Therefore, in the memory device 140, the increase in manufacturing cost can be restrained.

Incidentally, the eight memory chips 50 are laminated in the laminated chip package 90, and each of the memory chips 50 and the controller plate 110 are manufactured by completely different processes. Therefore, the memory chip 50 and the controller plate 110 are different in outside dimension and also different in the arrangement pattern of electrode pads necessary for connection with the external part.

Therefore, when the interposer 51 is not laminated on the laminated chip package 90, wiring electrodes need to be additionally formed on either the memory chip 50 or the controller plate 110 so that the arrangement pattern of the memory chip 50 coincides with the arrangement pattern of the controller plate 110.

When the electrode pad 15b of the memory chip 50 is connected to the electrode pad 113b of the controller plate 110 by solder, it is necessary that the positions of both the electrode pads coincide and both the electrode pads are overlaid one on the other. However, if the arrangement patterns of the electrode pads are different, the positions of both the electrode pads are out of alignment. Therefore, only one of the plurality of electrode pads 113b (for example, only one of twelve electrode pads 113b) can be overlaid on the electrode pad 15b, but all of the electrode pads 113b cannot be overlaid on the electrode pads 15b. Accordingly, electrode pads which cannot be connected to the electrode pads (referred also to as unconnectable electrode pads) emerge in the plurality of electrode pads 113b, failing to complete the memory device.

Hence, in the memory device 140, the interposer 51 is laminated between the controller plate 110 and the laminated chip package 90 outside the eight memory chips 50. This interposer 51, in which semiconductor elements such as memory cell or the like are not formed, has a plurality of wiring electrodes 35, and the wiring electrodes 35 are formed in the arrangement pattern (the common arrangement pattern) in common with the arrangement pattern of the controller plate 110. Therefore, when the controller plate 110 is laid on the interposer 51, all of the electrode pads 113b of the controller plate 110 can be arranged on the electrode pads 35b of the interposer 51, thereby eliminating emergence of the unconnectable electrode pads.

Accordingly, the solders 121 can be used to connect all of the electrode pads 113b of the controller plate 110 to the electrode pads 35b of the interposer 51. Further, since the interposer 51 is larger in outside dimension than the controller plate 110, an adjustable range in the length of the extended terminal part 35a is wide in the interposer 51.

Since the interposer 51 for connecting the controller plate 110 is laminated in the memory device 140, it is unnecessary to change the structure and the manufacturing process of the memory chip 50 so that the arrangement of the electrode pads 15b is adapted to the electrode pads 113b. Therefore, the memory device 140 has a highly-versatile structure capable of simplifying the manufacturing process. Further, for example, in the case where a controller chip having an arrangement pattern of the electrode pads different from that of the electrode pads 113b is used, when the positions of the electrode pads are laterally changed along the long side direction, it is sufficient to manufacture only the interposer in the arrangement pattern in common with the arrangement pattern of the electrode pads. In this case, only the structure and the manufacturing process of the interposer need to be changed, and the structure and the manufacturing process of the memory chip 50 do not need to be changed. The memory chip 50 can be manufactured in the same structure and the same manufacturing process as those before the change. Accordingly, a memory device has the structure like the memory device 140 and thereby enables simplification of the manufacturing processes of various kinds of memory devices. Therefore, the memory device 140 matches with efficient manufacture of various kinds of memory devices and is thus excellent in mass production.

On the other hand, the respective end faces 35c, 15c of the wiring electrodes 35 of the interposer 51 and the wiring electrodes 15 of the memory chips 50 appear at the common wiring side surfaces 52 and are connected via the connection electrodes 60. Therefore, the electrode pads 113b of the controller plate 110 are connected to the electrode pads 35b of the interposer 51, whereby the controller plate 110 is connected to each of the memory chips 50 via the connection electrodes 60. The interposer 51 functions as an interface for connecting the controller plate 110 to each of the memory chips 50. Accordingly, in the memory device 140, read/write of data from/to the memory cells 41 of the memory chips 50 can be surely performed by control of the control IC of the controller plate 110.

As described above, the memory device 140 can be manufactured by laying the various kinds of memory chips having different arrangement patterns of the wiring electrodes owing to lamination of the interposer 51 for connecting to the controller plate 110, and is increased in versatility to be able to manufacture various kinds of memory devices. Further, by laying the controller plate 110 on the interposer 51, the controller plate 110 is able to be connected to the interposer 51 by the solders 121, thus eliminating excessive load on the process for connecting the controller plate 110. Accordingly, the memory device 140 can be simplified in manufacturing process and also reduced in manufacturing time.

Further, if the lamination number of the memory chips 50 is increased from eight so as to increase the storage capacity of the memory device 140, the controller plate 110 can be connected to all of the memory chips 50 only by laminating the interposer 51. Accordingly, the increase in storage capacity of the laminated chip package 90 never increases the load on the process for connecting the controller plate 110.

Meanwhile, the memory device 140 is manufactured using the semiconductor wafer 1 and the semiconductor wafer 5. The plurality of wiring electrodes 15 of the semiconductor wafer 1 and the plurality of wiring electrodes 35 of the semiconductor wafer 5 have the respective extended terminal parts 15a, 35a, and therefore the respective end faces 15c, 35c appear at the common wiring side surfaces 52. In addition, since the wiring electrodes 15 and the wiring electrodes 35 are formed such that the number and the arrangement interval of the wiring electrodes 15 and the number and the arrangement interval of the wiring electrodes 35 are equal, the end faces 15c, 35c appear arranged in straight lines along the laminated direction. Accordingly, the interposer 51 can be connected to the eight memory chips 50 by forming the connection electrodes 60 in a band-shape along the laminated direction on the common wiring side surfaces 52, thereby simplifying the process required for connection of the interposer 51.

The laminated semiconductor wafer 98 is able to be manufactured by laminating the semiconductor wafers 1 on the semiconductor wafer 5. By manufacturing the laminated memory substrate 97 in advance by laminating only the semiconductor wafers 1, the laminated semiconductor wafer 98 can be obtained by laminating the laminated memory substrate 97 on the semiconductor wafer 5. Accordingly, if a large variety of laminated memory substrates 97 different in the lamination number of the semiconductor wafers 1 are manufactured in advance for manufacturing a laminated semiconductor wafer 98, a large variety of laminated semiconductor wafers 98 can be efficiently manufactured. Since the laminated semiconductor wafer 98 can be changed in the number of the memory cells 41 included therein by changing the lamination number of the semiconductor wafers 1, the laminated semiconductor wafer 98 is very preferable in manufacturing a large variety of memory devices 140 different in storage capacity.

Meanwhile, when cutting the laminated semiconductor wafer 98 along the groove parts 20, 21, the groove parts 20, 21 are cut along cut lines CL illustrated in FIG. 16. Then, the extended terminal parts 15a (also the extended terminal parts 35a) are cut along the cut lines CL. Further, as described above, the resin insulating layer 24 has been formed inside the groove parts 20 and 21 in each semiconductor wafer 1, semiconductor wafer 5. Therefore, the section of the insulating layer of the double-layer structure (the section of the insulating layer is referred also to as an "insulating section") appears in a cut surface when the laminated semiconductor wafer 98 is cut along the groove parts 20 and 21. The insulating section is in the double-layer structure in which a section of the upper insulating layer 22a is laminated on a section of the lower insulating layer 23.

Further, the wide width parts 20b and 21b are formed wider than the groove lower parts 20a and 21a in each semiconductor wafer 1, semiconductor wafer 5. Therefore, the upper insulating layer 22a has a depth larger than that of the lower insulating layer 23 at four side surfaces of the device block. This depth means a distance d11 between the section of the upper insulating layer 22a and the inner side surface of the wide width part 20b (21b), and this depth means a distance d12 between the section of the lower insulating layer 23 and the inner side surface of the groove lower part 20a (21a). The distance d11 is larger than the distance d12 and therefore d11>d12.

By the way, the memory device 140 is manufactured by forming the connection electrodes 60 on the common wiring side surface 52. The end faces 15c and 35c connected by the connection electrodes 60 are formed in a manner to project upward from the surface 22c.

At the time of forming the connection electrodes 60, the mask pattern for forming the connection electrodes 60 needs to be accurately placed, but the memory device 140 is able to be manufactured even if the position adjustment of the mask pattern is roughly performed. Even with the rough position adjustment, the connection electrodes 60 connecting the vertically arranged plural end faces 15c are able to be formed.

More specifically, in the memory device 140, the alignment does not need to be performed with high accuracy when forming the connection electrodes 60. Therefore, the process after the device block in the rectangular parallelepiped shape is obtained are able to be simplified, thereby simplifying the whole manufacturing process of the memory device 140. Accordingly, the manufacturing time of the memory device 140 is able to be reduced. This can increase the number of memory device 140 manufacturable in a unit time, resulting in a reduced manufacturing cost of the memory device 140.

The reason why the alignment does not need to be performed with high accuracy in case of forming the connection electrodes 60 is given as follows.

First of all, the device block has four side surfaces composed of cut surfaces when the laminated semiconductor wafer 98 is cut. In one of the cut surfaces, the end faces 15c and 35c appear as end faces projecting similarly to the end faces 15g (see FIG. 15 for details). This is because of the following reason. Note that the end face projecting is also referred to as a projecting end face in this embodiment.

The wiring electrodes 15, 35 of each of the semiconductor wafers 1, the semiconductor wafer 5 have the extended terminal parts 15a, the extended terminal part 35a respectively. The extended terminal parts 15a and the extended terminal parts 35a are extended inside the groove parts 20. For this reason, when the laminated semiconductor wafer 98 is cut along the groove parts 20, 21, the extended terminal parts 15a and the extended terminal parts 35a are also cut. Further, the end faces 15c, 35c formed when the extended terminal parts 15a, the extended terminal parts 35a are cut appear at one of the cut surfaces.

On the other hand, the extended terminal parts 15a, 35a are formed in the protruding shape similarly to the electrode pads 15b, 35b having the expanded height h15. Therefore, the end faces 15c, 35c appear as projecting end faces projecting upward from the surface 22c.

For the connecting pads 32, a case where terminal parts extending to the inside of the groove part 20 are formed is discussed here (the terminal parts are referred to as virtual terminal parts). In this case, end faces of the virtual terminal parts will appear at the side surface of the device block.

However, the extended terminal parts 15a, 35a have top end faces common with the electrode pads 15b and 35b having the expanded height h15 and are formed to be larger in thickness than the connecting pads 32. For this reason, the end faces 15c, 35c will appear having a larger size than the end faces of the above-described virtual terminal parts. In the device block, the end faces 15c, 35c having such a large size appear arranged in the vertical direction, so that the end faces 15c are easily connected to each other and the end faces 35c are also easily connected to each other. It is sufficient for the connection electrodes 60 to connect the end faces 15c to the end faces 35c. Therefore, the position adjustment of the mask pattern may be roughly performed at the time when the connection electrodes 60 are formed. For this reason, in the device block, the alignment does not need to be performed with high accuracy in case of forming the connection electrodes 60.

On the other hand, the large size of the end faces 15c, 35c means that the sectional areas of the wiring electrodes 15, 35 have been expanded. Accordingly, the resistance values of the wiring electrodes 15, are able to be decreased. This causes the current flowing through the wiring electrodes 15, 35 to easily flow, so that the power consumption of the memory device 140 is also able to be reduced.

Thus, the semiconductor wafer 1, the semiconductor wafer 5 have the wiring electrodes 15, 35 as described above, whereby the manufacturing process of the memory device 140 are able to be simplified to reduce the manufacturing time.

Further, because the semiconductor wafer 1, the semiconductor wafer 5 have the extended terminal parts 15a, 35a extending inside of the groove parts 20, the end faces 15c, 35c are able to appear at the cut surfaces when the laminated semiconductor wafer 98 is cut along the groove parts 20. In other words, by cutting the laminated semiconductor wafer 98, in which the semiconductor wafers 1 and the semiconductor wafer 5 are laminated, along the groove parts 20, the end faces 15c, 35c are able to be obtained.

Therefore, in case of using the semiconductor wafer 1 and the semiconductor wafer 5, it is unnecessary to separately provide another process in order to make the wirings connecting to the device regions 10, semiconductor region 11 appear at the cut surfaces. If the wiring electrodes 15, 35 do not have the extended terminal parts 15a, 35a, the wiring electrodes 15, 35 are not able to be cut even by cutting the laminated semiconductor wafer along the groove parts 20. Therefore, only by cutting the laminated semiconductor wafer along the groove parts, the wirings connecting to the device regions 10 are not able to be made to appear at the cut surfaces. Thus, in order to make such wirings appear at the cut surfaces, another process needs to be performed.

However, in the case of using the semiconductor wafer 1 and the semiconductor wafer 5, the end faces of the wiring electrodes 15, 35 are able to be made to appear at the cut surfaces when the laminated semiconductor wafer 98 is cut along the groove parts, and therefore it is unnecessary to separately perform a process for making the wirings appear at the cut surfaces. Consequently, the manufacturing process of the memory device 140 is able to be further simplified by using the semiconductor wafer 1 and the semiconductor wafer 5.

Further, the wiring electrodes 15, 35 are formed to rise above the surface insulating layer 22. Therefore, when the end faces 15c, 35c appear at the cut surface, the end faces 15c located one above the other are arranged via the surface insulating layer 22 and the end faces 35c located one above the other are arranged via the surface insulating layer 22. Accordingly, a situation that the memory chips located one on the other short-circuit is able to be prevented.

The above memory device 140 is manufactured by laminating the semiconductor wafers 1 and the semiconductor wafer 5. Therefore, the wiring electrodes 15, 35 of the each memory chip 50, the interposer 51 are surely supported by the surface insulating layers 22, the upper insulating layers 22a and the lower insulating layers 23, and are never deformed due to bending downward.

Because there is no deformation of the wiring electrodes 15, 35 in the memory device 140, the end faces 15c, 35c of the wiring electrodes 15, 35 surely appear at determined positions having determined sizes in the each memory chip 50, the interposer 51. If the extended terminal parts 15a, 35a are deformed due to bending downward, their angles with respect to the wiring side surface 50A, 51A may change to cause an insufficient contact between the end faces 15c, 35c and the connection electrodes 60. However, there is no such possibility in the memory device 140, the memory chip 50 and the interposer 51.

Accordingly, the end faces 15c of the memory chip 50 and the end faces 35c of the interposer 51 are able to be surely connected with each other by the connection electrodes 60 in the memory device 140. Therefore, the memory device 140 has a very high reliability of electrical connection. By manufacturing the memory device 140 using the semiconductor wafer 1 and the semiconductor wafer 5 as describe above, the reliability of electrical connection of the memory device 140 is able to be enhanced.

Second Embodiment

Figure 33:
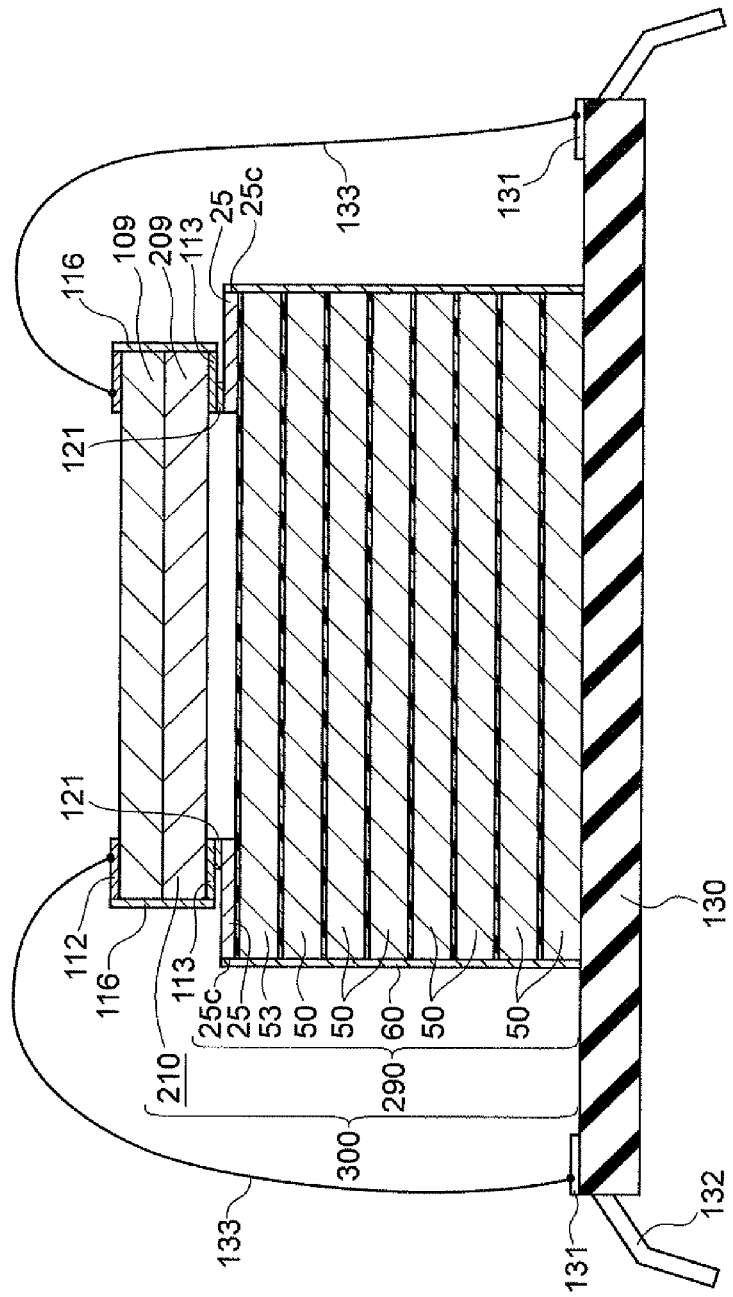
FIG. 33 is a sectional view similar to FIG. 3, illustrating the memory device and the electrode substrate according to a second embodiment of the present invention.
Figure 34:
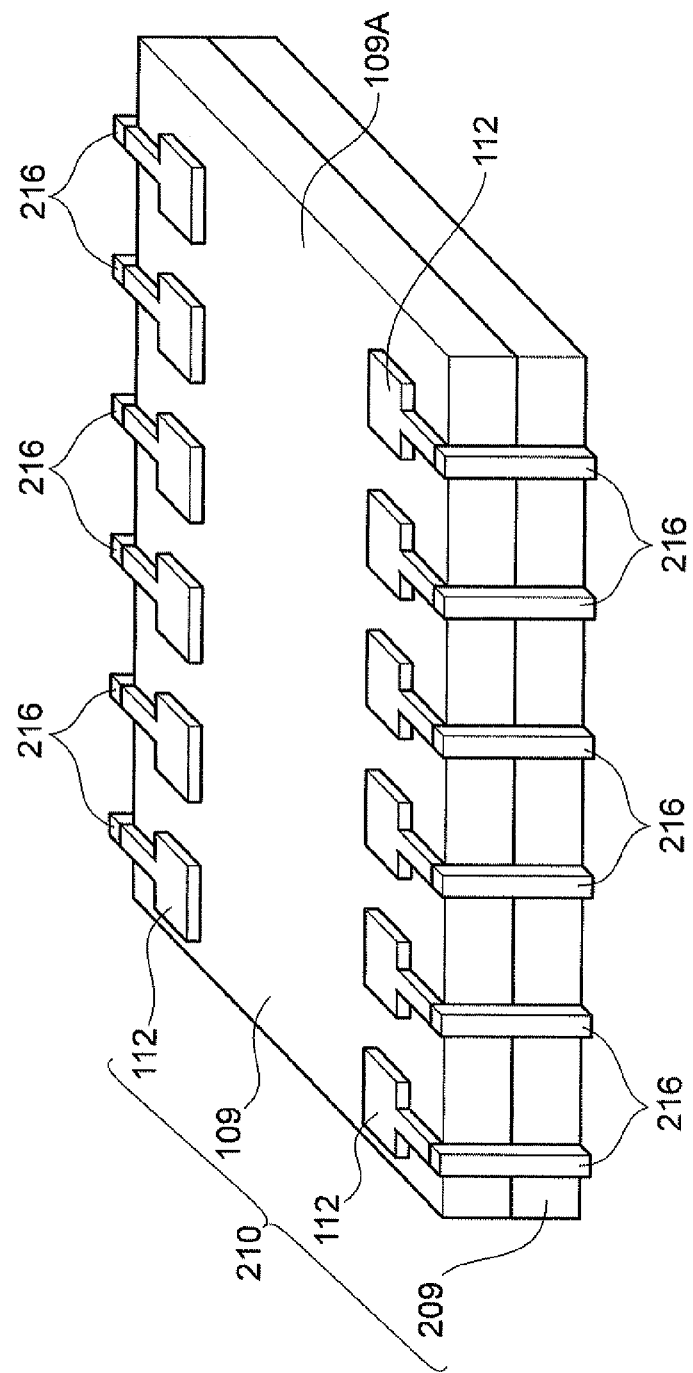
FIG. 34 is a perspective view of a controller plate, seen from front side, constituting the memory device in FIG. 33.
Figure 35:
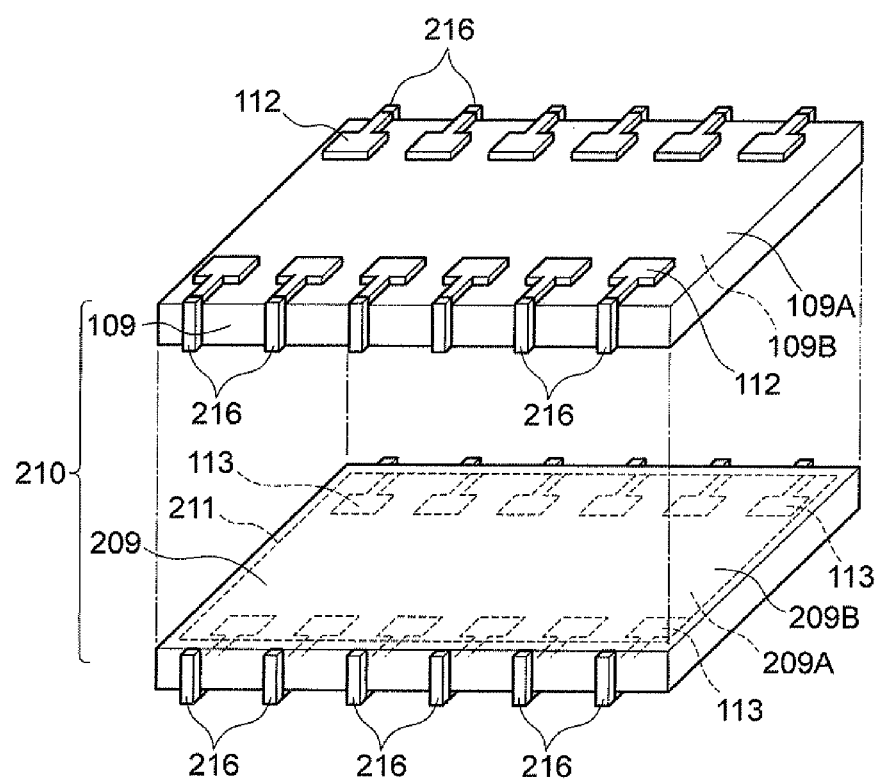
FIG. 35 is an exploded perspective view of a controller plate constituting the memory device in FIG. 33.
Figure 36:
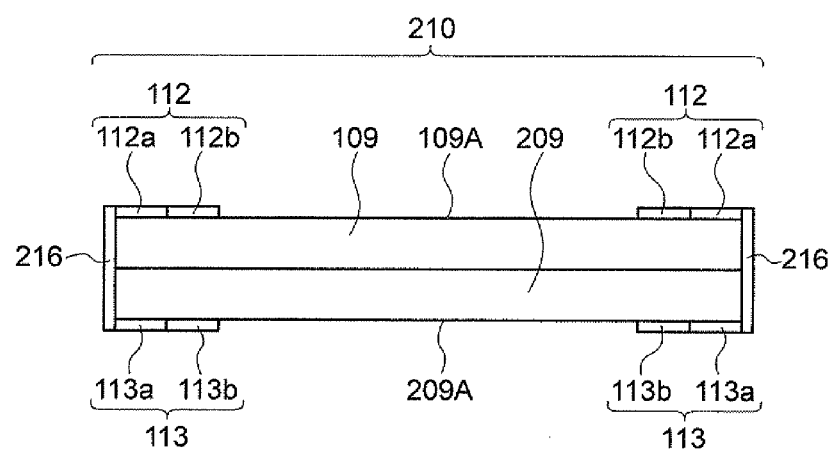
FIG. 36 is a side elevation view of a controller plate constituting the memory device in FIG. 33.

Subsequently, the memory device 300 according to a second embodiment of the present invention will be described with reference to FIG. 33 to FIG. 36. FIG. 33 is a sectional view similar to FIG. 3, illustrating a memory device 300 and the resin substrate 130. FIG. 34 is a perspective view of a controller plate 210, seen from front side. FIG. 35 is an exploded perspective view of the controller plate 210. FIG. 36 is a side elevation view of the controller plate 210.

The memory device 300 is different in that it has the controller plate 210 in place of the controller plate 110, and that it has the laminated chip package 290 in place of the laminated chip package 90, and the interposer 51 is not laminated, as compared with the memory device 140.

The controller plate 210 has the controller chip 109 and a controller chip 209. The controller chip 209 has the control IC similar to the controller chip 109. A device region 211 including the control IC is formed within the controller chip 209.

In the controller plate 210, the controller chip 109 and the controller chip 209 are joined together. Then, for the chip-like members made in one body by the joint, a plurality of outside wiring electrodes 112 and a plurality of opposing wiring electrodes 113 are formed respectively on an outer surface 109A of the controller chip 109 and an outer surface 209A of the controller chip 209. Further, connection electrodes 216 each connecting each of the plurality of outside wiring electrodes 112 to each of the plurality of opposing wiring electrodes 113 are formed similarly to the connection electrodes 116. Six connection electrodes 216 are provided at regular intervals similarly to the connection electrodes 116, and therefore twelve connection electrodes 216 are formed in total. The connection electrode 216 has a length longer than that of the connection electrode 116.

In this controller plate 210, a plurality of wiring electrodes are formed only on one (the outer surface 109A, 209A) of the two surfaces along each other for each of the controller chip 109 and the controller chip 209. Further, in the controller plate 210, non-electrode surfaces 109B, 209B where the wiring electrodes are not formed of the controller chip 109 and the controller chip 209 are joined together. Further, the outer surface 209A is set as the opposing surface opposing the interposer 51, and the outer surface 109A is set as the outer surface. The outer surfaces 109A, 209A correspond to the electrode forming surfaces because the plurality of wiring electrodes are formed thereon.

On the other hand, the laminated chip package 290 is different in that a memory chip 53 is laminated in place of the one memory chip 50 among the eight memory chip 50, as compared with the laminated chip package 90. That is, in the laminated chip package 290, the one memory chip 53 and the seven memory chips 50 are laminated.

Figure 39:
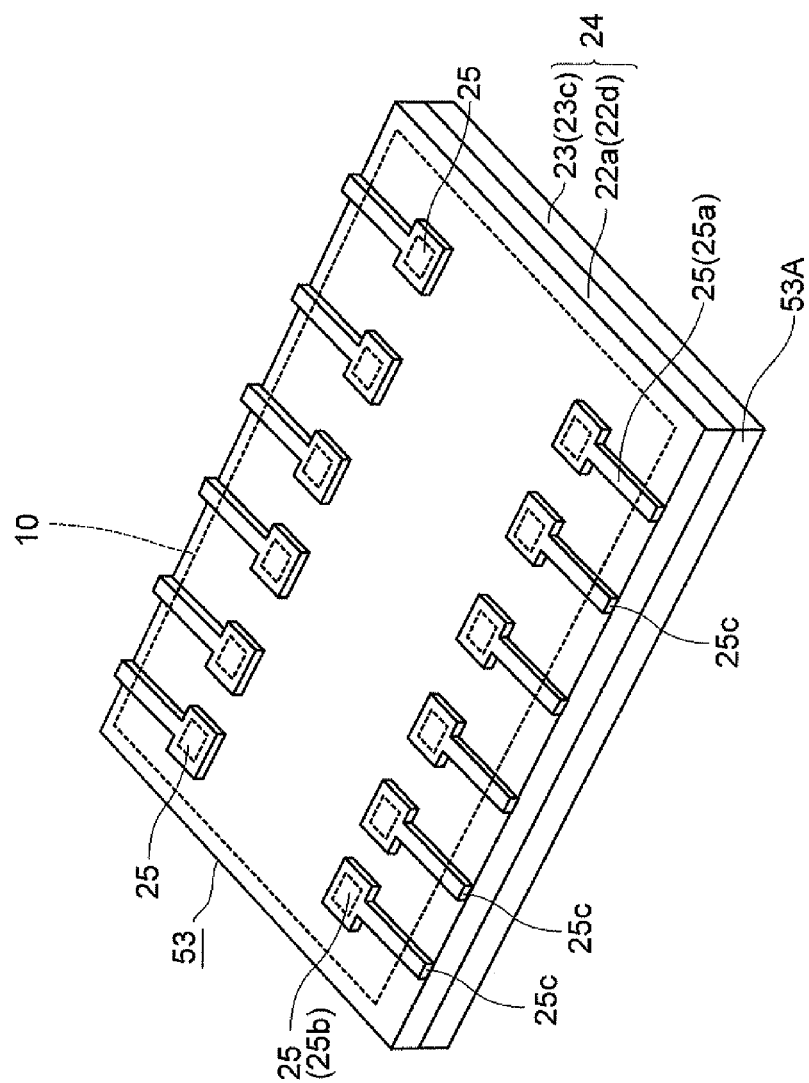
FIG. 39 is a perspective view illustrating the memory chip constituting the memory device in FIG. 33.

The memory chip 53 is laminated on the uppermost surface closest to the interposer 51 of the seven memory chips 50 and corresponds to the interposed memory chip according to the embodiment of the present invention. The memory chip 53 is different in that twelve wiring electrodes 25 are formed in place of the twelve wiring electrodes 15 as compared with the memory chip 50 as illustrated in FIG. 39. In the case of the memory chip 53, the device region 10 is formed as an interposed device region. Each of the twelve wiring electrodes 25 has an extended terminal part 25a and an electrode pad 25b. Further, an end face 25c of the extended terminal part 25a appears as a projecting end face at a wiring side surface 53A similar to the wiring side surface 50A. However, the arrangement pattern of the wiring electrodes 25 is different from the arrangement pattern of the wiring electrodes 15. The arrangement pattern of the wiring electrodes 25 is the common arrangement pattern in common with the arrangement pattern of the opposing wiring electrodes 113 in the controller plate 110. The extended terminal part 25a is longer than the extended terminal part 15a, and the electrode pad 25b is arranged inner than the electrode pad 15b.

Figure 37:
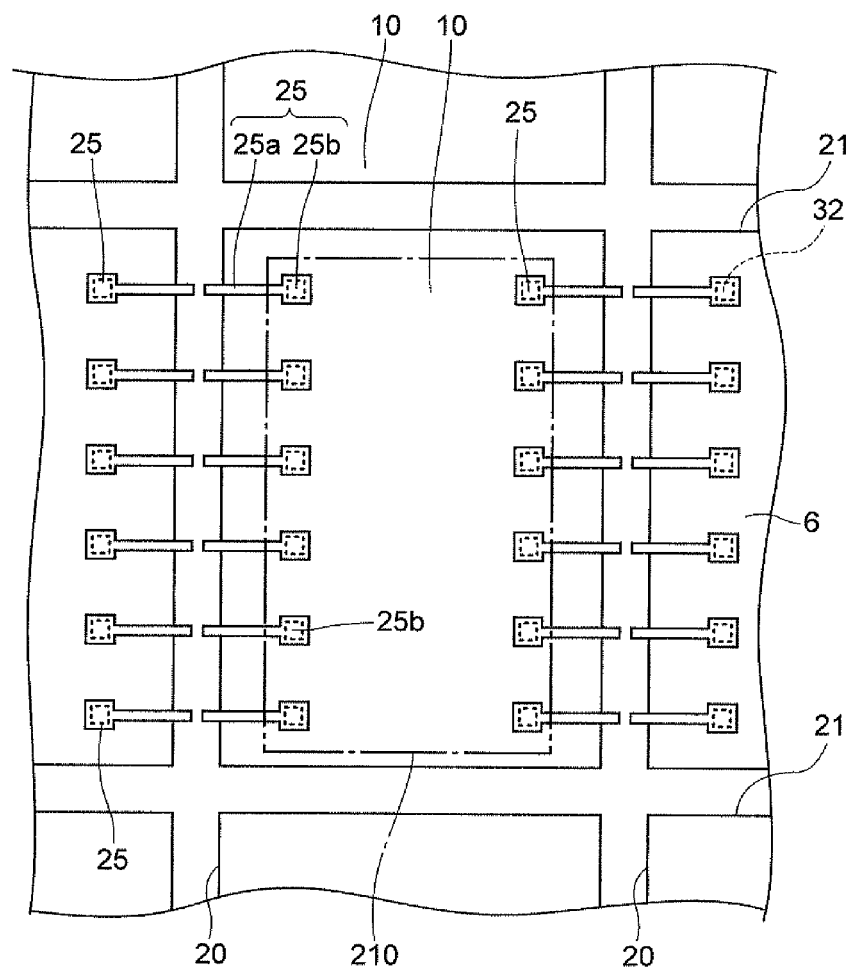
FIG. 37 is a plan view illustrating a device region and a region surrounding it formed in the semiconductor wafer for manufacturing the memory device in FIG. 33.

In addition, the memory chip 53 is manufactured by using a semiconductor wafer 6 insulated in FIG. 37. This semiconductor wafer 6 is different in that it has wiring electrodes 25 as compared with the semiconductor wafer 1. The wiring electrodes 25 are formed with the common arrangement pattern in common with the arrangement pattern of the opposing wiring electrodes 113, as in the memory chip 53.

As described above, the interposer 51 for connecting to the controller plate 110 is laminated in the memory device 140, but the interposer 51 is not laminated in the memory device 300. However, in place of the interposer 51, the memory chip 53 is laminated. In the memory chip 53, the wiring electrodes 25 are formed in the common arrangement pattern. Only the memory chip 53 is formed in the common arrangement pattern.

Further, in the memory device 140, the controller plate 210 is laminated in place of the controller plate 110. The controller plate 210 has the outside wiring electrodes 112, the opposing wiring electrodes 113, and the connection electrodes 216. Therefore, in the memory device 300, the connection with the external part can be surely ensured by the outside wiring electrodes 112 as in the memory device 140. Accordingly, though not illustrated, by connecting the bonding wires 133 to the outside wiring electrode 112 as in the memory device 140, the memory device 300 can be connected to the resin substrate 130.

In addition, when the controller plate 210 is laid on the laminated chip package 290, the opposing wiring electrode 113 and the wiring electrode 25 are arranged to be overlaid one on the other. Accordingly, all of the opposing wiring electrodes 113 of the controller plate 110 can be arranged on the wiring electrodes 25 of the memory chip 53.

Accordingly, all of the electrode pads 113b of the controller plate 210 can be connected to the electrode pads 25b of the memory chip 53 through use of the solders 121. Since only the memory chip 53 is formed in the common arrangement pattern in the memory device 300, it is sufficient to change the structure and the manufacturing process of only the memory chip 53, and it is unnecessary to change the structure and the manufacturing process of the other seven memory chips. Therefore, the memory device 300 also has a highly-versatile structure capable of simplifying the manufacturing process.

Moreover in the memory device 300, the interposer 51 is not laminated. Therefore, an outside dimension of the memory device 300 can be made small. Further, the number of semiconductor chips which are laminated within the memory device 300 is small, so that a time required for lamination of the semiconductor wafer is able to be reduced, many memory devices is able to manufacture in a unit time. Further, since a material for plating or the like is able to be reduced, cost for manufacturing of the memory device 300 is able to be reduced.

Figure 38:
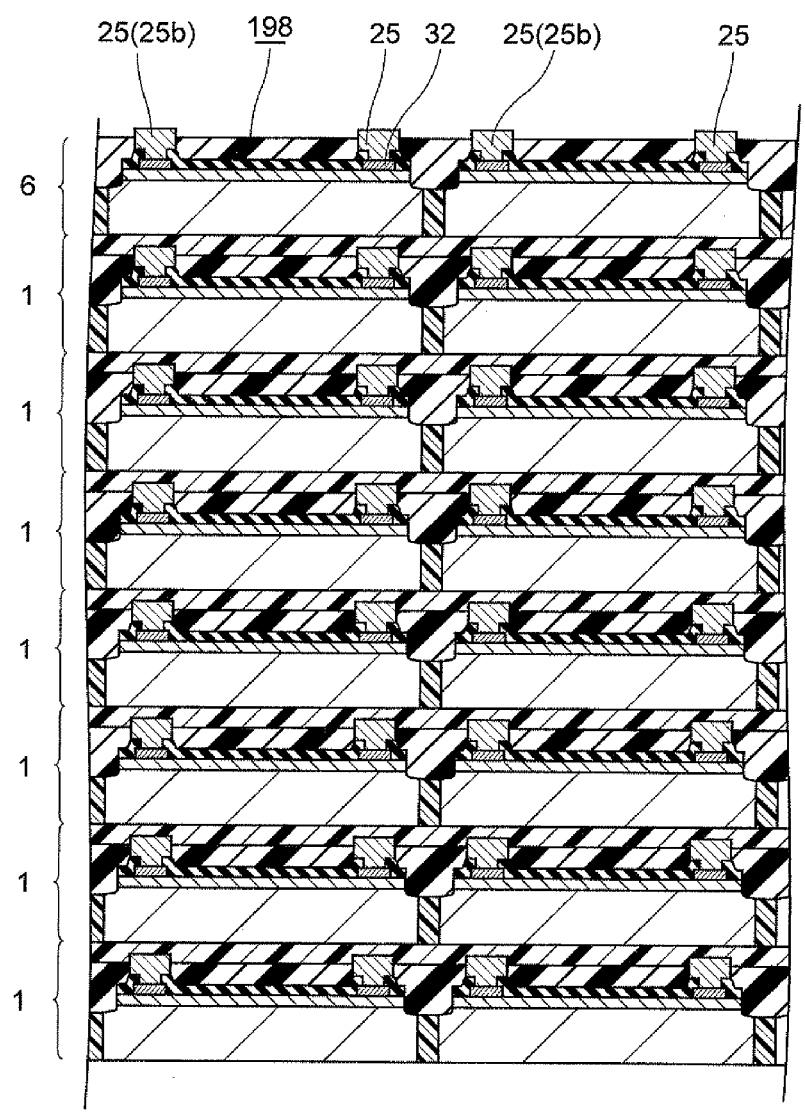
FIG. 38 is a sectional view of the laminated semiconductor wafer for manufacturing the memory device in FIG. 33.

In addition, the memory device 300 is able to be manufactured by using a laminated semiconductor wafer 198 illustrated in FIG. 38. This laminated semiconductor wafer 198 is different in that the semiconductor wafer 6 is laminated in place of the semiconductor wafer 5 and the number of semiconductor wafer 1 which are laminated is seven, as compared with the laminated semiconductor wafer 98.

Method of Manufacturing Laminated Semiconductor Wafer and Memory Device

When manufacturing the memory device 300, the controller plate 210 is manufactured in place of the controller plate 110. In this case, the wiring electrodes for plate forming step and the connection electrodes for plate forming step similar to those of the controller plate 110 are performed on the two chip-like members each having a control IC, namely, the chip-like members made in one body by joining the controller chips 109, 209 together.

When the laminated semiconductor wafer 198 is manufactured, the semiconductor wafer 6 is used in place of the semiconductor wafer 5. The rear surface 1b of the semiconductor wafer 6 is polished so that the thickness of the semiconductor wafer 6 is decreased by a procedure similar to the procedure for manufacturing the laminated semiconductor wafer 98. Next, the seven semiconductor wafers 1 are laid on the rear surface 1b of the semiconductor wafer 6 by the procedure similar to the procedure for manufacturing the laminated semiconductor wafer 98. Thus, the laminated semiconductor wafer 198 is able to be manufactured.

After that, the laminated semiconductor wafer 198 is cut along the groove parts 20 and 21. Subsequently, forming of the connection electrodes 60 and a connection of the controller plate 210 are performed by the same procedure as the memory device 140. By this, the memory device 300 is able to be manufactured.

Other Embodiments

Figure 40:
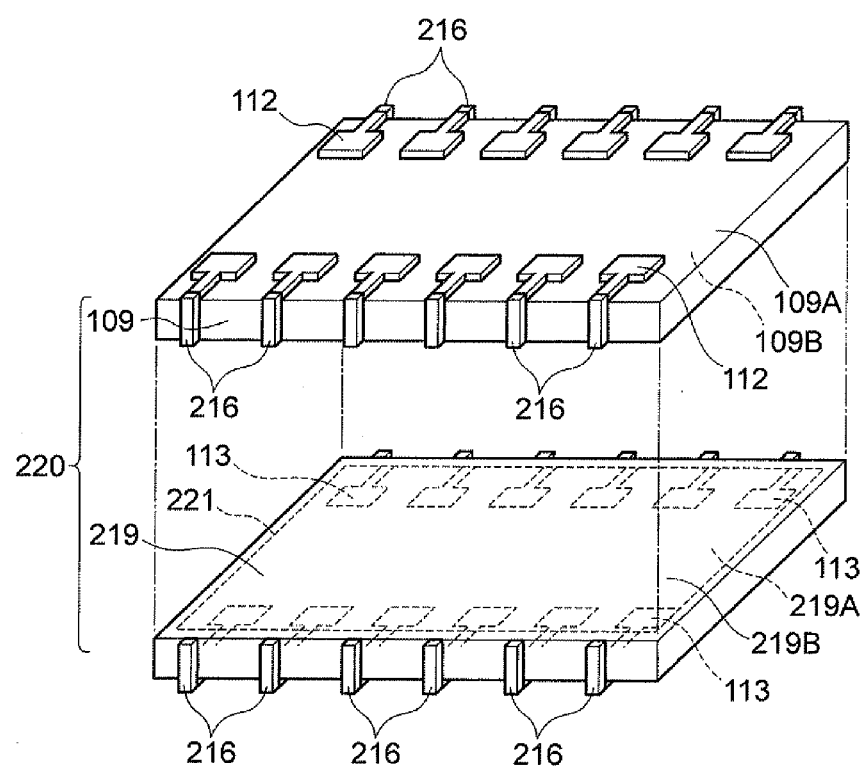
FIG. 40 is an exploded perspective view of an another controller plate with FIG. 35, constituting the memory device in FIG. 33.
Figure 41:
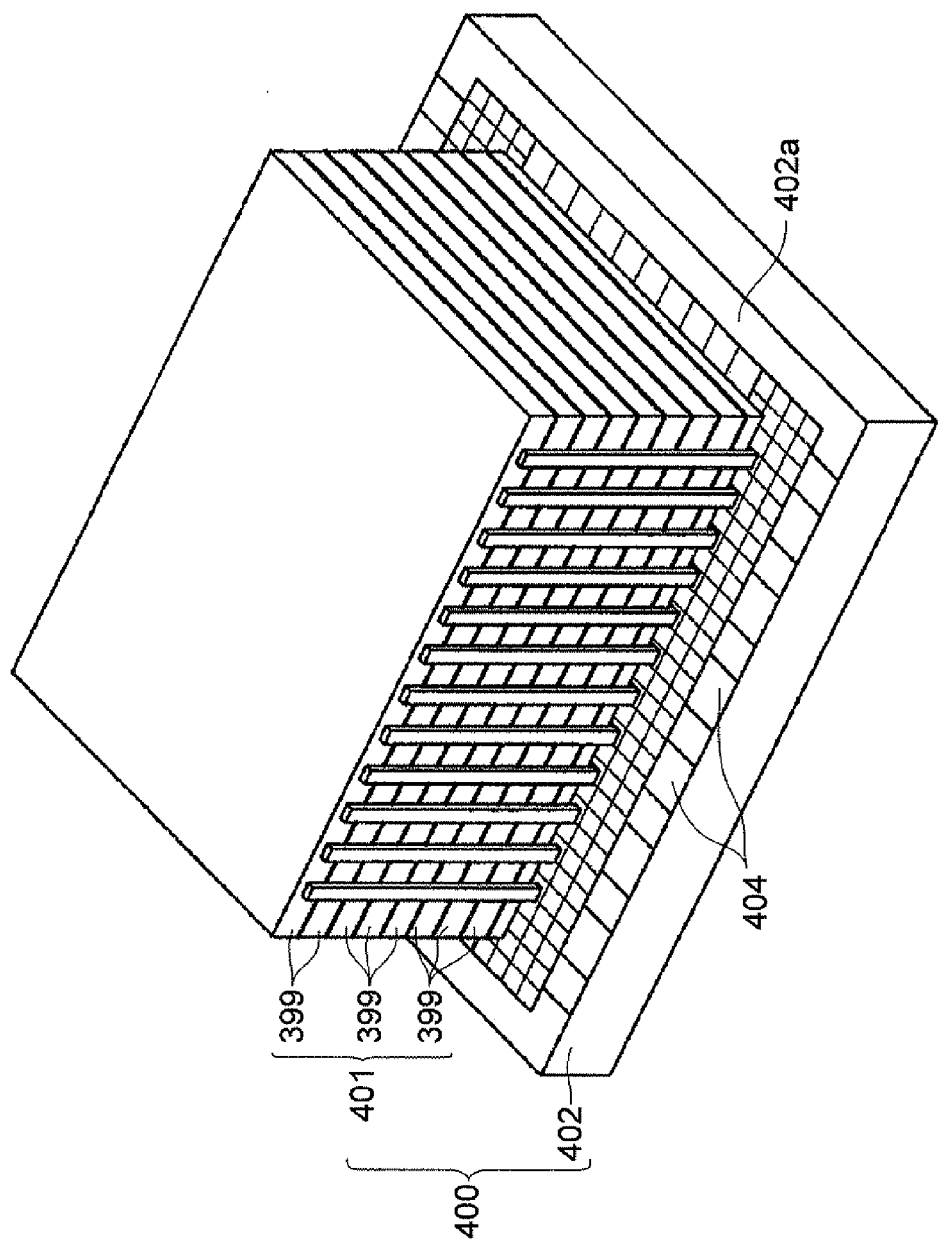
FIG. 41 is a perspective view illustrating an example of the memory device in prior art.
Figure 42:
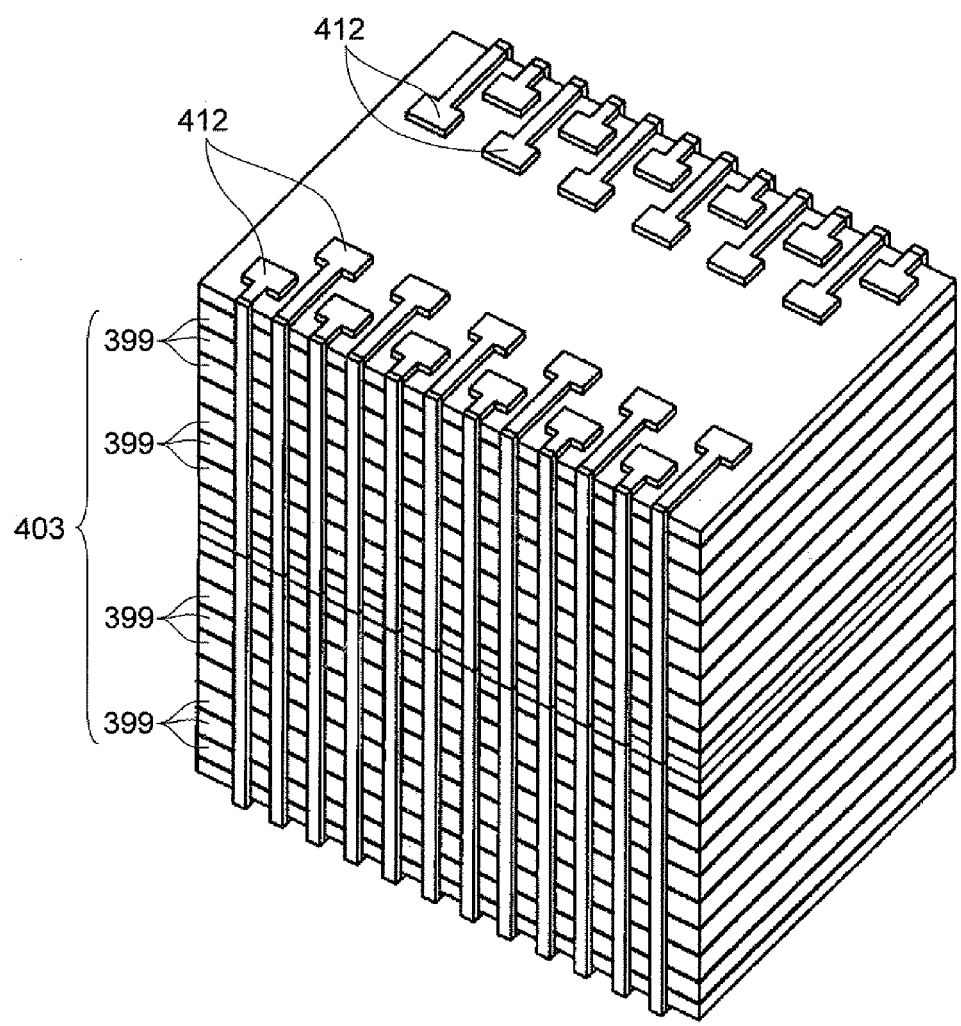
FIG. 42 is a perspective view illustrating an example of the laminated chip package in prior art.

A controller plate 220 will be described with reference to FIG. 40. The controller plate 220 is different in that an interposer 219 is provided in place of the controller chip 209, as compared with the controller plate 210. In the other points, the controller plate 220 is common with the controller plate 210. In the controller plate 220, the non-electrode surfaces 109B, 219B are joined together. Further, an outer surface 219A faces the interposer 51 and is thus set as the opposing surface, and an outer surface 109A is set as the outer surface. The interposer 219 has a semiconductor region 221 where the control IC is not formed.

By using the controller plate 220 in place of the controller plate 210, the memory device achieving the same operation and effect as those of the memory device 300 can be obtained.

Further, when manufacturing the controller plate 220, one first chip-like member having a control IC and one second chip-like member having no controller IC, namely, one controller chip 109 and one interposer 219 are used. Then, the wiring electrodes for plate forming step and the connection electrodes for plate forming step are performed, as in the case of the memory device 140, on the chip-like members made in one body by joining the controller chip 109 and the interposer 219 together. Then, the controller plate 220 is obtained.

Further, the controller plate 220 can also be manufactured as follows in place of the above manufacturing method.

First, the wiring electrodes for plate forming step is performed as follows. In this case, a plurality of wiring electrodes 112 are formed only on one (the outer surface 109A) of the two surfaces along each other for the controller chip 109, and a plurality of wiring electrodes 113 are formed only on one (the outer surface 219A) of the two surfaces along each other for the interposer 219.

Then, the joining step is performed. In this case, a non-electrode surface 109B and a non-electrode surface 219B of the controller chip 109 and the interposer 219 are joined together.

Subsequently, the connection electrodes for plate forming step is performed. In this case, for the controller chip 109 and the interposer 219 made in one body, a plurality of connection electrode 216 are formed on each of their opposing side surfaces. Also in this manner, the controller plate 220 is obtained.

Though the wiring electrodes 15, the wiring electrodes 35 have the protruding structure in the above embodiments, the present invention is also applicable to a memory device including wiring electrodes that do not have the protruding structure. Further, terminal parts in a structure across the groove part may be formed in adjacent two device regions 10, semiconductor region 11 in place of the extended terminal parts 15a. Furthermore, the scribe-groove part may not have the wide-port structure, unlike the groove part 20, 21.

Further, the controller plate 110 is laminated in the memory device 140 in the first embodiment. However, though not illustrated, the controller plate 210 or the controller plate 220 may be laminated in place of the controller plate 110 to make the memory device 140.

Further, the controller plate 210 is laminated in the memory device 300 in the second embodiment. However, though not illustrated, the controller plates 110, 220 may be laminated in place of the controller plate 210 to make the memory device 300.

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A memory device comprising:
a laminated chip package laminated from a plurality of memory chips each having a plurality of memory cells,
an interposed chip equal in outside dimension to a memory chip from the plurality of memory chips and having no semiconductor element, and
a controller plate having a control circuit controlling read/write from/to the plurality of memory cells,
the laminated chip package, the interposed chip and the controller plate being laminated together, the interposed chip being between the laminated chip package and the controller plate,
wherein each of the memory chips comprising:
a device region in which the plurality of memory cells are formed;
a resin insulating layer made of an insulating resin formed outside the device region; and
a plurality of wiring electrodes for memory connected to the plurality of memory cells and extending from a connection pad in contact with the device region to the top of the resin insulating layer;
wherein the controller plate comprises:
a plurality of opposing wiring electrodes formed on an opposing surface opposing the interposed chip;
a plurality of outside wiring electrodes formed on an outer surface arranged on a rear side of the opposing surface; and
a plurality of connection electrodes for plate formed on a side surface crossing the opposing surface and the outer surface and each connecting each of the opposing wiring electrodes to each of the outside wiring electrodes,
wherein the interposed chip has a plurality of interposed wiring electrodes formed in a common arrangement pattern in common with an arrangement pattern of the plurality of opposing wiring electrodes, and
wherein the controller plate is mounted on the interposed chip and each of the opposing wiring electrodes is connected to each of the interposed wiring electrodes.

2. The memory device according to claim 1,
wherein the plurality of opposing wiring electrodes and the plurality of interposed wiring electrodes are formed such that a number and an arrangement interval of the plurality of opposing wiring electrodes are equal to a number and an arrangement interval of the plurality of interposed wiring electrodes.

3. The memory device according to claim 1,
wherein for the interposed chip, all of the plurality of interposed wiring electrodes respectively have interposed electrodes pads arranged inside the outer periphery of the controller plate, and
wherein the controller plate has an outside dimension smaller than the outside dimension of the interposed chip, and the plurality of opposing wiring electrodes respectively have opposing electrode pads arranged at positions respectively corresponding to the interposed electrodes pads.

4. The memory device according to claim 3,
wherein for the controller plate, the plurality of outside wiring electrodes respectively have outside electrode pads arranged at positions respectively corresponding to the interposed electrode pads.

5. The memory device according to claim 1,
wherein the controller plate is configured such that the plurality of opposing wiring electrodes and the plurality of outside wiring electrodes are formed respectively on two surfaces along each other of one chip-like member having the control circuit and the two surfaces are set as the opposing surface and the outer surface respectively.

6. The memory device according to claim 1,
wherein the controller plate is configured such that for each of two chip-like members each having the control circuit, only one of two surfaces along each other is provided with a plurality of wiring electrodes corresponding to the opposing wiring electrodes or the outside wiring electrodes to form an electrode forming surface, and non-electrode surfaces where the plurality of wiring electrodes are not formed are joined together, and the electrode forming surface in each of the two chip-like members is set as the opposing surface or the outer surface.

7. The memory device according to claim 1,
wherein the controller plate is configured such that for each of a first chip-like member having the control circuit and a second chip-like member having no semiconductor element, on only one of two surfaces along each other is provided with a plurality of wiring electrodes corresponding to the opposing wiring electrodes or the outside wiring electrodes to form an electrode forming surface, and non-electrode surfaces where the plurality of wiring electrodes are not formed are joined together, and the electrode forming surface in each of the first chip-like member and the second chip-like member is set as the opposing surface or the outer surface.

8. The memory device according to claim 1,
wherein side surfaces of the plurality of memory chips and a side surface of the interposed chip form a common wiring side surface in which the surfaces are joined together without forming a step, and the wiring electrodes for memory are connected to the interposed wiring electrodes within the common wiring side surface.

9. The memory device according to claim 1,
wherein the interposed chip comprising a semiconductor region equal in size to the device region, and a resin insulating layer made of an insulating resin formed outside the semiconductor region, and
wherein the plurality of interposed wiring electrodes extend from a surface insulating layer above the semiconductor region to the top of the resin insulating layer.

10. The memory device according to claim 1,
wherein the resin insulating layer has a double-layer structure in which an upper insulating layer is laid on a lower insulating layer, and the lower insulating layer is formed using a low-viscosity resin lower in viscosity than an upper resin forming the upper insulating layer.

11. A memory device comprising:
a laminated chip package laminated from a plurality of memory chips each having a plurality of memory cells, and
a controller plate having a control circuit controlling read/write from/to the plurality of memory cells, the controller plate having an outside dimension different than an outside dimension of the memory chips, the controller plate having two plate-like components, the laminated chip package and the controller plate being laminated together,
wherein each of the memory chips comprising:
a device region in which the plurality of memory cells are formed;

a resin insulating layer made of an insulating resin formed outside the device region; and a plurality of wiring electrodes for memory connected to the plurality of memory cells and extending from a connection pad in contact with the device region to the top of the resin insulating layer;

wherein the controller plate comprises:

a plurality of opposing wiring electrodes formed on an opposing surface opposing the laminated chip package;

a plurality of outside wiring electrodes formed on an outer surface arranged on a rear side of the opposing surface; and a plurality of connection electrodes for plate formed on a side surface crossing the opposing surface and the outer surface and each connecting each of the opposing wiring electrodes to each of the outside wiring electrodes, wherein for at least an interposed memory chip laminated at a position closest to the controller plate among the plurality of memory chips, the plurality of wiring electrodes for memory are formed in a common arrangement pattern in common with an arrangement pattern of the plurality of opposing wiring electrodes, and wherein the controller plate is mounted on the interposed memory chip and each of the opposing wiring electrodes is connected to each of the wiring electrodes for memory of the interposed memory chip.

12. The memory device according to claim 11, wherein the plurality of opposing wiring electrodes and the plurality of wiring electrodes for memory of the interposed memory chip are formed such that a number and an arrangement interval of the plurality of opposing wiring electrodes are equal to a number and an arrangement interval of the plurality of wiring electrodes for memory of the interposed memory chip.

13. The memory device according to claim 11, wherein the memory device has a straight connection electrode formed on a side surface of each memory chip and an interposed memory chip, but not the controller plate.

14. The memory device according to claim 13, wherein the side surfaces of the memory chip, except for the connection electrode, is formed flat.

15. The memory device according to claim 11, wherein, the plurality of wiring electrodes for memory are further formed straight along a surface of the memory chip.

16. A method of manufacturing a memory device, the memory device comprising a laminated chip package laminated from a plurality of memory chips each having a plurality of memory cells and a controller plate having a control circuit controlling read/write from/to the plurality of memory cells, the laminated chip package and the controller plate being laminated, the method comprising:

a controller plate manufacturing step of manufacturing the controller plate by performing, for a chip-like member having the control circuit, a wiring electrodes for plate forming step of forming a plurality of wiring electrodes on each of two surfaces along each other and a connection electrodes for plate forming step of forming a plurality of connection electrodes each connecting each of the plurality of wiring electrodes on a side surface crossing the two surfaces of the chip-like member;

a laminated chip package manufacturing step of manufacturing the laminated chip package such that an outermost chip having no semiconductor element is arranged on an outermost side and has a plurality of wiring electrodes formed in a common arrangement pattern in common with an arrangement pattern of the plurality of wiring electrodes formed on the controller plate; and a wiring electrode connecting step of mounting the controller plate on the laminated chip package and connecting the plurality of wiring electrodes on the controller plate with the plurality of wiring electrodes on the outermost chip.

17. The method of manufacturing a memory device according to claim 16, wherein the controller plate manufacturing step performs the wiring electrodes for plate forming step on two surfaces along each other of one chip-like member having the control circuit.

18. The method of manufacturing a memory device according to claim 16, wherein the controller plate manufacturing step joins two chip-like members each having the control circuit together, and then performs the wiring electrodes for plate forming step on two surfaces along each other in the chip-like members joined in one body.

19. The method of manufacturing a memory device according to claim 16, wherein the controller plate manufacturing step joins a first chip-like member having the control circuit and a second chip-like member having no semiconductor element together, and then performs the wiring electrodes for plate forming step on two surfaces along each other of the first chip-like member and second chip-like member joined in one body.

20. The method of manufacturing a memory device according to claim 16, wherein the laminated chip package manufacturing step includes a laminated semiconductor substrate manufacturing step of manufacturing a laminated semiconductor substrate laminated from a plurality of semiconductor substrates, and wherein the laminated semiconductor substrate manufacturing step includes a laminating step of laminating a plurality of first substrates each having the plurality of memory cells and a plurality of first wiring electrodes connected to the plurality of memory cells, and a second substrate having a plurality of second wiring electrodes formed in a common arrangement pattern in common with the arrangement pattern of the plurality of wiring electrodes formed on the controller plate.

21. The method of manufacturing a memory device according to claim 20, wherein in the laminating step, a polishing step of polishing the rear surface side of the second substrate to reduce a thickness of the second substrate is performed before the plurality of first substrates and the second substrate are laminated, and the plurality of first substrates are laminated on the rear surface side of the second substrate after performing the polishing step.

22. A method of manufacturing a memory device, the memory device comprising a laminated chip package laminated from a plurality of memory chips each having a plurality of memory cells and a controller plate having a control circuit controlling read/write from/to the plurality of memory cells, the laminated chip package and the controller plate being laminated, the method comprising:

a controller plate manufacturing step of manufacturing the controller plate by performing a wiring electrodes for plate forming step of forming a plurality of wiring electrodes on only one of two surfaces along each other for a first chip-like member having the control circuit and forming a plurality of wiring electrodes on only one of two surfaces along each other for a second chip-like member having no semiconductor element, a joining step of joining non-electrode surfaces where the plurality of wiring electrodes are not formed of the first chip-like member and the second chip-like member together, and a connection electrodes for plate forming step of forming a plurality of connection electrodes each connecting each of the plurality of wiring electrodes on side surfaces of the first chip-like member and the second chip-like member joined together;

a laminated chip package manufacturing step of manufacturing the laminated chip package such that an outermost chip arranged on the outermost side has a plurality of wiring electrodes formed in a common arrangement pattern in common with an arrangement pattern of the plurality of wiring electrodes formed on the controller plate; and a wiring electrode connecting step of mounting the controller plate on the laminated chip package and connecting the plurality of wiring electrodes on the controller plate with the plurality of wiring electrodes on the outermost chip.

* * * * *